US012156412B2

(12) United States Patent
Joei et al.

(10) Patent No.: US 12,156,412 B2
(45) Date of Patent: *Nov. 26, 2024

(54) IMAGE PICKUP ELEMENT, STACKED IMAGE PICKUP ELEMENT, AND SOLID IMAGE PICKUP APPARATUS

(71) Applicant: SONY SEMICONDUCTOR SOLUTIONS CORPORATION, Kanagawa (JP)

(72) Inventors: Masahiro Joei, Kanagawa (JP); Kenichi Murata, Kanagawa (JP); Shintarou Hirata, Kanagawa (JP); Toshihiko Hayashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/185,966

(22) Filed: Mar. 17, 2023

(65) Prior Publication Data

US 2023/0269953 A1 Aug. 24, 2023

Related U.S. Application Data

(63) Continuation of application No. 17/257,740, filed as application No. PCT/JP2019/026474 on Jul. 3, 2019, now Pat. No. 11,641,750.

(30) Foreign Application Priority Data

Jul. 17, 2018 (JP) .................................. 2018-134012
Jul. 2, 2019 (JP) .................................. 2019-123550

(51) Int. Cl.
*H01L 27/146* (2006.01)
*H10K 19/20* (2023.01)
(Continued)

(52) U.S. Cl.
CPC ............. *H10K 19/20* (2023.02); *H10K 30/65* (2023.02); *H10K 39/32* (2023.02); *H01L 27/14609* (2013.01)

(58) Field of Classification Search
CPC ........ H10K 19/20; H10K 30/65; H10K 39/32; H10K 30/10; H10K 30/00; H10K 30/20;
(Continued)

(56) References Cited

U.S. PATENT DOCUMENTS

2005/0205903 A1  9/2005  Hioki
2008/0035965 A1* 2/2008  Hayashi ............ H01L 27/14605
                                                      257/440
(Continued)

FOREIGN PATENT DOCUMENTS

CN    106463563 A    2/2017
JP    2011-138927    7/2011
(Continued)

OTHER PUBLICATIONS

International Search Report and Written Opinion for International (PCT) Patent Application No. PCT/JP2019/026474, dated Sep. 24, 2019, 6 pages.
(Continued)

*Primary Examiner* — Samuel Park
(74) *Attorney, Agent, or Firm* — Sheridan Ross PC

(57) ABSTRACT

An image pickup element includes a photoelectric conversion section including a first electrode, a photoelectric conversion layer including an organic material, and a second electrode stacked on one another. Between the first electrode and the photoelectric conversion layer, an oxide semiconductor layer and an oxide film are formed from the first electrode side.

21 Claims, 55 Drawing Sheets

(51) Int. Cl.
  *H10K 30/65* (2023.01)
  *H10K 39/32* (2023.01)
(58) Field of Classification Search
  CPC .............. H10K 30/30; H01L 27/14609; H01L 27/14603; H01L 27/14612; H01L 27/14638; H01L 27/14641; H01L 27/14647; H01L 27/14665; H01L 27/146; H04N 25/76; H04N 25/65; H04N 25/70; Y02E 10/549
  See application file for complete search history.

(56) References Cited

U.S. PATENT DOCUMENTS

| | | |
|---|---|---|
| 2015/0188065 A1 | 7/2015 | Takimoto |
| 2016/0037098 A1* | 2/2016 | Lee ................. H10K 39/32 257/292 |
| 2016/0141500 A1* | 5/2016 | Jung ................. H10K 85/211 136/263 |
| 2017/0162807 A1 | 6/2017 | Moriwaki |
| 2017/0170240 A1 | 6/2017 | Hatano |
| 2018/0184030 A1 | 6/2018 | Ikeda |
| 2019/0324580 A1* | 10/2019 | Tanaka ................ H10K 50/171 |
| 2020/0266304 A1 | 8/2020 | Ueoka et al. |
| 2021/0151710 A1* | 5/2021 | Hosono ................ H10K 71/00 |
| 2021/0288111 A1 | 9/2021 | Joei et al. |

FOREIGN PATENT DOCUMENTS

| | | |
|---|---|---|
| JP | 2016-063165 | 4/2016 |
| JP | 2017157816 A | 9/2017 |
| JP | 2018-107799 | 7/2018 |
| KR | 20160017168 A | 2/2016 |
| KR | 20170031650 A | 3/2017 |
| KR | 20180076346 A | 7/2018 |
| TW | I596747 B | 8/2017 |
| WO | WO 2016/009693 | 1/2016 |

OTHER PUBLICATIONS

Notice of Allowance for U.S. Appl. No. 17/257,740, dated Dec. 21, 2022, 11 pages.
Wallinga et al., "Reduction of Tin Oxide by Hydrogen Radicals," Journal of Physical Chemistry B, vol. 102, 1998, pp. 6219-6224.
Office Action (English Translation Only) for Germany Patent Application No. 112019003606.8, dated Apr. 22, 2024, 10 pages.

* cited by examiner

F I G . 5
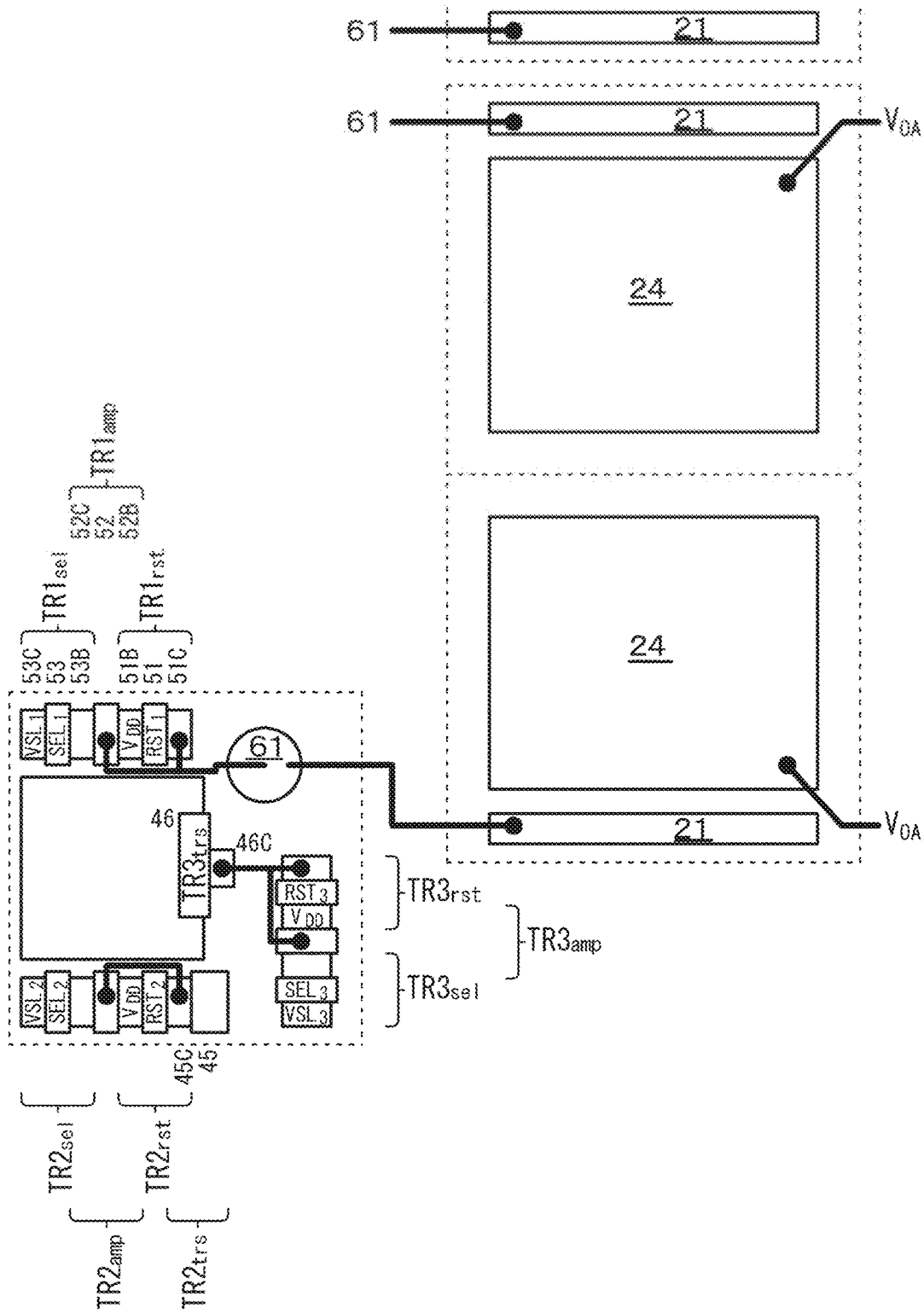

[DURING CHARGE TRANSFER]

[DURING RESETTING]

[DURING CHARGE STORAGE]

F I G. 22
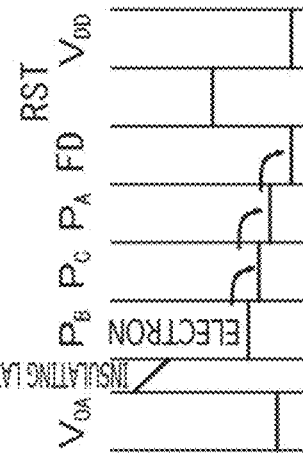
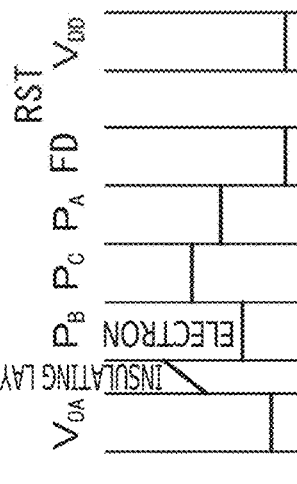
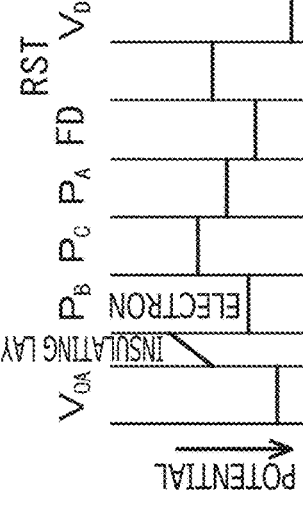
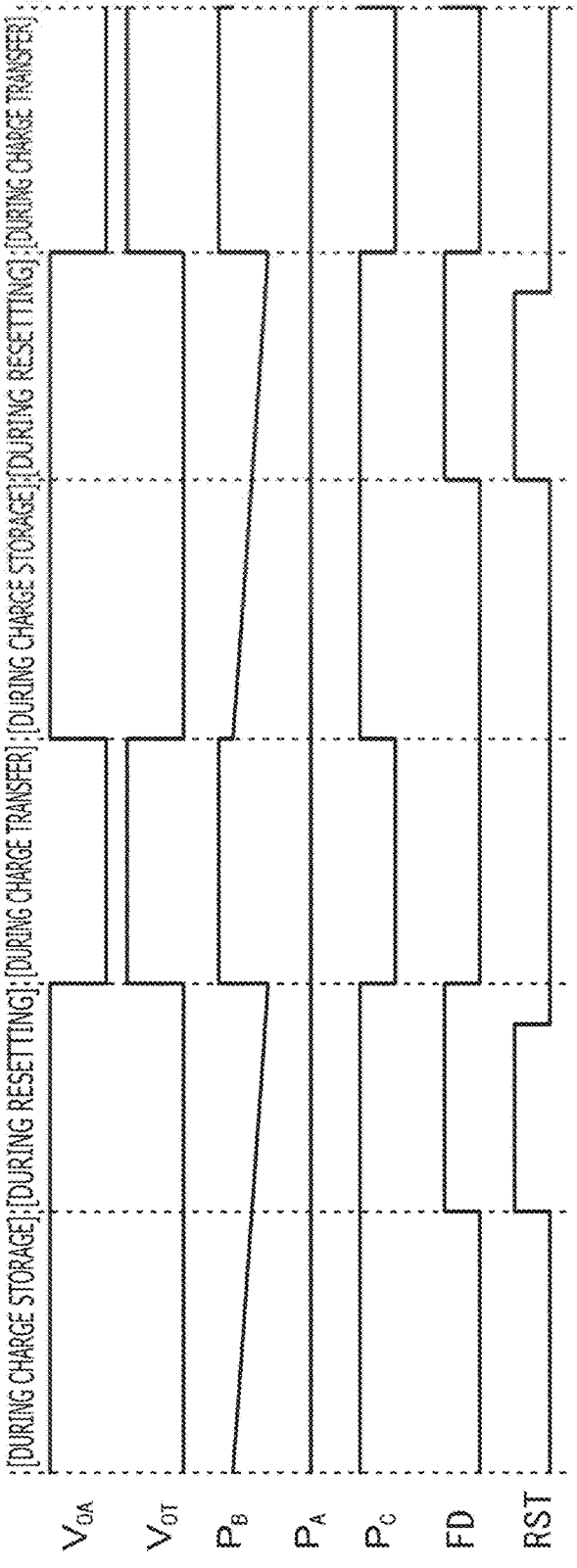

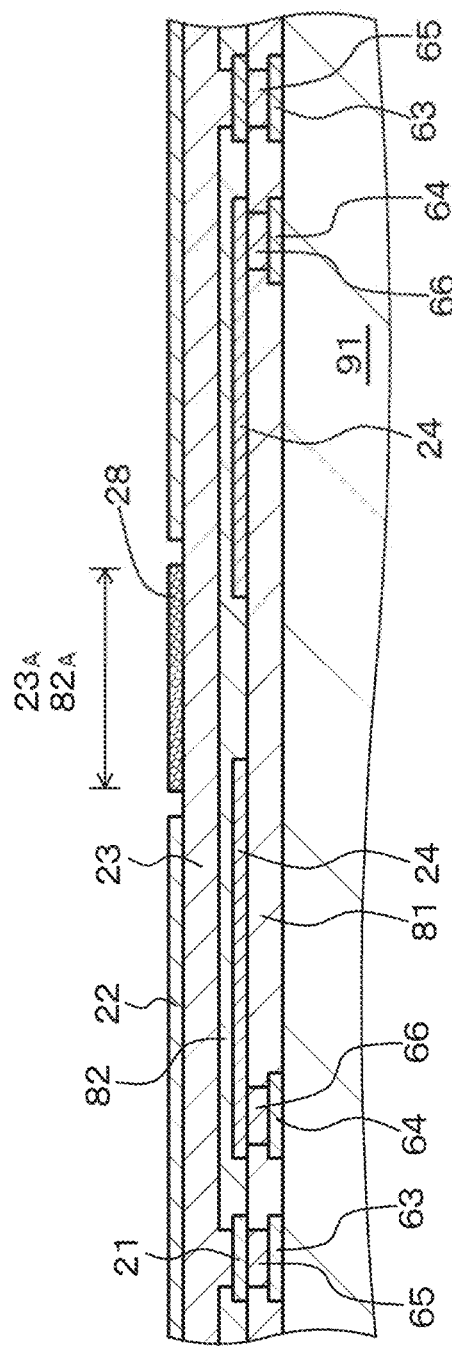
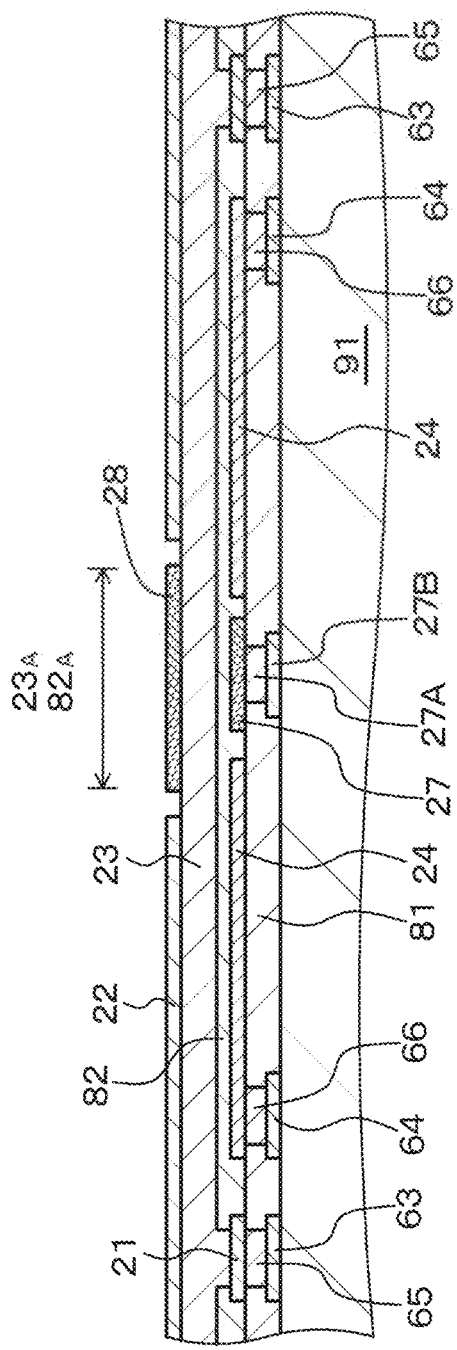
FIG. 36A
FIG. 36B

ANNEALING TREATMENT

BEFORE HYDROGEN INTRODUCTION

AFTER HYDROGEN TERMINATION

IMAGE PICKUP ELEMENT, STACKED IMAGE PICKUP ELEMENT, AND SOLID IMAGE PICKUP APPARATUS

CROSS-REFERENCE TO RELATED APPLICATIONS

This application in a continuation of U.S. patent application Ser. No. 17/257,740, filed Jan. 4, 2021, which is a national stage application under 35 U.S.C. 371 and claims the benefit of PCT Application No. PCT/JP2019/026474 having an international filing date of 3 Jul. 2019, which designated the United States, which PCT application claimed the benefit of Japanese Patent Application Nos. 2018-134012, filed 17 Jul. 2018 and 2019-123550, filed 2 Jul. 2019, the entire disclosures of each of which are incorporated herein by reference.

TECHNICAL FIELD

The present disclosure relates to an image pickup element, a stacked image pickup element, and a solid image pickup apparatus.

BACKGROUND ART

As image pickup elements included in an image sensor or the like, attention has been paid to stacked image pickup elements. The stacked image pickup element has a structure in which a photoelectric conversion layer (light receiving layer) is sandwiched between two electrodes. The stacked image pickup element requires a structure for storing and transferring signal charge generated in the photoelectric conversion layer on the basis of photoelectric conversion. Known structures require a structure in which signal charge is stored in and transferred to an FD (Floating Drain) electrode, and also requires high-speed transfer sufficient to prevent delay of signal charge.

An image pickup element (photoelectric conversion element) for solving such problems is disclosed in, for example, Japanese Patent Laid-Open No. 2016-063165. This image pickup element includes a storage electrode formed on a first insulating layer, a second insulating layer formed on the storage electrode, a semiconductor layer formed over the storage electrode and the second insulating layer, a collection electrode formed in contact with the semiconductor layer but away from the storage electrode, a photoelectric conversion layer formed on the semiconductor layer, and an upper electrode formed on the photoelectric conversion layer.

An image pickup element in which an organic semiconductor material is used as a photoelectric conversion layer can photoelectrically convert a particular color (wavelength band). Due to such a feature, in a case where such an image pickup element is used as an image pickup element in a solid image pickup apparatus, a structure (stacked image pickup element) with stacked subpixels can be obtained in which the subpixels each include a combination of an on-chip color filter layer (OCCF) and an image pickup element and are two-dimensionally arranged (for example, Japanese Patent Laid-Open No. 2011-138927); such a structure cannot be achieved in known solid image pickup apparatuses. Additionally, since the image pickup element requires no demosaicing processing, there is an advantage that possible false colors do not appear. In the description below, an image pickup element with a photoelectric conversion section provided on or above a semiconductor substrate may be referred to as an "image pickup element of a first type" for convenience. The photoelectric conversion section included in the image pickup element of the first type may be referred to as a "photoelectric conversion section of the first type" for convenience. An image pickup element provided in the semiconductor substrate may be referred to as an "image pickup element of a second type" for convenience. A photoelectric conversion section included in the image pickup element of the second type may be referred to as a "photoelectric conversion section of the second type" for convenience.

FIG. 51 depicts a configuration example of a known stacked image pickup element (stacked solid image pickup apparatus). In an example depicted in FIG. 51, in a semiconductor substrate 370, there are stacked and formed a third photoelectric conversion section 343A and a second photoelectric conversion section 341A that correspond to photoelectric conversion sections of the second type included in a third image pickup element 343 and a second image pickup element 341 corresponding to image pickup elements of the second type. Additionally, a first photoelectric conversion section 310A corresponding to a photoelectric conversion section of the first type is disposed above the semiconductor substrate 370 (specifically, above the second image pickup element 341). Here, the first photoelectric conversion section 310A includes a first electrode 321, a photoelectric conversion layer 323 including an organic material, and a second electrode 322, and forms a first image pickup element 310 corresponding to an image pickup element of the first type. The second photoelectric conversion section 341A and the third photoelectric conversion section 343A photoelectrically convert, for example, blue light and red light, respectively, due to a difference in absorption coefficient. Additionally, the first photoelectric conversion section 310A photoelectrically converts, for example, green light.

Charge generated by the photoelectric conversion in the second photoelectric conversion section 341A and the third photoelectric conversion section 343A is temporarily stored in the second photoelectric conversion section 341A and the third photoelectric conversion section 343A and then transferred to a second floating diffusion layer FD2 and a third floating diffusion layer FD3 by a vertical transistor (a gate portion 345 is depicted) and a transfer transistor (a gate portion 346 is depicted), respectively. The charge is further output to an external read-out circuit (not depicted). The transistors and the floating diffusion layers FD2 and FD3 are also formed in the semiconductor substrate 370.

Charge generated by the photoelectric conversion in the first photoelectric conversion section 310A is stored, via a contact hole portion 361 and an interconnect layer 362, in a first floating diffusion layer FD1 formed in the semiconductor substrate 370. Additionally, the first photoelectric conversion section 310A is connected via the contact hole portion 361 and the interconnect layer 362 to a gate portion 352 of an amplifying transistor that converts an amount of charge into a voltage. Further, the first floating diffusion layer FD1 forms a part of a reset transistor (a gate portion 351 is depicted). A reference sign 371 denotes an element isolation region. A reference sign 372 denotes an insulating material film formed on a front surface of the semiconductor substrate 370. Reference signs 376 and 381 denote interlayer insulating layers. A reference sign 383 denotes a protective material layer. A reference sign 314 denotes an on-chip microlens.

CITATION LIST

Patent Literature

PTL 1: Japanese Patent Laid-Open No. 2016-063165
PTL 2: Japanese Patent Laid-Open No. 2011-138927

SUMMARY

Technical Problem

Japanese Patent Laid-Open No. 2016-063165 listed above refers to several materials included in semiconductor layers. However, in a case where a semiconductor layer includes an oxide semiconductor layer, when oxygen loss occurs on or near a front surface of the oxide semiconductor layer (the surface in contact with the photoelectric conversion layer), a characteristic of the oxide semiconductor layer may fluctuate (for example, the characteristic evaluated using a threshold voltage) to degrade a charge transfer characteristic, leading to degraded quality of captured images.

Thus, an object of the present disclosure is to provide an image pickup element, a stacked image pickup element, and a solid image pickup apparatus that are excellent in a transfer characteristic for charge stored in a photoelectric conversion layer.

Solution to Problem

To achieve the above-described object, an image pickup element of the present disclosure includes: a photoelectric conversion section including a first electrode, a photoelectric conversion layer, and a second electrode stacked on one another, in which an oxide film and an oxide semiconductor layer are formed immediately below the photoelectric conversion layer from the photoelectric conversion layer side.

A stacked image pickup element of the present disclosure for achieving the above-described object includes at least one image pickup element of the present disclosure described above.

A solid image pickup apparatus according to a first aspect of the present disclosure for achieving the above-described object includes a plurality of the above-described image pickup elements of the present disclosure. Additionally, a solid image pickup apparatus according to a second aspect of the present disclosure for achieving the above-described object includes a plurality of the above-described stacked image pickup elements of the present disclosure.

BRIEF DESCRIPTION OF DRAWINGS

FIG. 5 is a schematic layout diagram of a first electrode and a charge storage electrode included in the image pickup element of Embodiment 1 and transistors included in a control section.

FIG. 22 is a diagram schematically depicting the state of potentials at the respective sections during another operation of the image pickup element of Embodiment 5.

FIGS. 36A and 36B are schematic cross-sectional views of parts of modified examples of the image pickup element of Embodiment 8 (two juxtaposed image pickup elements).

49A is a diagram depicting results of prediction, based on a first-principle calculation, of an interface between the oxide semiconductor layer and the oxide film in which excess oxygen is present as an example of a defective site.

DESCRIPTION OF EMBODIMENTS

Figure 1:
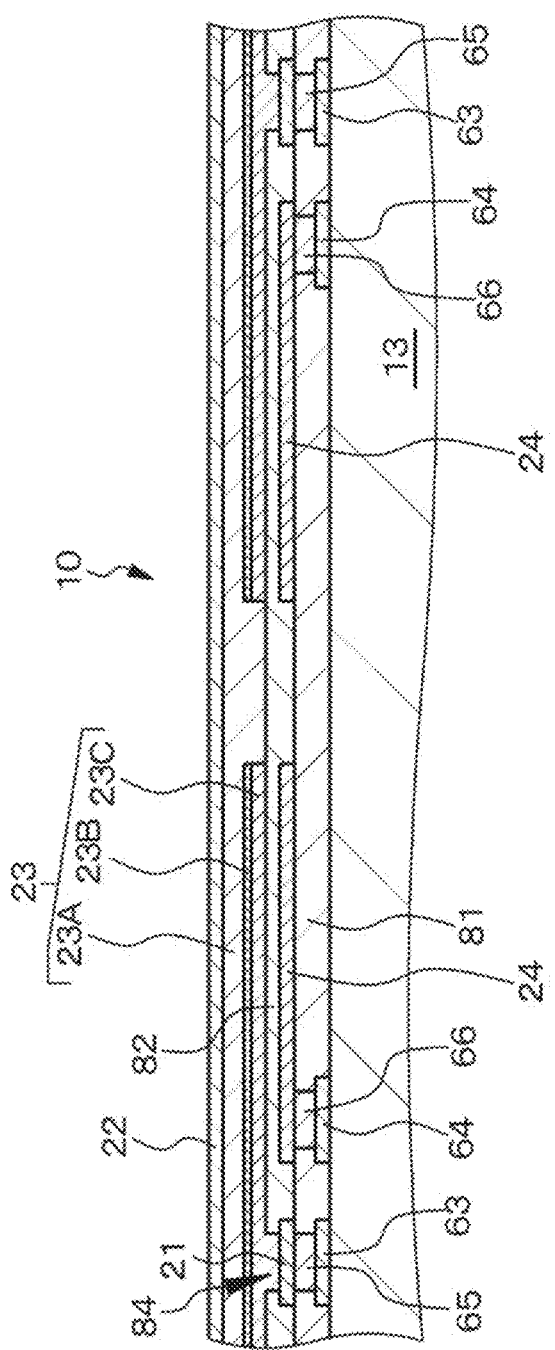
FIG. 1 is a schematic cross-sectional view of a part of an image pickup element of Embodiment 1 (two juxtaposed image pickup elements).

With reference to the drawings, the present disclosure will be described below on the basis of embodiments. However, the present disclosure is not limited to the embodiments, and various numerical values and materials in the embodiments are illustrative. The description is given in the following order.

1. Description of image pickup element of present disclosure, stacked image pickup element of present disclosure, and solid image pickup apparatuses according to first and second aspects of present disclosure, in general
2. Embodiment 1 (image pickup element of present disclosure, stacked image pickup element of present disclosure, and solid image pickup apparatus according to second aspect of present disclosure)

3. Embodiment 2 (modification of Embodiment 1)
4. Embodiment 3 (modification of Embodiments 1 and 2)
5. Embodiment 4 (modification of Embodiments 1 to 3, and solid image pickup apparatus according to first aspect of present disclosure)
6. Embodiment 5 (modification of Embodiments 1 to 4, and image pickup element including transfer control electrode)
7. Embodiment 6 (modification of Embodiments 1 to 5, and image pickup element including charge emission electrode)
8. Embodiment 7 (modification of Embodiments 1 to 6, and image pickup element including lower charge transfer control electrode)
9. Embodiment 8 (modification of Embodiments 1 to 7, and image pickup element including upper charge transfer control electrode)
10. Others Description of Image Pickup Element of Present Disclosure, Stacked Image Pickup Element of Present Disclosure, and Solid Image Pickup Apparatuses According to First and Second Aspects of Present Disclosure, in General In the image pickup element and the like of the present disclosure including the above-described preferred configuration, when, with a vacuum level based on zero reference, energy (value has a negative sign) is defined to have an absolute value increasing consistently with deviation from the vacuum level, assuming that $E_2$ denotes an energy average value at a maximum energy value (see "C" in FIG. 45) of a conductance band of an oxide semiconductor layer (the energy average value at the maximum energy value of the conductance band of the oxide semiconductor layer may hereinafter simply be referred to as an "energy average value in the conductance band of the oxide semiconductor layer" in some cases) and that $E_1$ denotes an energy average value at a maximum energy value (see "B" in FIG. 45) of a conductance band of an oxide film (the energy average value at the maximum energy value of the conductance band of the oxide film may hereinafter simply be referred to as an "energy average value in the conductance band of the oxide film" in some cases), $E_1-E_2 \geq -0.4$ (eV) preferably $E_1-E_2 \geq 0$ (eV) more preferably $E_1-E_2 \geq 0.1$ (eV) and much more preferably $E_1-E_2 > -0.1$ (eV) are satisfied. Further, in this case, when $E_0$ denotes an energy average value at a LUMO value (see "A" in FIG. 45) for a photoelectric conversion layer, $E_0-E_1 \geq -0.4$ (eV) preferably $E_0-E_1 \geq 0$ (eV) more preferably $E_0-E_1 \geq 0.1$ (eV) much more preferably $E_0-E_1 > 0.1$ (eV) and further $E_0 \geq E_1 \geq E_2$ are satisfied. In a case where the magnitude relation is approximately (−0.4 eV) as described above, charge can be reliably migrated, for example, from the photoelectric conversion layer via the oxide film to the oxide semiconductor layer, by optimizing potentials applied to an charge storage electrode and a second electrode to increase an electric field intensity applied to the photoelectric conversion layer. Additionally, as described above, sufficiently thinning the oxide film allows the charge to be migrated on the basis of a tunnel effect. Note that "minimum energy" means that the value of energy has a minimum absolute value and that "maximum energy" means that the value of energy has a maximum absolute value. This also applies to the description below, similarly.

In the image pickup element and the like of the present disclosure including the above-described various preferred configuration, when, with a vacuum level based on a zero reference, energy (value has a negative sign) is defined to have an absolute value increasing consistently with devia-tion from the vacuum level, assuming that $E_4$ denotes an energy average value at a minimum energy value (see "E" in FIG. 45) of a valence band of an oxide film (the energy average value at the minimum energy value of the valence band of the oxide film may hereinafter simply be referred to as an "energy average value in the valence band of the oxide film" in some cases) and that $E_3$ denotes an energy average value at a HOMO value (see "D" in FIG. 45) for the photoelectric conversion layer, $E_3-E_4 \geq 0.4$ (eV) preferably $E_3-E_4 \geq 0$ (eV) more preferably $E_3-E_4 \geq 0.1$ (eV) and much more preferably $E_3-E_4 > -0.1$ (eV) are satisfied. Further, in this case, assuming that $E_5$ denotes an energy average value at a minimum energy value (see "F" in FIG. 45) of a valence band of an oxide semiconductor layer ((the energy average value at the minimum energy value of the valence band of the oxide semiconductor layer may hereinafter simply be referred to as an "energy average value in the valence band of the oxide semiconductor layer" in some cases), $E_4-E_5-0.4$ (eV) preferably $E_4-E_5 \geq 0$ (eV) more preferably $E_4-E_5 \geq 0.1$ (eV) much more preferably $E_4-E_5 > 0.1$ (eV) and further $E_3 \geq E_4 \geq E_5$ are satisfied.

Here, the energy of the valence band and the value of the HOMO can be determined on the basis of, for example, an ultraviolet photoelectron spectroscopy (UPS). Additionally, the energy of the conductance band and the value for the LUMO can be determined from the {(energy of the valence band and the value for the HOMO)+$E_b$}. Further, a bandgap energy $E_b$ can be determined from an optically absorbed wavelength λ (optical absorption edge wavelength; unit is nm) on the basis of the following equation.

$$E_b = h\nu = h(c/\lambda) = 1239.8/\lambda [eV]$$

Further, the image pickup element and the like of the present disclosure including the above-described various preferred configurations can be configured such that the material forming the oxide film includes a metal oxide, and in this case, such that the metal oxide includes at least one type of element selected from the group including tantalum (Ta), titanium (Ti), vanadium (V), niobium (Nb), tungsten (W), zirconium (Zr), hafnium (Hf), scandium (Sc), yttrium (Y), lanthanum (La), gallium (Ga), and magnesium (Mg). Further, the image pickup element and the like can be configured such that the oxide film includes an addition of at least one type of element selected from the group includ-ing silicon (Si), tantalum (Ta), vanadium (V), niobium (Nb), tungsten (W), zirconium (Zr), hafnium (Hf), scandium (Sc), yttrium (Y), lanthanum (La), gallium (Ga), magnesium (Mg), aluminum (Al), strontium (Sr), germanium (Ge), hydrogen (H), carbon (C), and nitrogen (N) (however, the element is different from the element included in the metal oxide). In this case, the oxide film preferably includes an addition of at least one type of element selected from the group including silicon (Si), niobium (Nb), tungsten (W), zirconium (Zr), aluminum (Al), carbon (C), and nitrogen (N) (however, the element is different from the element included in the metal oxide). Examples of an additive rate of each of these addition elements can include 0.33 atom % to 16.7 atom %, preferably 0.54 atom % to 14.3 atom %, and more preferably 0.81 atom % to 11.1 atom %, but the additive rate is not limited thereto. Note that a total of atom % of atoms (including oxygen atoms) included in the metal oxide is 100 atom %. Specifically, for example, in a case where the oxide film includes tantalum atoms, silicon atoms, and oxygen atoms, the total of atom % of tantalum atoms included in the oxide film, atom % of silicon atoms included in the oxide film, and atom % of oxygen atoms included in the oxide film is 100 atom %. Addition of any of these elements to the oxide film allows suppression of crystallization of the oxide film during thermal treatment in steps of manufacturing an image pickup element. Local crystallization of the oxide film may lead to a leakage current originating from the locally crystallized portion. However, such a possible problem can be prevented because an oxide film with a uniform amorphous structure can be obtained, thus allowing stabilization of a threshold voltage for the photoelectric conversion layer. As a result, the characteristics of charge storage and transfer efficiency can further be improved, allowing captured image quality to be enhanced. Further, in these cases, the oxide film may have a thickness equal to or larger than one atomic layer and equal to or smaller than $1 \times 10^{-7}$ m. Specific examples of the metal oxide may include $Ta_2O_5$, $TiO_2$, $V_2O_5$, $Nb_2O_5$, $W_2O_3$, $ZrO_2$, $HfO_2$, $Sc_2O_3$, $Y_2O_3$, $La_2O_3$, $Ga_2O_3$, and MgO. Even the oxide film having a thickness equal to one atomic layer (approximately 0.15 nm) is sufficiently effective for stabilizing the oxide semiconductor.

Alternatively, the image pickup element and the like including the above-described various preferred configurations can be configured such that the oxide film includes a tunnel oxide film, and in this case, such that the tunnel oxide film includes at least one type of material selected from the group including $SiO_x$, SiON, SiOC, and $AlO_y$, and further, in these cases, such that the tunnel oxide film has a thickness equal to or larger than one atomic layer and equal to or smaller than $5 \times 10^{-9}$ m.

Alternatively, the image pickup element and the like including the above-described various preferred configurations can be configured such that the oxide film includes a stacked structure of a film including a metal oxide and a tunnel oxide film, and in this case, such that the metal oxide includes at least one type of element selected from the group including tantalum, titanium, vanadium, niobium, tungsten, zirconium, hafnium, scandium, yttrium, lanthanum, gallium, and magnesium, and further, such that the film including the metal oxide has a thickness equal to or larger than one atomic layer and equal to or smaller than $1 \times 10^{-7}$ m. Further, in these cases, the image pickup element and the like can be configured such that the tunnel oxide film includes at least one type of material selected from the group including $SiO_x$, SiON, SiOC, and $AlO_y$, and further, such that, in these cases, the tunnel oxide film has a thickness equal to or larger than one atomic layer and equal to or smaller than $5 \times 10^{-9}$ m.

The oxide semiconductor (which may hereinafter be referred to as an "oxide semiconductor layer constituent material) corresponding to a material included in the oxide semiconductor layer may be, for example, an indium oxide, a gallium oxide, a zinc oxide, or a tin oxide, or a material including at least one type of the above-described oxides, or may be a material including any of the above-described materials with an addition of a dopant, specifically, for example, IGZO (an indium-gallium-zinc oxide including zinc oxide with an addition of indium and gallium as dopants), ITZO, IWZO, IWO, ZTO, an ITO-$SiO_x$-based material (an indium-tin oxide mixed or doped with silicon oxide), GZO (a gallium-zinc oxide including zinc oxide with an addition of gallium as a dopant), IGO (an indium-gallium oxide including gallium oxide with an addition of indium as a dopant), $ZnSnO_3$, AlZnO, GaZnO, or InZnO. In addition, the oxide semiconductor may be a material including CuI, $InSbO_4$, ZnMgO, $CuInO_2$, $MgIn_2O_4$, CdO, or the like. However, limitation to the above-described materials is not intended. Alternatively, in a case where charge to be stored includes electrons, the oxide semiconductor layer constituent material may be a material having an ionization potential higher than the ionization potential of a material included in the photoelectric conversion layer (hereinafter referred to as a "photoelectric conversion layer constituent material"). In a case where charge to be stored includes holes, the oxide semiconductor layer constituent material may be a material having an electron affinity lower than the electron affinity of the photoelectric conversion layer constituent material. Alternatively, the oxide semiconductor layer constituent material preferably has an impurity concentration of $1 \times 10^{18}$ $cm^{-3}$ or less. The oxide semiconductor layer may have a single layer configuration or a multilayer configuration. An oxide semiconductor layer constituent material located above the charge storage electrode may be different from an oxide semiconductor layer constituent material located above a first electrode.

Further, the image pickup element and the like including the above-described various configurations and arrangements can be configured such that an average value $Conc_{H-1}$ of a concentration of hydrogen atoms in a portion of the oxide semiconductor layer near an interface between the oxide film and the oxide semiconductor layer is higher than an average value $Conc_{H-2}$ of a concentration of hydrogen atoms in a central portion of the oxide semiconductor layer along a thickness direction. In this case, $Conc_{H-1}/Conc_{H-2} \geq 1.1$ is preferably satisfied. Further, alternatively, assuming that $Conc_{H-1}$ is a value of the concentration of hydrogen atoms in the portion of the oxide semiconductor layer near the interface between the oxide film and the oxide semiconductor layer and that $Conc_{M-1}$ is a value of concentration of atoms included in the oxide film in the portion of the oxide semiconductor layer near the interface between the oxide film and the oxide semiconductor layer, an average change rate $\Delta Conc_{H-1}$ of $Conc_{H-1}$ toward the central portion along the thickness direction of the oxide semiconductor layer may be larger than an average change rate $\Delta Conc_{M-1}$ of $Conc_{M-1}$ toward the central portion along the thickness direction of the oxide semiconductor layer. Here, the interface between the oxide film and the oxide semiconductor layer is defined, when it is assumed that $Conc_{M-Peak}$ is a peak value of concentration of atoms in the oxide film that is included in the oxide film, as a portion of the oxide film in which the atoms included in the oxide film has a concentration value that is 10% of $Conc_{M-Peak}$. Further, the portion of the oxide semiconductor layer near the interface between the oxide film and the oxide semiconductor layer refers to a region accounting for 10% or less of the thickness of the photoelectric conversion layer (that is, the region corresponding to a range of 0% to 10% of the thickness of the photoelectric conversion layer) with reference to an interface between the oxide film and the photoelectric conversion layer, and the central portion of the oxide semiconductor layer along the thickness direction refers to a region accounting for from 40% to 60% of the thickness of the photoelectric conversion layer (that is, the region corresponding to a range of 40% to 60% of the thickness of the photoelectric conversion layer) with reference to the interface between the oxide film and the photoelectric conversion layer. The concentration of hydrogen atoms and the concentration of the atoms included in the oxide film can be determined by, for example, a secondary ion mass spectrometry method (SIMS method) using a secondary ion mass spectrometry apparatus available from CAMEKA SAS or on the basis of an energy dispersive x-ray spectroscopy method (EDS method). Additionally, the average change rate of concentration of atoms in a certain region in the thickness direction (referred to as a "certain section" for convenience) can be determined by smoothing an analytical value of the atom concentration value from a branch point to an end point of the certain section and dividing a value of {(atom concentration value at the end point obtained by smoothing)−(atom concentration value at the branch point obtained by smoothing)} by a (distance from the end point to the start point).

The first electrode, the second electrode, the charge storage electrode, and the photoelectric conversion layer will be described below in detail.

Further, the image pickup element and the like including the above-described various preferred configurations and arrangements can be configured such that charge generated in the photoelectric conversion layer migrates to the first electrode via the oxide film and the oxide semiconductor layer, and in this case, such that the charge includes electrons.

In the image pickup element and the like of the present disclosure, a characteristic of the material included in the oxide film (hereinafter referred to as a "oxide film constituent material" in some cases), a characteristic of the photoelectric conversion layer constituent material, and a characteristic of the oxide semiconductor layer constituent material are defined, and the characteristic of the photoelectric conversion layer constituent material refers to a characteristic average value for the portion of the photoelectric conversion layer located near the oxide film. The characteristic of the oxide film constituent material is an average value for the oxide film, and the characteristic of the oxide semiconductor layer constituent material is an average value for the oxide semiconductor layer. Specifically, the energy average values $E_1$ and $E_2$ for the conductance bands of the oxide film and the oxide semiconductor layer are average values for the oxide film and the oxide semiconductor layer. Additionally, the energy average value $E_0$ for the LUMO value for the photoelectric conversion layer is an average value for the portion of the photoelectric conversion layer located near the oxide film. Similarly, the energy average values $E_4$ and $E_5$ for the valence bands of the oxide film and the oxide semiconductor layer are average values for the oxide film and the oxide semiconductor layer. Additionally, the energy average value $E_3$ for the HUMO value for the photoelectric conversion layer is an average value for the portion of the photoelectric conversion layer located near the oxide film. Here, the "portion of the photoelectric conversion layer located near the oxide film" refers to a portion of the photoelectric conversion layer located in a region accounting for 10% or less of the thickness of the photoelectric conversion layer (that is, the region corresponding to a range of 0% to 10% of the thickness of the photoelectric conversion layer) with reference to the interface between the oxide film and the photoelectric conversion layer.

Further, the image pickup element and the like including the above-described various preferred configurations and arrangements can be configured such that the oxide semiconductor layer is amorphous (for example, the oxide semiconductor layer is amorphous and does not locally have a crystal structure). Whether or not the oxide semiconductor layer is amorphous can be determined on the basis of X-ray diffraction analysis. However, the oxide semiconductor layer is not limited to being amorphous and may have a crystal structure or a polycrystal structure.

Further, the image pickup element and the like including the above-described various preferred configurations and arrangements can be configured such that the oxide semiconductor layer has a thickness of $1\times10^{-8}$ m to $1.5\times10^{-7}$ m, preferably $2\times10^{-8}$ m to $1.0\times10^{-7}$ m, and more preferably $3\times10^{-8}$ m to $1.0\times10^{-7}$ m. The oxide semiconductor layer preferably has a carrier concentration (carrier density) of less than $1\times10^{16}/cm^3$, and this enables an increase in the amount of charge storage in the oxide semiconductor layer. Additionally, the oxide semiconductor layer constituent material preferably has a carrier mobility of 10 $cm^2/Vs$ or more, and this allows charge stored in the oxide semiconductor layer to be quickly migrated to the first electrode.

Further, the image pickup element and the like including the above-described various preferred configurations and arrangements can be configured such that light is incident from the second electrode, and an oxide semiconductor layer surface on the photoelectric conversion layer side (the oxide semiconductor layer surface at the interface between the oxide film and the oxide semiconductor layer; this also applies to the description below) has a surface roughness Ra of 1.5 nm or less and a root mean square roughness Rq of 2.5 nm or less. The surface roughness Ra and the roughness Rq are based on JIS B0601:2013. Such smoothness of the oxide semiconductor layer surface suppresses scatter reflection at the oxide semiconductor layer surface and allows improvement of bright current characteristic in photoelectric conversion. A charge storage electrode surface may have a surface roughness Ra of 1.5 nm or less and a root mean square roughness Rq of 2.5 nm or less.

Figure 51:
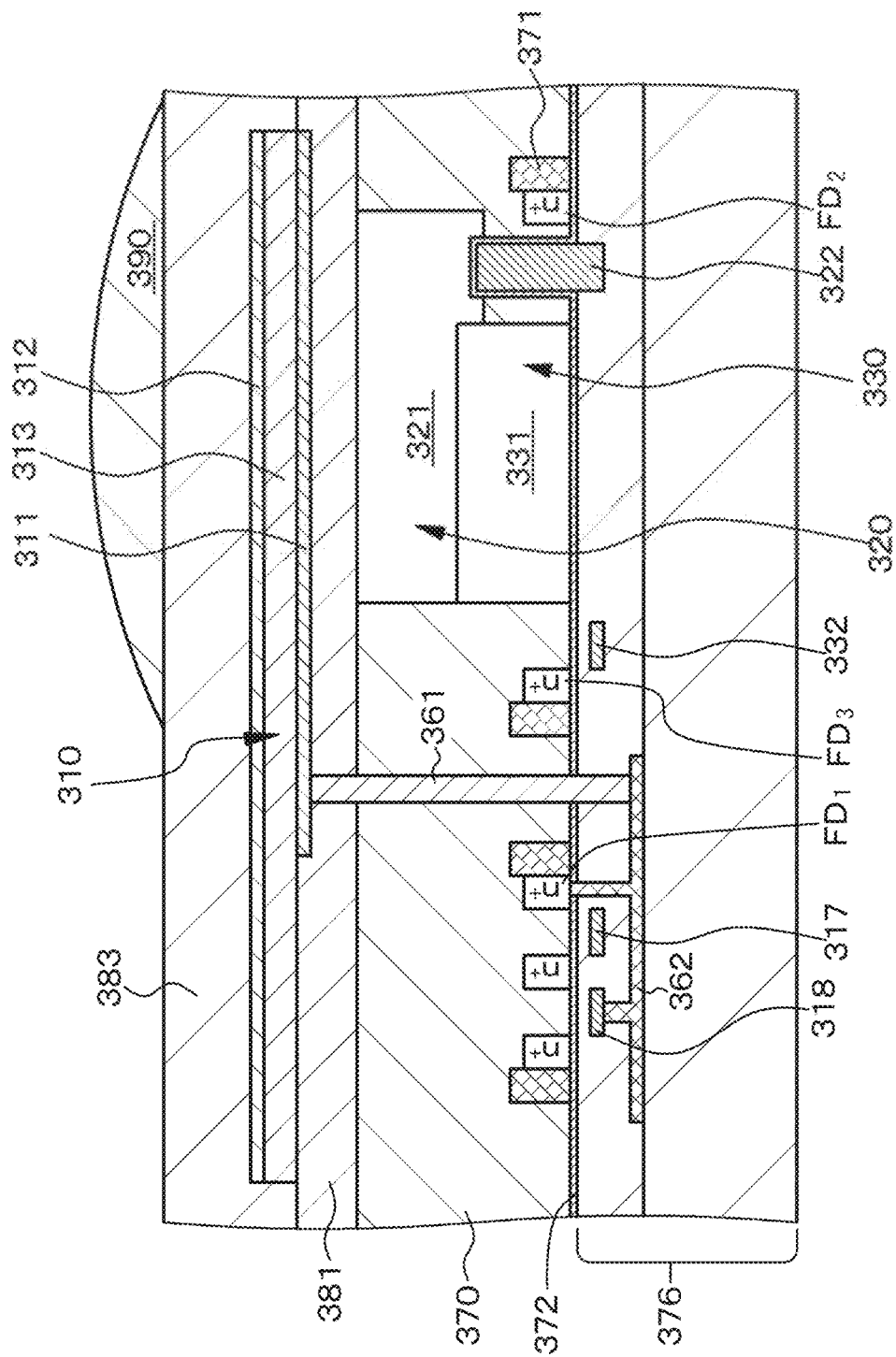
FIG. 51 is a conceptual diagram of a known stacked image pickup element (stacked solid image pickup apparatus).

In a known image pickup element depicted in FIG. 51, charge generated by photoelectric conversion in a second photoelectric conversion section 341A and a third photoelectric conversion section 343A is temporarily stored in the second photoelectric conversion section 341A and a third photoelectric conversion section 343A and then transferred to a second floating diffusion layer FD2 and a third floating diffusion layer FD3. Consequently, the second photoelectric conversion section 341A and the third photoelectric conversion section 343A can be completely depleted. However, charge generated by photoelectric conversion in the first photoelectric conversion section 310A is stored directly in a first floating diffusion layer FD1. Thus, completely depleting the first photoelectric conversion section 310A is difficult. As a result, kTC noise may become louder and random noise may become more serious, leading to degraded quality of captured images.

In the image pickup element and the like of the present disclosure, in a case where the charge storage electrode disposed with a space from the first electrode and disposed so as to face the oxide semiconductor layer across an insulating layer is provided, when the photoelectric conversion section is irradiated with light and performs photoelectric conversion, charge can be stored in the oxide semiconductor layer (in some cases, the oxide semiconductor layer and the photoelectric conversion layer, or the oxide semiconductor layer, the oxide film, and the photoelectric conversion layer). Consequently, when exposure is started, the charge storage section can be completely depleted to delete charge. As a result, it is possible to suppress a phenomenon in which kTC noise becomes louder, random noise becomes more serious, and quality of captured images is degraded. Note that, in the description below, the oxide semiconductor layer, or the oxide semiconductor layer and the photoelectric conversion layer, or the oxide semiconductor layer, the oxide film, and the photoelectric conversion layer may be collectively referred to as the "oxide semiconductor layer and the like" in some cases.

The oxide semiconductor layer and the oxide film can be formed on the basis of, for example, a physical vapor deposition method (PVD method), specifically, for example, a sputtering method. More specifically, a sputtering method can be illustrated in which, for example, a parallel plate sputtering apparatus, a DC magnetron sputtering apparatus, or an RF sputtering apparatus is used as a sputtering apparatus, an argon (Ar) gas is used as a process gas, and a desired sintered body is used as a target. Alternatively, an atomic layer deposition method (ALD method) can be illustrated as a method of forming the oxide film. However, the present disclosure is not limited to these film formation methods.

In a case where the oxide semiconductor layer is formed on the basis of the sputtering method, controlling the amount of introduced oxygen gas (oxygen gas partial pressure) allows the energy level of the oxide semiconductor layer to be controlled. Specifically, when the oxide semiconductor layer is formed on the basis of the sputtering method, the control can be based on the following.

oxygen gas partial pressure=($O_2$ gas pressure)/(total pressure of Ar gas and $O_2$ gas)

The oxygen gas partial pressure preferably ranges from 0.005 to 0.10. Further, the image pickup element and the like of the present disclosure can be configured such that the oxygen content in the oxide semiconductor layer is lower than the oxygen content of a stoichiometric composition. Here, the energy level of the oxide semiconductor layer can be controlled on the basis of the oxygen content, and the energy level increases as the oxygen content decreases relative to the oxygen content of the stoichiometric composition, that is, as an oxygen deficiency increases.

Examples of the image pickup element and the like of the present disclosure may include a CCD element, a CMOS image sensor, a CIS (Contact Image Sensor), and a CMD (Charge Modulation Device) type signal amplifying image sensor. For example, the solid image pickup apparatus according to the first and second aspects of the present disclosure and solid image pickup apparatuses of a first and a second configurations described below can be included in a digital still camera, a video camera, a cam coder, a security camera, a vehicle mounted camera, a smartphone camera, a gaming user interface camera, or a biometric authentication camera.

Embodiment 1

Figure 2:
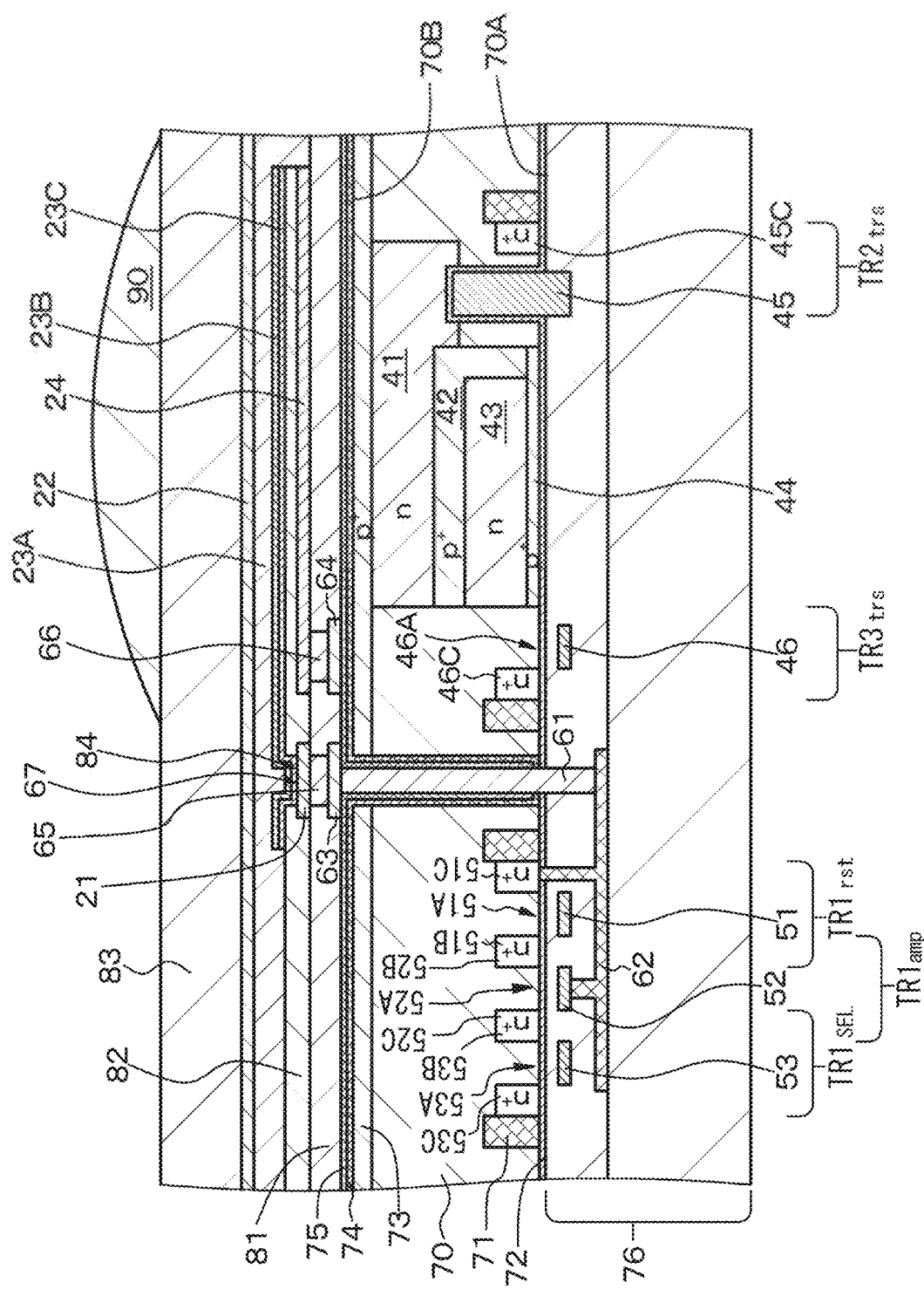
FIG. 2 is one schematic partial cross-sectional view of the image pickup element and a stacked image pickup element of Embodiment 1.
Figure 3:
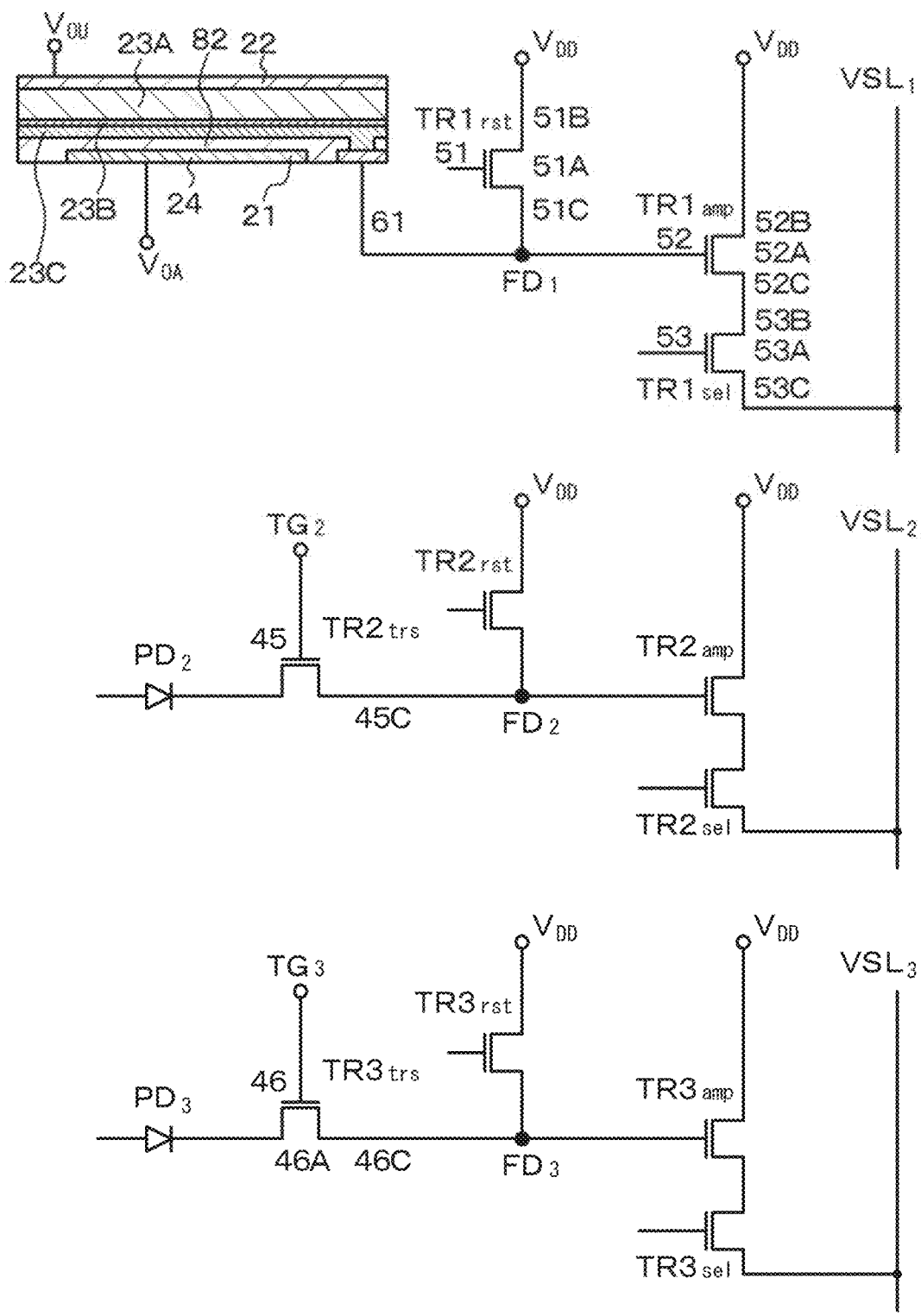
FIG. 3 is an equivalent circuit diagram of the image pickup element and the stacked image pickup element of Embodiment 1.
Figure 4:
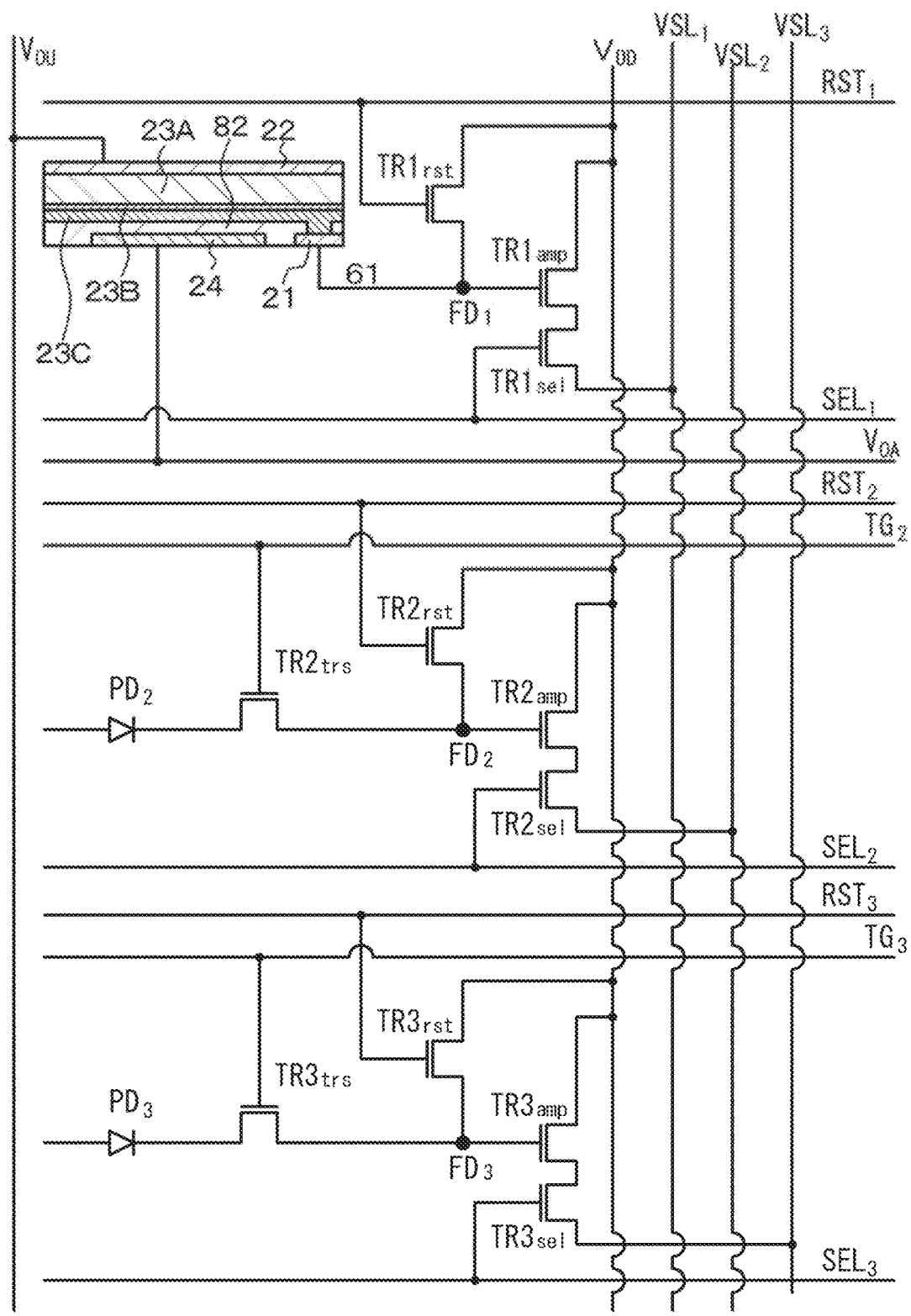
FIG. 4 is an equivalent circuit diagram of the image pickup element and the stacked image pickup element of Embodiment 1.
Figure 6:
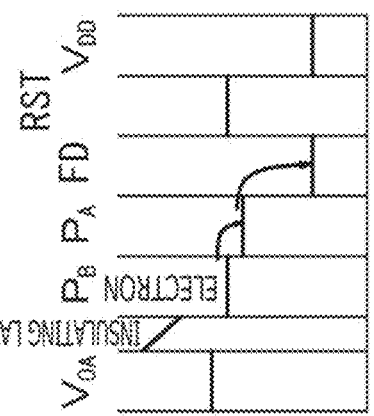
FIG. 6 is a diagram schematically depicting the state of potentials at respective sections during an operation of the image pickup element of Embodiment 1.
Figure 6:
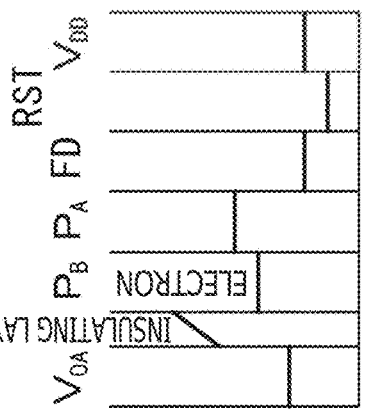
Figure 6:
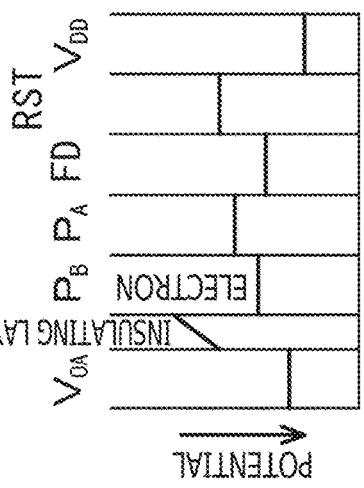
Figure 6:
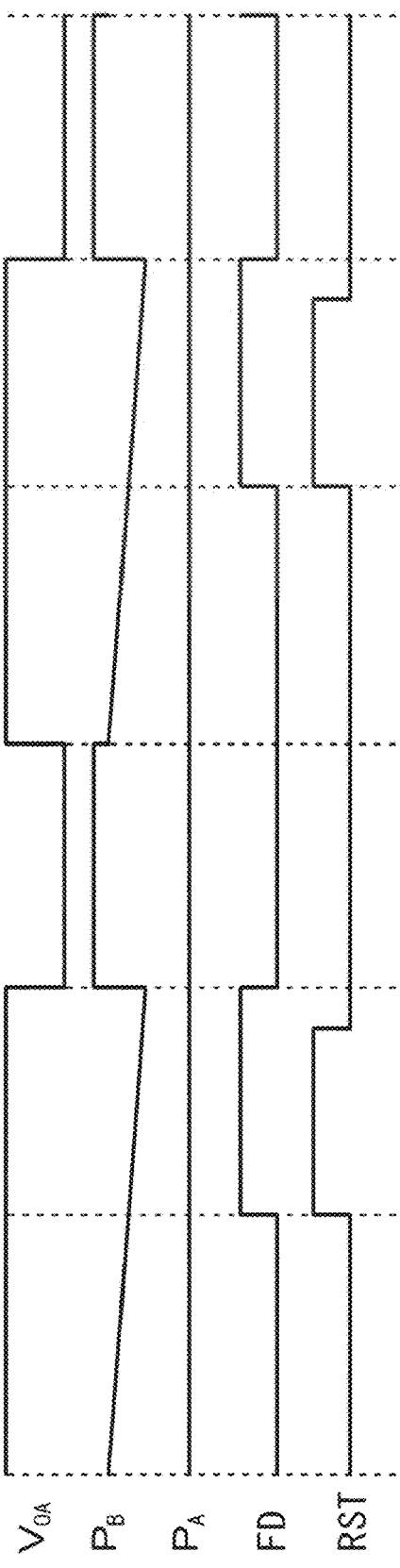
Figure 7A:
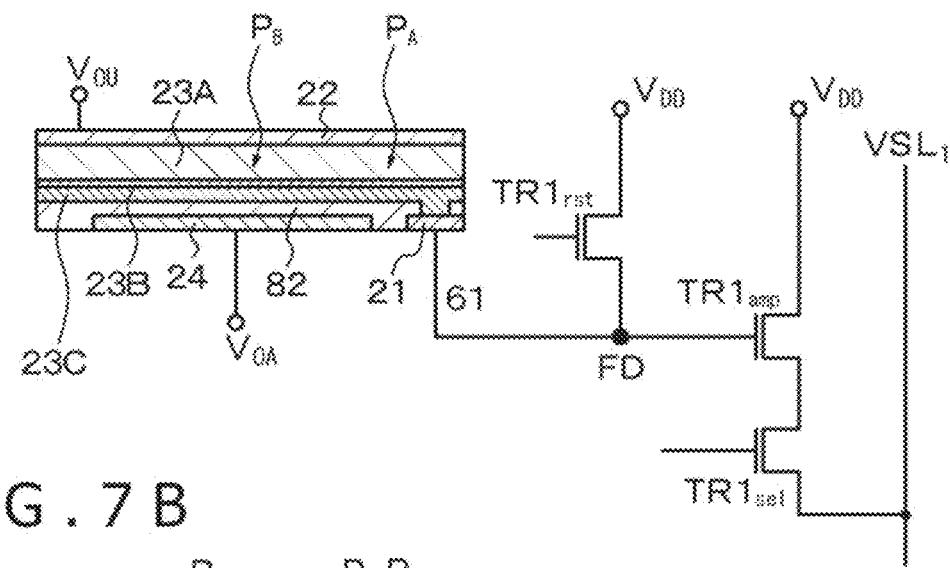
FIGS. 7A and 7B are equivalent circuit diagrams of the image pickup elements and the stacked image pickup elements of Embodiments 1 and 5 for describing the respective sections in FIG. 6 (Embodiment 1) and FIGS. 21 and 22 (Embodiment 5).
Figure 8:
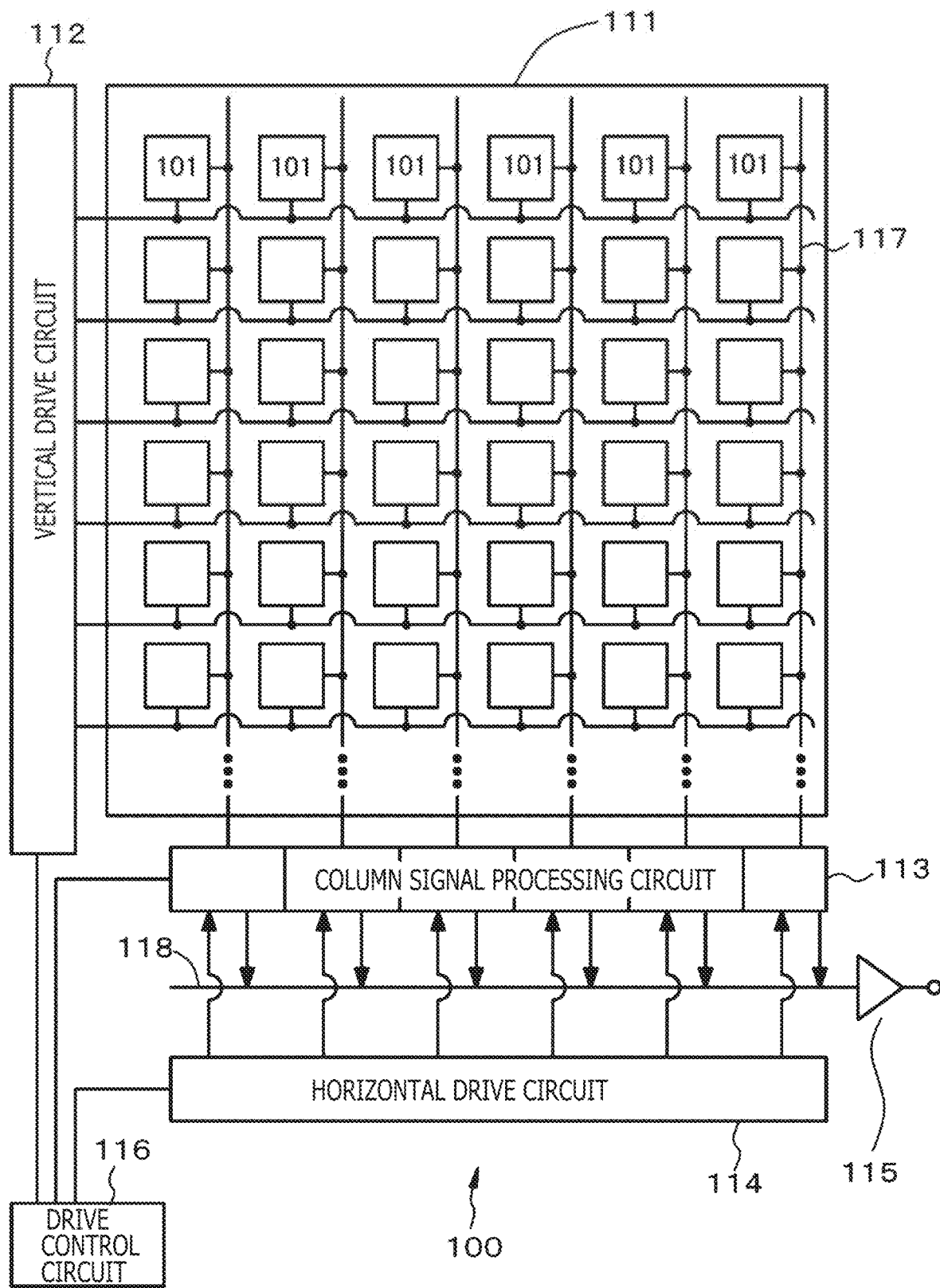
FIG. 8 is a conceptual diagram of a solid image pickup apparatus of Embodiment 1.

Embodiment 1 relates to the image pickup element of the present disclosure, the stacked image pickup element of the present disclosure, and the solid image pickup apparatus according to the second aspect of the present disclosure. FIG. 1 depicts a schematic cross-sectional view of a part of an image pickup element and stacked image pickup element of Embodiment 1 (hereinafter referred to as the "image pickup element"). Note that, while FIG. 1 depicts two juxtaposed image pickup elements, the schematic cross-sectional view in FIG. 1 is similar to, for example, a schematic cross-sectional view taken along an alternate long and short dash line A-A in FIG. 11. Additionally, FIG. 2 depicts one schematic partial cross-sectional view of the image pickup element and stacked image pickup element of Embodiment 1, FIGS. 3 and 4 depict equivalent circuit diagrams of the image pickup element and stacked image pickup element of Embodiment 1, and FIG. 5 depicts a schematic layout diagram of a first electrode and a charge storage electrode included in the image pickup element of Embodiment 1 and transistors included in a control section. Further, FIG. 6 schematically depicts the state of potentials at respective sections during an operation of the image pickup element of Embodiment 1, FIG. 7A depicts an equivalent circuit diagram of the image pickup element and stacked image pickup element of Embodiment 1 for describing the respective sections in FIG. 6, and FIG. 8 depicts a conceptual diagram of a solid image pickup apparatus of Embodiment 1. Note that various image pickup element components located below an interlayer insulating layer 81 may be collectively denoted by a reference sign 13 for convenience and simplification of illustration.

An image pickup element 10 of Embodiment 1 includes a photoelectric conversion section including a first electrode 21, a photoelectric conversion layer 23A, and a second electrode 22 stacked on one another, and immediately below the photoelectric conversion layer 23A, an oxide film 23B and an oxide semiconductor layer 23C are formed from the photoelectric conversion layer side. Here, in Embodiment 1, the oxide semiconductor layer 23C is in contact with the first electrode 21, the oxide semiconductor layer 23C and the oxide film 23B are in contact with each other, and the oxide film 23B is in contact with the photoelectric conversion layer 23A.

The stacked image pickup element of Embodiment 1 includes at least one image pickup element 10 of Embodiment 1. Additionally, the solid image pickup apparatus of Embodiment 1 includes a plurality of the stacked image pickup elements 10 of Embodiment 1. For example, the solid image pickup apparatus of Embodiment 1 is included in a digital still camera, a video camera, a cam coder, a security camera, a vehicle mounted camera (in-vehicle camera), a smartphone camera, a gaming user interface camera, or a biometric authentication camera, or the like.

The oxide semiconductor layer 23C includes a region that is in contact with the first electrode 21, a region that is in contact with an insulating layer 82 and below which the charge storage electrode 24 is not present, and a region that is in contact with the insulating layer 82 and below which the charge storage electrode 24 is present. In addition, light is incident from the second electrode 22. A photoelectric conversion layer-side surface of the oxide semiconductor layer 23C has a surface roughness Ra of 1.5 nm or less and a root mean square roughness Rq of 2.5 nm or less. Additionally, the oxide semiconductor layer 23C is amorphous and has a thickness of $1\times10^{-8}$ m to $1.5\times10^{-7}$ m.

Figure 45:
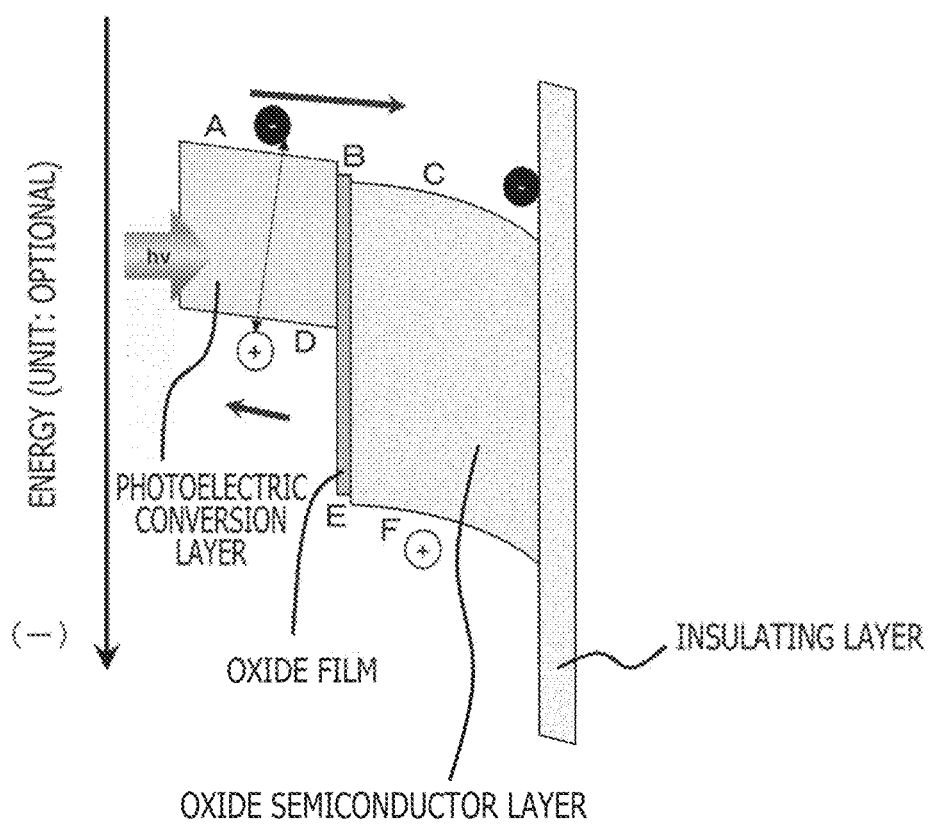
FIG. 45 is a diagram schematically depicting a relation of various energy values in a stacked structure of a photoelectric conversion layer, an oxide film, and an oxide semiconductor layer in the image pickup element and the stacked image pickup element of Embodiment 1.

At least some of oxide film constituent elements are different from elements included in the oxide semiconductor layer 23C. When an energy average value for a conductance band of the oxide semiconductor layer is denoted by $E_2$ and an energy average value for a conductance band of the oxide film is denoted by $E_1$, $E_1-E_2 \geq -0.4$ (eV) preferably $E_1-E_2 \geq 0$ (eV) more preferably $E_1-E_2 \geq 0.1$ (eV) and much more preferably $E_1-E_2 > 0.1$ (eV) are satisfied. Further, when an energy average value for a LUMO value for the photoelectric conversion layer is denoted by $E_0$, $E_0-E_1 \geq -0.4$ (eV) preferably $E_0-E_1 \geq 0$ (eV) more preferably $E_0-E_1 \geq 0.1$ (eV) and much more preferably $E_0-E_1 > 0.1$ (eV) are satisfied. Further, preferably $E_0 \geq E_1 \geq E_2$ is satisfied. FIG. 45 schematically depicts a relation of various energy values for the stacked structure of the photoelectric conversion layer 23A, the oxide film 23B, and the oxide semiconductor layer 23C.

The oxide film constituent material includes a metal oxide, and the oxide film 23B has a thickness equal to or larger than one atomic layer and equal to or smaller than $1\times10^{-7}$ m. Specifically, the oxide film 23B includes, for example, a metal oxide such as $TiO_2$ having a thickness of 10 nm, and the oxide semiconductor layer 23C includes, for example, IGZO having a thickness of 50 nm. Additionally, the photoelectric conversion layer 23A includes, for example, an organic semiconductor material (organic photoelectric conversion material) including C60. Table 1 below indicates the energy average value $E_2$ for the conductance band of the oxide semiconductor layer, an energy average value $E_5$ for a valence band of the oxide semiconductor layer, the energy average value $E_1$ for the conductance band of the oxide film, an energy average value $E_4$ for a valence band of the oxide film, the energy average value $E_0$ for the LUMO value for the photoelectric conversion layer, and an energy average value $E_3$ for an EUMO value for the photoelectric conversion layer. Charge generated in the photoelectric conversion layer 23A migrates to the first electrode 21 via the oxide film 23B and the oxide semiconductor layer 23C. The charge includes electrons. The oxide semiconductor layer constituent material has a mobility of 10 $cm^2/Vs$ or more, and the oxide semiconductor layer 23C has a carrier concentration of less than $1\times10^{16}/cm^3$. Note that the oxide film 23B may have a single layer structure with a layer including a metal oxide or a stacked structure with a plurality of stacked layers each including a metal oxide.

TABLE 1

| | |
|---|---|
| $E_2$: | −4.7 eV |
| $E_1$: | −4.5 eV |
| $E_0$: | −4.4 eV |
| $E_5$: | −7.7 eV |
| $E_4$: | −7.6 eV |
| $E_3$: | −6.2 eV |

Figure 46A:
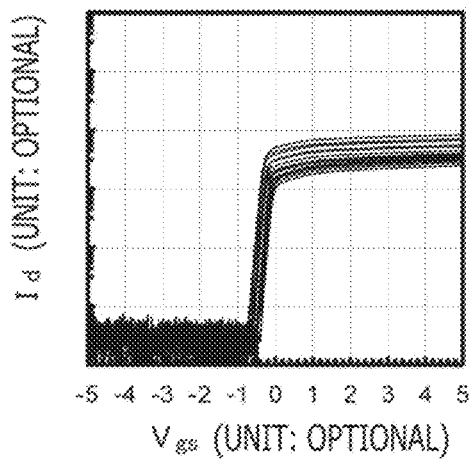
FIGS. 46A and 46B are diagrams depicting results of examination of effects of formation of the oxide film on the oxide semiconductor layer.
Figure 46B:
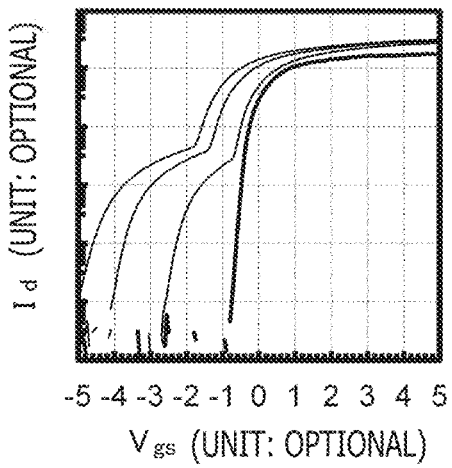

The effect of formation of the oxide film 23B on the oxide semiconductor layer 23C was examined. Specifically, a channel formation region of a TFT was configured from the stacked structure of the oxide semiconductor layer and the oxide film, and a relation between $V_{gs}$ and Id was determined. Results are indicated in FIG. 46A. Additionally, as a comparative example, FIG. 46B depicts a graph indicating the relation between $V_{gs}$ and Id for a TFT including a channel formation region including only the oxide semiconductor layer. FIGS. 46A and 46B indicate that the characteristic is more stabilized when the channel formation region includes the stacked structure of the oxide semiconductor layer and the oxide film.

In the image pickup element of Embodiment 1, the photoelectric conversion section includes the photoelectric conversion layer, the oxide film, and the oxide semiconductor layer disposed from the second electrode side, that is, the oxide film is formed on the oxide semiconductor layer. Thus, the oxygen deficiency is unlikely to occur on the front surface (photoelectric conversion layer-side surface) of the oxide semiconductor layer or in the vicinity of the front surface. In general, the front surface of the oxide semiconductor layer is unstable. However, termination with the oxide film as described above allows energy to be stabilized and enables a reduction in the oxygen deficiency on the front surface of the oxide semiconductor layer. Consequently, traps and carriers in the oxide semiconductor layer can be reduced, and thus, a variation in characteristic (for example, a variation in characteristic evaluated using a threshold voltage) of the oxide semiconductor layer is unlikely to occur, allowing the characteristics of charge storage and charge transfer efficiency to be improved. Additionally, possible problems such as a degraded charge transfer characteristic and degraded quality of captured images can be reliably prevented. Further, since the oxide semiconductor layer is provided, for example, recoupling during charge storage can be prevented, and the efficiency of charge transfer, to the first electrode, of charge stored in the photoelectric conversion layer can further be increased. Moreover, charge generated in the photoelectric conversion layer is temporarily held to allow control of a timing for transfer and the like and suppression of generation of a dark current.

Figure 47A:
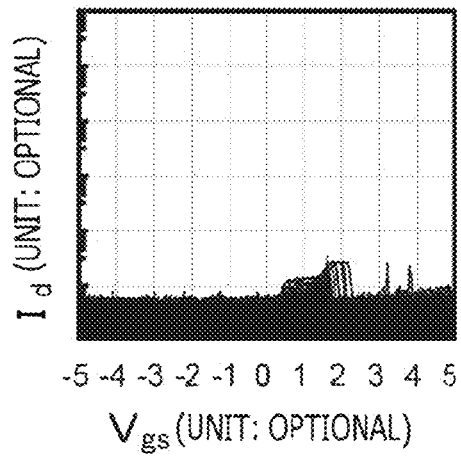
FIG. 47A and FIG. 47B are diagrams depicting a conceptual diagram including results of examination of effects in a case where hydrogen termination does not occur after the oxide film is formed on the oxide semiconductor layer, and a cross section for the examination of the effects.
Figure 47C:
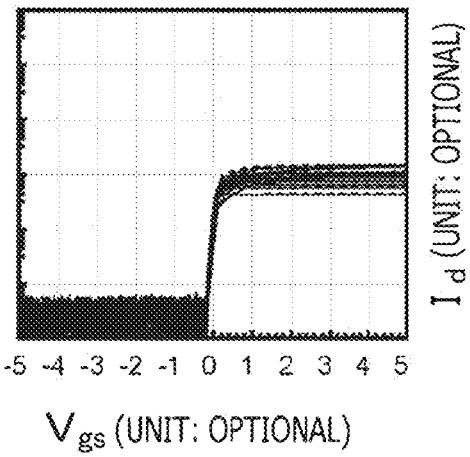
FIG. 47C and FIG. 47D are diagrams depicting a conceptual diagram including results of examination of effects in a case where hydrogen termination occurs after the oxide film is formed on the oxide semiconductor layer, and a cross section for the examination of the effects.
Figure 47B:
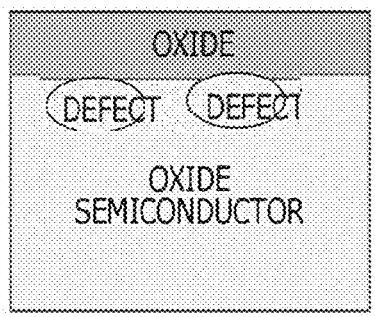
Figure 47D:
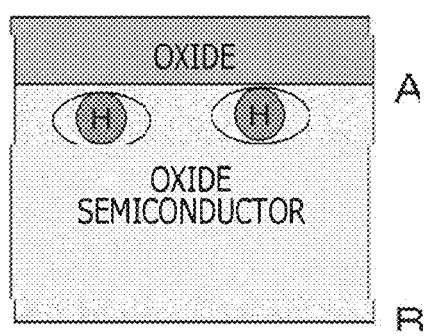
Figure 47D:
Figure 48:
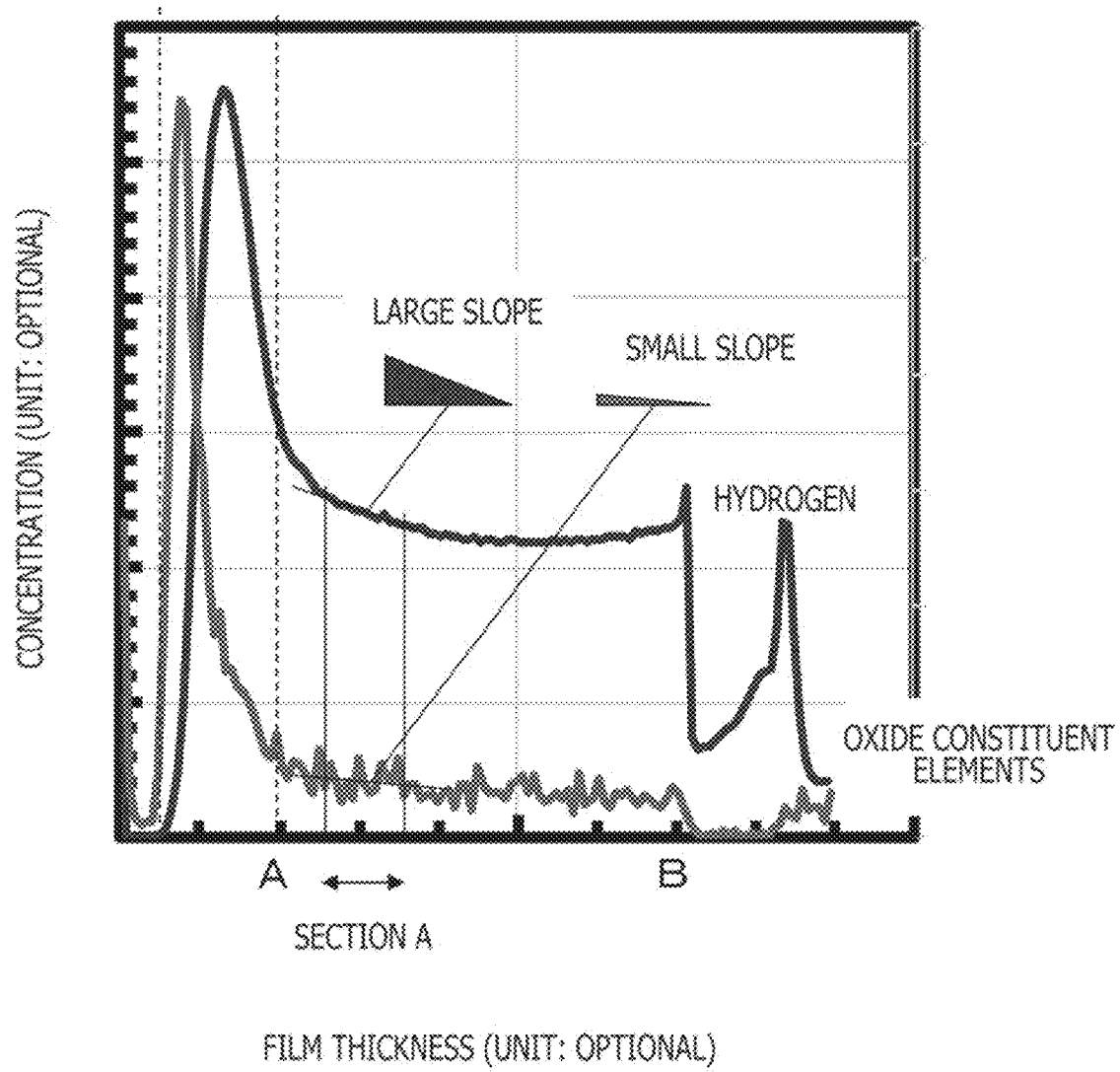
FIG. 48 is a diagram depicting an example of SIMS analysis results for the oxide film and the oxide semiconductor layer depicted in FIG. 47C.
Figure 49A:
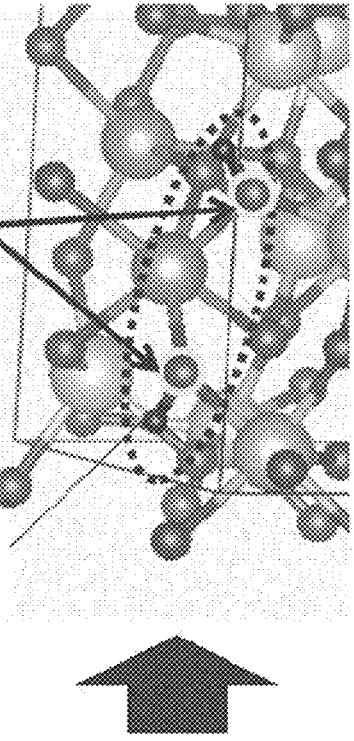
FIG. 49B is a diagram depicting results of prediction, based on the first-principle calculation, of a state resulting from addition of hydrogen to a state depicted in FIG. 49A.
Figure 49B:
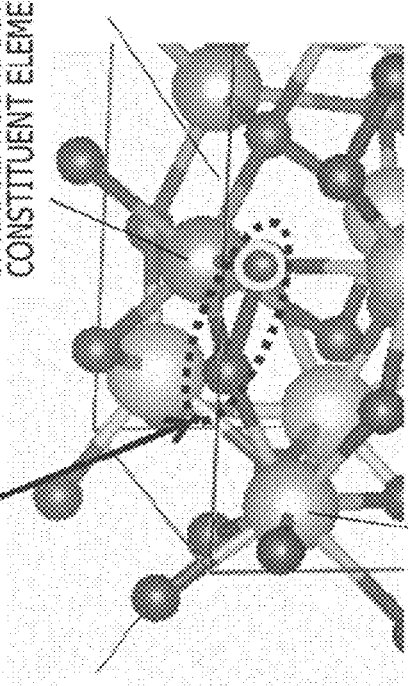

Incidentally, in the oxide semiconductor layer 23C, a defective site such as excess oxygen or an oxygen deficiency may remain in some cases. In such a case, termination of the defective site using hydrogen allows reduction or disabling of a defect level attributed to the defective site. The oxide film 23B was formed on the oxide semiconductor layer 23C, and the effect of hydrogen termination was examined. Specifically, FIG. 47A indicates the results obtained by configuring the channel formation region of the TFT with the stacked structure of the oxide semiconductor layer 23C and the oxide film 23B and examining the relation between $V_{gs}$ and Id before hydrogen termination, and (FIG. 47B depicts a conceptual diagram of a cross section. Additionally, FIG. 47C indicates the results of examination of the relation between $V_{gs}$ and Id after hydrogen termination, and FIG. 47D depicts a conceptual diagram of a cross section. The figures indicate that the hydrogen termination causes the stacked structure of the oxide semiconductor layer 23C and the oxide film 23B to function as a channel layer. In FIGS. 47B and 47D, the "oxide" indicates the oxide film 23B, and the "oxide semiconductor" indicates the oxide semiconductor layer 23C. FIG. 48 depicts an example of SIMS analysis results for the oxide film 23B and the oxide semiconductor layer 23C depicted in FIG. 47C. Note that portions depicted by "A" and "B" in FIG. 47D correspond to portions depicted by "A" and "B" in FIG. 48. In FIG. 47D and FIG. 48, the portion depicted by "A" corresponds to an interface between the oxide semiconductor layer 23C and the oxide film 23B. This example indicates that, from the oxide semiconductor layer 23C toward the oxide film 23B, the concentration of atoms (specifically, Ti) included in the oxide film increases rapidly but that the concentration of hydrogen atoms increases more rapidly than the concentration of the atoms included in the oxide film. In other words, the figures indicate that the concentration of hydrogen atoms increases in a portion of the oxide semiconductor layer 23C near the interface between the oxide semiconductor layer and the oxide film 23B. FIG. 49A indicates the results of prediction, as an example of a defective site, of an interface between the oxide semiconductor layer 23C and the oxide film 23B where excess oxygen is present, on the basis of a first-principle calculation. Additionally, FIG. 49A indicates the results of prediction of a state resulting from addition of hydrogen to the state depicted in FIG. 49A, on the basis of a first-principle calculation, and also indicates that the hydrogen atoms bond to the excess oxygen atoms to allow a stable system to be obtained.

In other words, the average value $Conc_{H-1}$ of the concentration of hydrogen atoms in the portion of the oxide semiconductor layer 23C near the interface between the oxide film 23B and the oxide semiconductor layer 23C is higher than the average value $Conc_{H-2}$ of the concentration of hydrogen atoms in the central portion along the thickness direction of the oxide semiconductor layer 23C. Specifically, $Conc_{H-1}/Conc_{H-2} \geq 1.1$ is preferably satisfied. Additionally or alternatively, assuming that $Conc_{H-1}$ is the value of the concentration of hydrogen atoms in the portion of the oxide semiconductor layer 23C near the interface between the oxide film 23B and the oxide semiconductor layer 23C and that $Conc_{M-1}$ is the value of the concentration of the atoms included in the oxide film 23B and disposed in the portion of the oxide semiconductor layer 23C near the interface between the oxide film 23B and the oxide semiconductor layer 23C, the average change rate $\Delta Conc_{H-1}$ of $Conc_{H-1}$ toward the central portion along the thickness direction of the oxide semiconductor layer 23C is higher than the average change rate $\Delta Conc_{M-1}$ of $Conc_{M-1}$ toward the central portion along the thickness direction of the oxide semiconductor layer 23C as depicted in FIG. 48. Note that, in FIG. 48, the portion of the oxide semiconductor layer near the interface between the oxide film and the oxide semiconductor layer is indicated as a "section A."

The oxide film 23B may include a tunnel oxide film. Here, the tunnel oxide film may include at least one type of material selected from the group including $SiO_x$, SiON, SiOC, and $AlO_y$. Note that the tunnel oxide film may have a single layer structure of a layer including at least one type of these materials or a stacked structure of a plurality of stacked layers including a plurality of materials included in these materials. The thickness of the tunnel oxide film is preferably equal to or larger than one atomic layer and equal to or smaller than $5 \times 10^{-9}$ m. In a case where the oxide film was configured from such a tunnel oxide film, excellent effects similar to the effects described above were also successfully obtained.

Alternatively, the oxide film 23B can have a stacked structure of a film including a metal oxide and a tunnel oxide film. In this case, the oxide film 23B can be configured such that the metal oxide includes at least one type of element selected from the group including tantalum, titanium, vanadium, niobium, tungsten, zirconium, hafnium, scandium, yttrium, lanthanum, gallium, and magnesium, and further, such that the thickness of the film including the metal oxide is equal to or larger than one atomic layer and equal to or smaller than $1 \times 10^{-7}$ m. Further, in these cases, the configuration may be arranged such that the tunnel oxide film includes at least one type of material selected from the group including $SiO_x$, SiON, SiOC, and $AlO_y$, and further, such that, in these cases, the thickness of the film including the metal oxide is equal to or larger than one atomic layer and equal to or smaller than $5 \times 10^{-9}$ m. Specifically, for example, the oxide film 23B may have a stacked structure of a film including a metal oxide with a thickness of 10 nm (more specifically, for example, a $TiO_2$ film located on the photoelectric conversion layer 23A side) and a tunnel oxide film with a thickness of 0.5 nm (more specifically, for example, an $SiO_2$ film located on the oxide semiconductor layer 23C side). In a case where the oxide film with such a structure was used, effects similar to the effects described above were also successfully obtained.

Additionally, in a case where the charge includes holes, assuming that $E_4$ is the energy average value for the valence band of the oxide film and that $E_3$ is the energy average value for the HOMO value for the photoelectric conversion layer, $E_3-E_4 \geq -0.4$ (eV) preferably $E_3-E_4 \geq 0$ (eV) more preferably $E_3-E_4 \geq 0.1$ (eV) and much more preferably $E_3-E_4 > 0.1$ (eV) is preferably satisfied. Further, in this case, assuming that $E_5$ is the energy average value for the valence band of the oxide semiconductor layer, $E_4-E_5 \geq -0.4$ (eV) preferably $E_4-E_5 \geq 0$ (eV) more preferably $E_4-E_5 \geq 0.1$ (eV) and much more preferably $E_4-E_5 > 0.1$ (eV) is preferably satisfied, and in addition, $E_3 \geq E_4 \geq E_5$ is further more preferably satisfied.

The image pickup element of the present disclosure, the stacked image pickup element of the present disclosure, and the solid image pickup apparatus according to the second aspect of the present disclosure in general will be described below, and the image pickup element and the solid image pickup apparatus in Embodiment 1 will then be described in detail. In the description below, a case will be described in which the potential applied to the first electrode is higher than the potential applied to the second electrode. However, in a case where the potential applied to the first electrode is lower than the potential applied to the second electrode, it is sufficient to reverse the magnitude relation between the potentials applied to the various electrodes. Table 2 below indicates the signs of potentials applied to the various electrodes in the description below.

TABLE 2

|  | Charge storage period | Charge transfer period |
|---|---|---|
| First electrode | $V_{11}$ | $V_{12}$ |
| Second electrode | $V_{21}$ | $V_{22}$ |
| Charge storage electrode | $V_{31}$ | $V_{32}$ |
| Charge transfer control electrode | $V_{41}$ | $V_{42}$ |
| Transfer control electrode | $V_{51}$ | $V_{52}$ |
| Charge emission electrode | $V_{61}$ | $V_{62}$ |

In the image pickup element and the like of the present disclosure, the oxide semiconductor layer preferably has a light transmittance of 65% or more with respect to light with a wavelength of 400 to 660 nm. Additionally, the charge storage electrode preferably has a light transmittance of 65% or more with respect to light with a wavelength of 400 to 660 nm. The charge storage electrode preferably has a sheet resistance value of $3 \times 10\Omega/\square$ to $1 \times 10^3 \Omega/\square$.

The image pickup element and the like of the present disclosure further include a semiconductor substrate, and the photoelectric conversion section may be disposed above the semiconductor substrate. Note that the first electrode, the charge storage electrode, the second electrode, and the various electrodes are connected to a drive circuit described below.

The second electrode located on the light incidence side may be shared by a plurality of image pickup elements. In other words, the second electrode may be what is called a solid electrode except in the case of an image pickup element and the like including an upper charge transfer control electrode according to the present disclosure described below. The photoelectric conversion layer may be shared by a plurality of image pickup elements, in other words, one photoelectric conversion layer may be formed for a plurality of image pickup elements, or the photoelectric conversion layer may be provided for each image pickup element. The oxide semiconductor layer is preferably provided for each image pickup element but may possibly be shared by a plurality of image pickup elements. In other words, for example, the charge transfer control electrode described below may be provided between image pickup elements to form one oxide semiconductor layer shared by the plurality of image pickup elements. In a case where one oxide semiconductor layer shared by a plurality of image pickup elements is formed, ends of the oxide semiconductor layer are desirably covered at least with the photoelectric conversion layer in terms of protection of the ends of the oxide semiconductor layer.

Further, the image pickup element and the like including the above-described various preferred configurations and arrangements can be configured such that the first electrode extends through an opening provided in the insulating layer and is connected to the oxide semiconductor layer. Alternatively, the configuration may be arranged such that the oxide semiconductor layer extends through an opening provided in the insulating layer and is connected to the first electrode. In this case, the configuration may be arranged such that edges of a top surface of the first electrode are covered with an insulating layer, the first electrode is exposed on a bottom surface of the opening, and assuming that a surface of the insulating layer in contact with the top surface of the first electrode is a first surface and that a surface of the insulating layer in contact with a portion of the oxide semiconductor layer facing the charge storage electrode is a second surface, a side surface of the opening includes a slope flaring from the first surface to the second surface, and further, the side surface of the opening including the slope flaring from the first surface to the second surface is located on the charge storage electrode side.

Further, the image pickup element and the like including the above-described various preferred configurations and arrangements can be configured such that the image pickup element and the like further include a control section provided in the semiconductor substrate and including a drive circuit, the first electrode and the charge storage electrode are connected to the drive circuit, during a charge storage period, the drive circuit applies a potential $V_{11}$ to the first electrode, applies a potential $V_{31}$ to the charge storage electrode, and stores charge in the oxide semiconductor layer (or the oxide semiconductor layer and the photoelectric conversion layer, or the oxide semiconductor layer, the oxide film, and the photoelectric conversion layer), and during a charge transfer period, the drive circuit applies a potential $V_{12}$ to the first electrode, applies a potential $V_{32}$ to the charge storage electrode, and reads out the charge stored in the oxide semiconductor layer (or the oxide semiconductor layer and the photoelectric conversion layer), to the control section via the first electrode. However, the first electrode has a higher potential than the second electrode, and $V_{31} \geq V_{11}$ and $V_{32} < V_{12}$ are satisfied. Note that the oxide semiconductor layer, or the oxide semiconductor layer and the photoelectric conversion layer, or the oxide semiconductor layer, the oxide film, and the photoelectric conversion layer may be collectively referred to as the "oxide semiconductor layer and the like" as described above.

Further, the image pickup element and the like including the above-described various preferred configurations and arrangements can be configured such that the charge transfer control electrode is formed in a region facing a region of the photoelectric conversion layer across the insulating layer, the region of the photoelectric conversion layer being located between adjacent image pickup elements. Note that such a configuration may be referred to as an "image pickup element and the like including a lower charge transfer control electrode according to the present disclosure" for convenience. Alternatively, the configuration may be arranged such that, instead of the second electrode, the charge transfer control electrode is formed on the photoelectric conversion layer located between the adjacent image pickup elements. Note that such a configuration may be referred to as an "image pickup element and the like including an upper charge transfer control electrode according to the present disclosure" for convenience.

In the description below, the "region of the photoelectric conversion layer located between the adjacent image pickup elements" is referred to as an "region -A of the photoelectric conversion layer" for convenience, and the "region of the insulating layer located between the image pickup elements" is referred to as an "region -A of the insulating layer" for convenience. The region -A of the photoelectric conversion layer corresponds to the region -A of the insulating layer. Further, the "region between the adjacent image pickup elements" is referred to as an "region -a" for convenience.

In the image pickup element and the like including the lower charge transfer control electrode according to the present disclosure (downside charge transfer control electrode or charge transfer control electrode located opposite the light incidence side with reference to the photoelectric conversion layer), the lower charge transfer control electrode is formed in a region facing the region -A of the photoelectric conversion layer across the insulating layer. In other words, the lower charge transfer control electrode is formed below the portion of the insulating layer (region -A of the insulating layer) in the region (region -a) sandwiched between the charge storage electrodes included in each of the adjacent image pickup elements. The lower charge transfer control electrode is provided with a space from the charge storage electrode. Alternatively, in other words, the lower charge transfer control electrode is provided so as to surround the charge storage electrode with a space from the charge storage electrode and is disposed so as to face the region -A of the photoelectric conversion layer across the insulating layer.

The image pickup element and the like including the lower charge transfer control electrode according to the present disclosure can be configured such that the image pickup element and the like further include the control section provided in the semiconductor substrate and including the drive circuit, the first electrode, the second electrode, the charge storage electrode, and the lower charge transfer control electrode are connected to the drive circuit, during the charge storage period, the drive circuit applies the potential $V_{11}$ to the first electrode, applies the potential $V_{31}$ to the charge storage electrode, applies a potential $V_{41}$ to the lower charge transfer control electrode, and stores charge in the oxide semiconductor layer and the like, and during the charge transfer period, the drive circuit applies the potential $V_{12}$ to the first electrode, applies the potential $V_{32}$ to the charge storage electrode, applies a potential $V_{42}$ to the lower charge transfer control electrode, and reads out the charge stored in the oxide semiconductor layer and the like, to the control section via the first electrode. However, $V_{31} \geq V_{11}$, $V_{31} > V_{41}$, and $V_{12} > V_{32} > V_{42}$ are satisfied. The lower charge transfer control electrode may be formed at the same level as that at which the first electrode or the charge storage electrode is formed or at a level different from the level of the first electrode or the charge storage electrode.

In the image pickup element and the like including the upper charge transfer control electrode according to the present disclosure (upside charge transfer control electrode or charge transfer control electrode located on the light incidence side with reference to the photoelectric conversion layer), instead of the second electrode, the upper charge transfer control electrode is formed on a region of the photoelectric conversion layer located between adjacent image pickup elements and is spaced apart from the second electrode. In other words, [A] the configuration may be arranged such that the second electrode is provided for each image pickup element and that the upper charge transfer control electrode surrounds at least a part of the second electrode with a space from the second electrode and is provided on the region -A of the photoelectric conversion layer, or [B] the configuration may be arranged such that the second electrode is provided for each image pickup element, that the upper charge transfer control electrode surrounds at least a part of the second electrode with a space from the second electrode, and that a part of the charge storage electrode is present below the upper charge transfer control electrode, or [C] the configuration may be arranged such that the second electrode is provided for each image pickup element, that the upper charge transfer control electrode surrounds at least a part of the second electrode with a space from the second electrode, that a part of the charge storage electrode is present below the upper charge transfer control electrode, and that the lower charge transfer control electrode is further formed below the upper charge transfer control electrode. A potential generated by coupling between the upper charge transfer control electrode and the second electrode is applied to a region of the photoelectric conversion layer located below the region between the upper charge transfer control electrode and the second electrode.

Additionally, the image pickup element and the like including the upper charge transfer control electrode of the present disclosure can be configured such that the image pickup element and the like further include the control section provided in the semiconductor substrate and including the drive circuit, the first electrode, the second electrode, the charge storage electrode, and the upper charge transfer control electrode are connected to the drive circuit, during the charge storage period, the drive circuit applies a potential $V_{21}$ to the second electrode, applies the potential $V_{41}$ to the upper charge transfer control electrode, and stores charge in the oxide semiconductor layer, and during the charge transfer period, the drive circuit applies a potential $V_{22}$ to the second electrode, applies the potential $V_{42}$ to the upper charge transfer control electrode, and reads out the charge stored in the oxide semiconductor layer and the like, to the control section via the first electrode. However, $V_{21} \geq V_{41}$ and $V_{22} \geq V_{42}$ are satisfied. The upper charge transfer control electrode is formed at the same level as that at which the second electrode is formed.

Further, the image pickup element and the like including the above-described various preferred configurations and arrangements can further include a transfer control electrode (charge transfer electrode) disposed between the first electrode and the charge storage electrode with a space from the first electrode and the charge storage electrode and disposed to face the oxide semiconductor layer across the insulating layer. The image pickup element and the like of present disclosure thus configured may be referred to as an "image pickup element and the like including a transfer control electrode according to the present disclosure" for convenience.

The image pickup element and the like including the transfer control electrode according to the present disclosure can be configured such that the image pickup element and the like further include the control section provided in the semiconductor substrate and including the drive circuit, the first electrode, the charge storage electrode, and the transfer control electrode are connected to the drive circuit, during the charge storage period, the drive circuit applies the potential $V_{11}$ to the first electrode, applies the potential $V_{31}$ to the charge storage electrode, applies the potential $V_{51}$ to the transfer control electrode, and stores charge in the oxide semiconductor layer and the like, and during the charge transfer period, the drive circuit applies the potential $V_{12}$ to the first electrode, applies the potential $V_{32}$ to the charge storage electrode, applies the potential $V_{52}$ to the transfer control electrode, and reads out the charge stored in the oxide semiconductor layer and the like, to the control section via the first electrode. However, the first electrode has a higher potential than the second electrode, and $V_{31} > V_{51}$ and $V_{32} \leq V_{52} \leq V_{12}$ are satisfied.

Further, the image pickup element and the like of the present disclosure including the above-described preferred configurations and arrangements can further include a charge emission electrode connected to the oxide semiconductor layer and spaced apart from the first electrode and the charge storage electrode. The image pickup element and the like of the present disclosure thus configured may be referred to as an "image pickup element and the like including a charge emission electrode according to the present disclosure" for convenience. Further, the image pickup element and the like including the charge emission electrode according to the present disclosure can be configured such that the charge emission electrode is disposed so as to surround the first electrode and the charge storage electrode (that is, like a frame). The charge emission electrode can be shared (jointly used) by a plurality of image pickup elements. In this case, the configuration may be arranged such that the oxide semiconductor layer and the like extend through a second opening provided in the insulating layer and are connected to the charge emission electrode, edges of a top surface of the charge emission electrode are covered with an insulating layer, the charge emission electrode is exposed on a bottom surface of the second opening, and assuming that a surface of the insulating layer in contact with the top surface of the charge emission electrode is a third surface and that a surface of the insulating layer in contact with a portion of the oxide semiconductor layer facing the charge storage electrode is a second surface, a side surface of the second opening includes a slope flaring from the third surface to the second surface.

Further, the image pickup element and the like including the charge emission electrode according to the present disclosure can be configured such that the image pickup element and the like further include the control section provided in the semiconductor substrate and including the drive circuit, the first electrode, the charge storage electrode, and the charge emission electrode are connected to the drive circuit, during the charge storage period, the drive circuit applies the potential $V_{11}$ to the first electrode, applies the potential $V_{31}$ to the charge storage electrode, applies a potential $V_{61}$ to the charge emission electrode, and stores charge in the oxide semiconductor layer and the like, and during a charge transfer period, the drive circuit applies the potential $V_{12}$ to the first electrode, applies the potential $V_{32}$ to the charge storage electrode, applies a potential $V_{62}$ to the charge emission electrode, and reads out the charge stored in the oxide semiconductor layer and the like, to the control section via the first electrode. However, the first electrode has a higher potential than the second electrode, and $V_{61} > V_{11}$ and $V_{62} < V_{12}$ are satisfied.

Further, the above-described various preferred configurations and arrangements of the image pickup element or the like of the present disclosure can be configured such that the charge storage electrode includes a plurality of charge storage electrode segments. The image pickup element and the like of the present disclosure thus configured may be referred to as an "image pickup element and the like including a plurality of charge storage electrode segments according to the present disclosure" for convenience. It is sufficient that the number of the charge storage electrode segments is two or more. The image pickup element and the like including a plurality of charge storage electrode segments of the present disclosure can be configured such that, in a case where different potentials are applied to respective N charge storage electrode segments, in a case where the first electrode has a higher potential than the second electrode, the potential applied during the charge transfer period to the charge storage electrode segment located closest to the first electrode (first photoelectric conversion section segment) is higher than the potential applied during the charge transfer period to the charge storage electrode segment located farthest from the first electrode (N-th photoelectric conversion section segment), and in a case where the first electrode has a lower potential than the second electrode, the potential applied during the charge transfer period to the charge storage electrode segment located closest to the first electrode (first photoelectric conversion section segment) is lower than the potential applied during the charge transfer period to the charge storage electrode segment located farthest from the first electrode (N-th photoelectric conversion section segment).

The image pickup element and the like including the above-described various preferred configurations and arrangements can be configured such that the semiconductor substrate is provided with at least a floating diffusion layer and an amplifying transistor included in the control section, and the first electrode is connected to the floating diffusion layer and a gate section of the amplifying transistor. In this case, the image pickup element and the like can further be configured such that the semiconductor substrate is further provided with a reset transistor and a selection transistor included in the control section, the floating diffusion layer is connected to one of source/drain regions of the reset transistor, and one of source/drain regions of the amplifying transistor is connected to one of source/drain regions of the selection transistor, and the other source/drain region of the selection transistor is connected to a signal line.

Further, the image pickup element and the like including the above-described various preferred configurations and arrangements can be configured such that the charge storage electrode is larger in size than the first electrode. Assuming that an area of the charge storage electrode is $s_1'$ and that an area of the first electrode is $s_1$, $4 \leq s_1'/s_1$ is preferably satisfied, but it is not limited thereto.

Alternatively, modified examples of the image pickup element and the like including the above-described various preferred configurations and arrangements may include image pickup elements of the first to sixth configurations described below. In other words, in the image pickup elements of the first to sixth configurations including the above-described various preferred configurations and arrangements, the photoelectric conversion section includes N (N≥2) photoelectric conversion section segments, the oxide semiconductor layer and the like include N photoelectric conversion layer segments, the insulating layer includes N insulating layer segments, in the image pickup elements of the first to third configurations, the charge storage electrode includes N charge storage electrode segments, in the image pickup elements of the fourth and fifth configurations, the charge storage electrode includes N charge storage electrode segments spaced apart from one another, an n-th (n=1, 2, 3, . . . N) photoelectric conversion section segment includes an n-th charge storage electrode segment, an n-th insulating layer segment, and an n-th photoelectric conversion layer segment, and the photoelectric conversion section segment with a larger n value is located farther from the first electrode. Here, the "photoelectric conversion layer segment" refers to a segment including the photoelectric conversion layer, the oxide film, and the oxide semiconductor layer stacked on one another.

In the image pickup element of the first configuration, the insulating layer segments have a thickness varying gradually from a first photoelectric conversion section segment to an N-th photoelectric conversion section segment. Additionally, in the image pickup element of the second configuration, the photoelectric conversion section segments have a thickness varying gradually from the first photoelectric conversion section segment to the N-th photoelectric conversion section segment. Note that, in the photoelectric conversion layer segment, the thickness of the photoelectric conversion layer segment may be varied by varying the thickness of the portion of the photoelectric conversion layer, with the thickness of the portion of the oxide semiconductor layer constant, or the thickness of the photoelectric conversion layer segment may be varied by varying the thickness of the portion of the oxide semiconductor layer, with the thickness of the portion of the photoelectric conversion layer constant. Alternatively, the thickness of the photoelectric conversion layer segment may be varied by varying the thickness of the portion of the photoelectric conversion layer and the thickness of the portion of the oxide semiconductor layer. Further, in the image pickup element of the third configuration, the material included in the insulating layer segment differs between the adjacent photoelectric conversion section segments. Additionally, in the image pickup element of the fourth configuration, the material included in the charge storage electrode segment differs between the adjacent photoelectric conversion section segments. Further, in the image pickup element of the fifth configuration, the charge storage electrode segments have an area decreasing gradually from the first photoelectric conversion section segment to the N-th photoelectric conversion section segment. The area may decrease continuously or in a step-by-step manner.

Alternatively, in the image pickup element of the sixth configuration in the image pickup element and the like including the above-described various configurations and arrangements, assuming that a stacking direction of the charge storage electrode, the insulating layer, the oxide semiconductor layer, and the photoelectric conversion layer is a Z direction and that a direction away from the first electrode is an X direction, a cross-sectional area of a stacked portion taken along a YZ virtual plane varies depending on a distance from the first electrode, the stacked portion including the charge storage electrode, the insulating layer, the oxide semiconductor layer, the oxide film, and the photoelectric conversion layer stacked on one another. The cross-sectional area may vary continuously or in a step-by-step manner.

In the image pickup elements of the first and second configurations, the N photoelectric conversion layer segments are consecutively provided, the N insulating layer segments are also consecutively provided, and the N charge storage electrode segments are also consecutively provided. In the image pickup elements of the third to fifth configurations, the N photoelectric conversion layer segments are consecutively provided. Additionally, in the image pickup elements of the fourth and fifth configurations, the N insulating layer segments are consecutively provided, whereas in the image pickup element of the third configuration, the N insulating layer segments are provided so as to correspond to the respective photoelectric conversion section segments. Further, in the image pickup elements of the fourth and fifth configurations, in some cases, in the image pickup element of the third configuration, the N charge storage electrode segments are provided so as to correspond to the respective photoelectric conversion section segments. In the image pickup elements of the first to sixth configurations, the same potential is applied to all of the charge storage electrode segments. Alternatively, in the image pickup elements of the fourth and fifth configurations, in some cases, in the image pickup element of the third configuration, different potentials may possibly be applied to the respective N charge storage electrode segments.

In the image pickup element and the like of the present disclosure including the image pickup elements of the first to sixth configurations, the insulating layer segments have a specified thickness, the photoelectric conversion layer segments have a specified thickness, the insulating layer segments include different materials, the charge storage electrode segments include different materials, the charge storage electrode segments have a specified area, or the stacked portion has a specified cross-sectional area, and thus, a type of charge transfer gradient is formed, allowing charge generated by photoelectric conversion to be more easily and reliably transferred to the first electrode. As a result, a possible afterimage and a possible unfinished charge transfer can be prevented.

In the image pickup elements of the first to fifth configurations, the photoelectric conversion section segment with a larger n value is located farther from the first electrode, and whether or not the photoelectric conversion section segment is located away from the first electrode is determined with reference to the X direction. Additionally, in the image pickup element of the sixth configuration, the direction away from the first electrode is the X direction, and the "X direction" is defined as follows. Specifically, a pixel region in which a plurality of image pickup elements or a plurality of stacked image pickup elements is arranged includes a plurality of pixels arranged in a two-dimensional array, in other words, arranged regularly in the X direction and the Y direction. In a case where the pixel has a rectangular planar shape, a direction in which a side of the rectangle closest to the first electrode extends is the Y direction, and a direction orthogonal to the Y direction is the X direction. Alternatively, in a case where the pixel has an optional planar shape, a general direction including a segment or a curve closest to the first electrode is the Y direction, and a direction orthogonal to the Y direction is the X direction.

In regard to the image pickup elements of the first to sixth configurations, a case will be described in which the first electrode has a higher potential than the second electrode. However, in a case where the first electrode has a lower potential than the second electrode, it is sufficient to reverse the magnitude relation between the potentials.

In the image pickup element of the first configuration, the insulating layer segments have a thickness varying gradually from the first photoelectric conversion section segment to the N-th photoelectric conversion section segment, and the thickness of the insulating layer segment preferably gradually increases, thereby forming a type of charge transfer gradient. During the charge storage period, when such a state as $V_{31} \geq V_{11}$ is established, an n-th photoelectric conversion section segment can store more charge than an (n+1)-th photoelectric conversion section segment, and a strong electric field is applied to allow reliable prevention of a flow of charge from the first photoelectric conversion section segment to the first electrode. Additionally, during the charge transfer period, when such a state as $V_{32} < V_{12}$ is established, flows of charge can be reliably provided including a flow of charge from the first photoelectric conversion section segment to the first electrode and a flow of charge from the (n+1)-th photoelectric conversion section segment to the n-th photoelectric conversion section segment.

In the image pickup element of the second configuration, the photoelectric conversion layer segments have a thickness varying gradually from the first photoelectric conversion section segment to the N-th photoelectric conversion section segment, and the thickness of the photoelectric conversion layer segment preferably gradually increases, thereby forming a type of charge transfer gradient. During the charge storage period, when such a state as $V_{31} \geq V_{11}$ is established, a stronger electric field is applied to the n-th photoelectric conversion section segment than to the (n+1)-th photoelectric conversion section segment, allowing reliable prevention of a flow of charge from the first photoelectric conversion section segment to the first electrode. Additionally, during the charge transfer period, when such a state as $V_{32} < V_{12}$ is established, flows of charge can be reliably provided including a flow of charge from the first photoelectric conversion section segment to the first electrode and a flow of charge from the (n+1)-th photoelectric conversion section segment to the n-th photoelectric conversion section segment.

In the image pickup element of the third configuration, the adjacent photoelectric conversion section segments include different materials included in the insulating layer segment to form a type of charge transfer gradient, and the materials included in the insulating layer segments preferably have a relative permittivity value decreasing gradually from the first photoelectric conversion section segment to the N-th photoelectric conversion section segment. Adoption of such a configuration allows the n-th photoelectric conversion section segment to store more charge than the (n+1)-th photoelectric conversion section segment when such a state as $V_{31} \geq V_{11}$ is established during the charge storage period. Additionally, during the charge transfer period, when such a state as $V_{32} < V_{12}$ is established, flows of charge can be reliably provided including a flow of charge from the first photoelectric conversion section segment to the first electrode and a flow of charge from the (n+1)-th photoelectric conversion section segment to the n-th photoelectric conversion section segment.

In the image pickup element of the fourth configuration, the material included in the charge storage electrode segment differs between the adjacent photoelectric conversion section segments to form a type of charge transfer gradient, and the materials included in the insulating layer segments preferably have a work function value increasing gradually from the first photoelectric conversion section segment to the N-th photoelectric conversion section segment. Adoption of such a configuration allows a potential gradient advantageous for signal charge transfer without depending on the positive and negative signs of the voltage (potential).

In the image pickup element of the fifth configuration, the charge storage electrode segment has an area decreasing gradually from the first photoelectric conversion section segment to the N-th photoelectric conversion section segment, thus forming a type of charge transfer gradient. Thus, when such a state as $V_{31} \geq V_{11}$ is established during the charge storage period, the n-th photoelectric conversion section segment can store more charge than the (n+1)-th photoelectric conversion section segment. Additionally, during the charge transfer period, when such a state as $V_{32} < V_{12}$ is established, flows of charge can be reliably provided including a flow of charge from the first photoelectric conversion section segment to the first electrode and a flow of charge from the (n+1)-th photoelectric conversion section segment to the n-th photoelectric conversion section segment.

In the image pickup element of the sixth configuration, the stacked portion has a cross-sectional area varying depending on the distance from the first electrode, thus forming a type of charge transfer gradient. Specifically, in a case where a configuration is adopted in which the stacked portion has a constant cross-sectional thickness and a cross-sectional width decreasing as distance from the first electrode increases, when such a state as $V_{31} \geq V_{11}$ is established during the charge storage period, a region closer to the first electrode can store more charge than a region farther from the first electrode, similarly to the image pickup element of the fifth configuration. Consequently, during the charge transfer period, when such a state as $V_{32}<V_{12}$ is established, flows of charge can be reliably provided including a flow of charge from the region closer to the first electrode to the first electrode and a flow of charge from the farther region to the closer region. On the other hand, in a case where a configuration is adopted in which the stacked portion has a constant cross-sectional width and a cross-sectional thickness, namely, the thickness of the insulating layer segments, that is gradually increasing, when such a state as $V_{31} \geq V_{11}$ is established during the charge storage period, the region closer to the first electrode can store more charge than the region farther from the first electrode, and a stronger electric field is applied to the closer region than to the farther region, allowing reliable prevention of a flow of charge from the region closer to the first electrode to the first electrode, similarly to the image pickup element of the first configuration. During the charge transfer period, when such a state as $V_{32}<V_{12}$ is established, flows of charge can be reliably provided including a flow of charge from the region closer to the first electrode to the first electrode and a flow of charge from the farther region to the closer region. Additionally, in a case where a configuration is adopted in which the photoelectric conversion layer segments have a gradually increasing thickness, when such a state as $V_{31} \geq V_{11}$ is established during the charge storage period, a stronger electric field is applied to the region closer to the first electrode than to the region farther from the first electrode, allowing reliable prevention of a flow of charge from the region closer to the first electrode to the first electrode, similarly to the image pickup element of the second configuration. During the charge transfer period, when such a state as $V_{32}<V_{12}$ is established, flows of charge can be reliably provided including a flow of charge from the region closer to the first electrode to the first electrode and a flow of charge from the farther region to the closer region.

Two or more types of the image pickup elements of the first to sixth configurations including the above-described preferred configurations and arrangements can be combined together as appropriate as desired.

A modified example of the solid image pickup apparatuses according to the first and second aspects of the present disclosure can be a solid image pickup apparatus including a plurality of image pickup elements of the first to sixth configurations, in which the plurality of image pickup elements is included in an image pickup element block, and the first electrode is shared by the plurality of image pickup elements included in the image pickup element block. The solid image pickup apparatus thus configured is referred to as a "solid image pickup apparatus of a first configuration" for convenience. Alternatively, a modified example of the solid image pickup apparatuses according to the first and second aspects of the present disclosure can be a solid image pickup apparatus including a plurality of image pickup elements of the first to sixth configurations or a plurality of stacked image pickup elements including at least one of the image pickup elements of the first to sixth configurations, in which the plurality of image pickup elements or the plurality of stacked image pickup elements is included in an image pickup element block, and the first electrode is shared by the plurality of image pickup elements or the plurality of stacked image pickup elements included in the image pickup element block. The solid image pickup apparatus thus configured is referred to as a "solid image pickup apparatus of a second configuration" for convenience. In a case where the first electrode is thus shared by the plurality of image pickup elements included in the image pickup element block, the configuration and structure in the pixel region in which a plurality of image pickup elements is arranged can be simplified and miniaturized.

In the solid image pickup apparatuses of the first and second configurations, one floating diffusion layer is provided for a plurality of image pickup elements (one image pickup element block). Here, the plurality of image pickup elements provided for the one floating diffusion layer may include a plurality of image pickup elements of a first type described below or may include at least one image pickup element of the first type and one or two or more image pickup elements of a second type described below. One floating diffusion layer can be shared by a plurality of image pickup elements by appropriately controlling timings for the charge transfer period. The plurality of image pickup elements is jointly operated and connected, as an image pickup element block, to the drive circuit described below. In other words, the plurality of image pickup elements included in the image pickup element block is connected to one drive circuit. However, the charge storage electrode is controlled for each image pickup element. Additionally, a plurality of image pickup elements can share one contact hole portion. An arrangement relation between the first electrode shared by the plurality of image pickup elements and the charge storage electrode of each image pickup element may be arranged such that the first electrode is disposed so as to be adjacent to the charge storage electrode of each image pickup element. Alternatively, the first electrode may be disposed so as to be adjacent to the charge storage electrodes of some of the plurality of image pickup elements and may not be disposed so as to be adjacent to the charge storage electrodes of the remaining ones of the plurality of image pickup elements. In this case, charge migrates from the remaining ones of the plurality of image pickup elements to the first electrode via some of the plurality of image pickup elements. A distance between the charge storage electrode included in the image pickup element and the charge storage electrode included in the image pickup element (referred to as a "distance A" for convenience) is preferably longer than a distance between the first electrode in the image pickup element adjacent to the first electrode and the charge storage electrode (referred to as a "distance B" for convenience) for allowing reliable migration of charge from each image pickup element to the first electrode. Additionally, the distance A preferably has a larger value for the image pickup elements located farther from the first electrode. Note that the above description can be applied not only to the solid image pickup apparatuses of the first and second configurations but also to the solid image pickup apparatuses according to the first and second aspects of the present disclosure.

Further, the image pickup element and the like including the above-described various preferred configurations and arrangements can be configured such that light is incident from the second electrode side and that a light shielding layer is formed on the light incidence side and closer to the second electrode. Alternatively, the image pickup element and the like can be configured such that light is incident from the second electrode side and is not incident on the first electrode (in some cases, the first electrode and the transfer control electrode). In this case, the image pickup element and the like can be configured such that the light shielding layer is formed on the light incidence side and closer to the second electrode and above the first electrode (in some cases, the first electrode and the transfer control electrode) or such that an on-chip microlens is provided above the charge storage electrode and the second electrode and light incident on the on-chip microlens is focused on the charge storage electrode. Here, the light shielding layer may be disposed above or on a light incidence side surface of the second electrode. The light shielding layer may possibly be formed in the second electrode. Examples of a material included in the light shielding layer include chromium (Cr), coper (Cu), aluminum (Al), tungsten (W), and a resin that does not transmit light (for example, a polyimide resin).

Specific examples of the image pickup element and the like of the present disclosure include an image pickup element that includes a photoelectric conversion layer or a photoelectric conversion section absorbing blue light (light ranging from 425 to 495 nm) (referred to as a "blue light photoelectric conversion layer of the first type" or a "blue light photoelectric conversion section of the first type" for convenience) and is sensitive to blue light (the image pickup element is referred to as a "blue light image pickup element of the first type" for convenience), an image pickup element that includes a photoelectric conversion layer or a photoelectric conversion section absorbing green light (light ranging from 495 to 570 nm) (referred to as a "green light photoelectric conversion layer of the first type" or a "green light photoelectric conversion section of the first type" for convenience) and is sensitive to green light (the image pickup element is referred to as a "green light image pickup element of the first type" for convenience), and an image pickup element that includes a photoelectric conversion layer or a photoelectric conversion section absorbing red light (light ranging from 620 to 750 nm) (referred to as a "red light photoelectric conversion layer of the first type" or a "red light photoelectric conversion section of the first type" for convenience) and is sensitive to red light (the image pickup element is referred to as a "red light image pickup element of the first type" for convenience). Additionally, a known image pickup element that includes no charge storage electrode and is sensitive to blue light is referred to as a "blue light image pickup element of the second type" for convenience, a known image pickup element that includes no charge storage electrode and is sensitive to green light is referred to as a "green light image pickup element of the second type" for convenience, a known image pickup element that includes no charge storage electrode and is sensitive to red light is referred to as a "red light image pickup element of the second type" for convenience, the photoelectric conversion layer or photoelectric conversion section included in the blue light image pickup element of the second type is referred to as a "blue light photoelectric conversion layer of the second type" or a "blue light photoelectric conversion section of the second type" for convenience, the photoelectric conversion layer or photoelectric conversion section included in the green light image pickup element of the second type is referred to as a "green light photoelectric conversion layer of the second type" or a "green light photoelectric conversion section of the second type" for convenience, and the photoelectric conversion layer or photoelectric conversion section included in the red light image pickup element of the second type is referred to as a "red light photoelectric conversion layer of the second type" or a "red light photoelectric conversion section of the second type" for convenience.

The stacked image pickup element of the present disclosure includes at least one image pickup element and the like (photoelectric conversion element) of the present disclosure. Specifically, the stacked image pickup element has, for example, [A] a configuration or structure in which the blue light photoelectric conversion section of the first type, the green light photoelectric conversion section of the first type, and the red light photoelectric conversion section of the first type are stacked in the vertical direction, and the control sections of the blue light image pickup element of the first type, the green light image pickup element of the first type, and the red light image pickup element of the first type are each provided on the semiconductor substrate, [B] a configuration or structure in which the blue light photoelectric conversion section of the first type and the green light photoelectric conversion section of the first type are stacked in the vertical direction, below the two layers of the light photoelectric conversion section of the first type, the red light photoelectric conversion section of the second type is disposed, and the control sections of the blue light image pickup element of the first type, the green light image pickup element of the first type, and the red light image pickup element of the second type are each provided on the semiconductor substrate, [C] a configuration or structure in which, below the green light photoelectric conversion section of the first type, the blue light photoelectric conversion section of the second type and the red light photoelectric conversion section of the second type are disposed, and the control sections of the green light image pickup element of the first type, the blue light image pickup element of the second type, and the red light image pickup element of the second type are each provided on the semiconductor substrate, or [D] a configuration or structure in which, below the blue light photoelectric conversion section of the first type, the green light photoelectric conversion section of the second type and the red light photoelectric conversion section of the second type are disposed, and the control sections of the blue light image pickup element of the first type, the green light image pickup element of the second type, and the red light image pickup element of the second type are each provided on the semiconductor substrate. The photoelectric conversion sections of the image pickup elements are preferably arranged in the vertical direction in order of the blue light photoelectric conversion section, the green light photoelectric conversion section, and the red light photoelectric conversion section from the light incidence direction or in order of the green light photoelectric conversion section, the blue light photoelectric conversion section, and the red light photoelectric conversion section from the light incidence direction. This is because light with a shorter wavelength is efficiently absorbed on the incident surface side. Red light has the longest wavelength among the three colors, and thus, the red light photoelectric conversion section is preferably located in the lowest layer as viewed from the light incidence surface. One pixel is configured from the stacked structure of these image pickup elements. Additionally, a near infrared light photoelectric conversion section (or infrared light photoelectric conversion section) of the first type may be provided. Here, preferably, the photoelectric conversion layer of the infrared light photoelectric conversion section of the first type includes, for example, an organic material and is disposed in the lowest layer of the stacked structure of the image pickup elements of the first type but above the image pickup element of the second type. Alternatively, a near infrared light photoelectric conversion section (or infrared light photoelectric conversion section) of the second type may be provided below the photoelectric conversion section of the first type.

In the image pickup element of the first type, for example, the first electrode is formed on an interlayer insulating layer provided on the semiconductor substrate. The image pickup element formed on the semiconductor substrate may be of a back-side illumination type or a front-side illumination type.

In a case where the photoelectric conversion layer includes an organic material, the photoelectric conversion layer can be configured according to any one of the following four aspects. (1) The photoelectric conversion layer includes a p-type organic semiconductor. (2) The photoelectric conversion layer includes an n-type organic semiconductor. (3) The photoelectric conversion layer includes a stacked structure of a p-type organic semiconductor layer/n-type organic semiconductor layer. The photoelectric conversion layer includes a stacked structure of a p-type organic semiconductor layer/a mixed layer of a p-type organic semiconductor and an n-type organic semiconductor (bulk hetero structure)/an n-type organic semiconductor layer. The photoelectric conversion layer includes a stacked structure of a p-type organic semiconductor layer/a mixed layer of a p-type organic semiconductor and an n-type organic semiconductor (bulk hetero structure). The photoelectric conversion layer includes a stacked structure of an n-type organic semiconductor layer/a mixed layer of a p-type organic semiconductor and an n-type organic semiconductor (bulk hetero structure). (4) The photoelectric conversion layer includes a mixture of a p-type organic semiconductor and an n-type organic semiconductor (bulk hetero structure). However, the order of stacking can be optionally changed.

Examples of the p-type organic semiconductor may include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triarylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex including a heterocyclic compound as a ligand, a polythiophene derivative, a polybenzothiadiazole derivative, a polyfluorene derivative, and the like. Examples of the n-type organic semiconductor may include a fullerene and a fullerene derivative<for example, a fullerene such as C60, C70, or C74 (high-order fullerene), an endohedral fullerene, or the like), or a fullerene derivative (for example, a fullerene compound or a PCBM fullerene compound, a fullerene multimer or the like)>, an organic semiconductor having larger (deeper) HOMO and LUMO than the p-type organic semiconductor, a transparent inorganic metal oxide, and the like. Specific examples of the n-type organic semiconductor may include a heterocyclic compound containing nitrogen atoms, oxygen atoms, or sulfur atoms, for example, an organic molecule, an organic metal complex, or a subphthalocyanine derivative including, as a part of a molecular framework, a pyridine derivative, a pyrazine derivative, a pyrimidine derivative, triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, a oxazole derivative, an imidazole derivative, a benzoimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, a polyfluorene derivative, or the like. Examples of a group and the like included in the fullerene derivative may include halogen atoms; a linear, branched, or cyclic alkyl group or phenyl group; a group including a linear or ring-fused aromatic compound; a group including a halogen compound; a partial fluoroalkyl group; a perfluoroalkyl group; a silylalkyl group; a silyl alkoxy group; an aryl silyl group; an arylsulfanyl group; an alkylsulfanyl group; an arylsulphonyl group; an alkyl sulphonyl group; an arylsulfide group; an alkyl sulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group including chalcogenide; a phosphine group; a phosphon group; and a derivative thereof. The thickness of the photoelectric conversion layer including the organic material (which may be referred to as an "organic photoelectric conversion layer") may range, which is not restrictive, for example, from $1\times10^{-8}$ m to $5\times10^{-7}$ m, preferably from $2.5\times10^{-8}$ m to $3\times10^{-7}$ m, more preferably from $2.5\times10^{-8}$ m to $2\times10^{-7}$ m, much more preferably from $1\times10^{-7}$ m to $1.8\times10^{-7}$ m. Note that the organic semiconductor is often classified into the p type and the n type, that the p type means easy transportation of holes, whereas the n type means easy transportation of electrons, and that the organic semiconductor is not limited to the interpretation that holes or electrons are included as thermally excited majority carriers as is the case with inorganic semiconductors.

Alternatively, examples of the material included in the organic photoelectric conversion layer photoelectrically converting green light may include a rhodamine-based pigment, a merocyanine-based pigment, a quinacridone derivative, a subphthalocyanine-based pigment (subphthalocyanine derivative), and the like. Examples of the material included in the organic photoelectric conversion layer photoelectrically converting blue light may include a coumaric pigment, a tris-8-hydroxyquinoline aluminum (Alq3), a merocyanine-based pigment, and the like. Examples of the material included in the organic photoelectric conversion layer photoelectrically converting red light may include a phthalocyanine-based pigment and a subphthalocyanine-based pigment (subphthalocyanine derivative).

Alternatively, examples of the inorganic material included in the photoelectric conversion layer may include crystal silicon, amorphous silicon, microcrystal silicon, crystal serene, amorphous serene, and CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, or AgInSe$_2$ corresponding to a chalcopyrite-based compound, GaAs, InP, AlGaAs, InGaP, AlGaInP, or InGaAsP corresponding to a III-V family compound, or a compound semiconductor such as CdSe, CdS, In$_2$Se$_3$, In$_2$S$_3$, Bi$_2$Se$_3$, Bi$_2$S$_3$, ZnSe, ZnS, PbSe, or PbS. In addition, quantum dots including these materials can be used for the photoelectric conversion layer.

The solid image pickup apparatuses according to the first and second aspects of the present disclosure and the solid image pickup apparatuses of the first and second configurations can be used to configure a single-plate color solid image pickup apparatus.

In the solid image pickup apparatus according to the second aspect of the present disclosure including the stacked image pickup element, unlike in a solid image pickup apparatus including image pickup elements in a Bayer arrangement (that is, unlike a configuration using a color filter layer to disperse light into blue light, green light, and red light), image pickup elements sensitive to light with a plurality of types of wavelengths are stacked in the light incidence direction within an identical pixel to form one pixel, allowing sensitivity and pixel density per unit volume to be improved. Additionally, a high absorption coefficient of the organic material allows the film thickness of the organic photoelectric conversion layer to be made smaller than the film thickness of a known Si-based photoelectric conversion layer, thus mitigating light leakage from the adjacent pixel and relaxing limitation to the light incidence angle. Further, the known Si-based image pickup element executes interpolation processing between pixels for the three colors to create a color signal, leading to false colors. However, the solid image pickup apparatus according to the second aspect including the stacked image pickup element suppresses possible false colors. The organic photoelectric conversion layer itself functions as a color filter layer, enabling color separation without arrangement of a color filter layer.

On the other hand, in the solid image pickup apparatus according to the first aspect of the present disclosure, the use of the color filter layer allows requirements for spectral characteristics for blue, green, and red to be relaxed and achieves high mass productivity. Examples of the arrangement of the image pickup elements in the solid image pickup apparatus according to the first aspect of the present disclosure include, besides the Bayer arrangement, an interline arrangement, a G striped RB checkered arrangement, a G striped RB complete checkered arrangement, a checkered complementary color arrangement, a striped arrangement, an obliquely striped arrangement, a primary color difference arrangement, a field color difference sequential arrangement, a frame color difference sequential arrangement, an MOS arrangement, an improved MOS arrangement, a frame interleaved arrangement, and a field interleaved arrangement. Here, one image pickup element forms one pixel (or a subpixel).

As the color filter layer (wavelength selection means), a filter layer can be used that transmits not only red, green, and blue but also possibly a specific wavelength such as cyan, magenta, or yellow. Instead of including a color filter layer based on an organic material including an organic compound such as a pigment or a dye, the color filter layer may include a photonic crystal, a wavelength selection element with an applied plasmon (a conductor lattice structure including a conductor thin film with a lattice-like hole structure. See, for example, Japanese Patent Laid-Open No. 2008-177191), or a thin film including an inorganic material such as amorphous silicon.

The pixel region in which a plurality of the image pickup elements and the like of the present disclosure or a plurality of the stacked image pickup elements in the present disclosure is arranged includes a plurality of pixels regularly arranged in a two-dimensional array. The pixel region typically includes an effective pixel region in which light is actually received and is photoelectrically converted into signal charge and in which the signal charge is amplified and the amplified signal charge is read out to the drive circuit, and a black reference pixel region (also referred to as an optical black pixel region (OPB)) for outputting optical black corresponding to a reference for a black level. The black reference pixel region is typically arranged in an outer peripheral portion of the effective pixel region.

In the image pickup element and the like including the above-described various preferred configurations and arrangements, light is emitted to induce photoelectric conversion in the photoelectric conversion layer, causing carrier separation between holes and electrons. An electrode from which holes are retrieved is assumed as a positive electrode, and an electrode from which electrons are retrieved is assumed as a negative electrode. In some configurations, the first electrode forms a positive electrode, whereas the second electrode forms a negative electrode, and in other configurations, in contrast, the first electrode forms a negative electrode, whereas the second electrode forms a positive electrode.

The first electrode, the charge storage electrode, the transfer control electrode, the charge transfer control electrode, the charge emission electrode, and the second electrode may include a transparent conductive material. The first electrode, the charge storage electrode, the transfer control electrode, the charge transfer control electrode, and the charge emission electrode may be collectively referred to as the "first electrode and the like." Alternatively, the image pickup element and the like of the present disclosure can be configured such that, in a case where the image pickup element and the like are disposed on a plane, for example, like the Bayer arrangement, the second electrode includes a transparent conductive material and the first electrode and the like include a metal material, and in this case, specifically, such that the second electrode located on the light incidence side includes a transparent conductive material and the first electrode and the like include, for example, Al—Nd (an alloy of aluminum and neodymium) or ASC (an alloy of aluminum, samarium, and copper). The electrode including the transparent conductive material may be referred to as a "transparent electrode." Here, the transparent conductive material desirably has a bandgap energy of 2.5 eV or more and preferably 3.1 eV or more. An example of the transparent conductive material included in the transparent electrode includes a metal oxide with conductivity, and specific examples of the transparent conductive material included in the transparent electrode include indium oxide, an indium tin oxide (ITO, including Sn-doped $In_2O_3$, crystal ITO, and amorphous ITO), an indium zinc oxide (IZO) with indium added to zinc oxide as a dopant, an indium gallium oxide (IGO) with indium added to gallium oxide as a dopant, an indium gallium zinc oxide (IGZO, In—$GaZnO_4$) with indium and gallium added to zinc oxide as dopants, an indium tin zinc oxide (ITZO) with indium and tin added to zinc oxide as dopants, IFO (F-doped $In_2O_3$), tin oxide ($SnO_2$), ATO (Sb-doped $SnO_2$), FTO (F-doped $SnO_2$), zinc oxide (including ZnO doped with another element), an aluminum zinc oxide (AZO) with aluminum added to zinc oxide as a dopant, a gallium zinc oxide (GZO) with gallium added to zinc oxide as a dopant, titanium oxide ($TiO_2$), a niobium titanium oxide (TNO) with niobium added to titanium oxide as a dopant, antimony oxide, CuI, $InSbO_4$, ZnMgO, $CuInO_2$, $MgIn_2O_4$, CdO, $ZnSnO_3$, a spinel oxide, and an oxide with a $YbFe_2O_4$ structure. Alternatively, the transparent electrode may include a gallium oxide, a titanium oxide, a niobium oxide, a nickel oxide, or the like as a mother layer. The transparent electrode may have a thickness ranging from $2\times10^{-8}$ m to $2\times10^{-7}$ m and preferably $3\times10^{-8}$ m to $1\times10^{-7}$ m. In a case where the first electrode is required to be transparent, the charge emission electrode preferably includes a transparent conductive material in terms of simplification of a manufacturing process.

Alternatively, in a case where transparency is not required, the conductive material included in a negative electrode including a function as an electrode retrieving electrons preferably has a low work function (for example, $\Phi=3.5$ to 4.5 eV), and specific examples of conductive material may include alkali metal (for example, Li, Na, K, and the like) and fluorides and oxides of the alkali metal, alkali earth metal (for example, Mg, Ca, and the like) and fluorides and oxides of the alkali earth metal, aluminum (Al), zinc (Zn), tin (Sn), thallium (Tl), a sodium-potassium alloy, an aluminum-lithium alloy, a magnesium-silver alloy, indium, rare-earth metal such as ytterbium, or alloys thereof. Additionally, the conductive material included in a positive electrode including a function as an electrode retrieving holes preferably has a high work function (for example, Φ=4.5 to 5.5 eV), and specific examples of such a conductive material may include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). Alternatively, examples of the material included in the negative electrode and the positive electrode may include metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), or alloys including these metal elements, conductive particles including such metal, conductive particles of alloys including such metal, polysilicon containing impurities, carbon-based materials, oxide semiconductor materials, carbon nano tubes, conductive materials such as graphene, and the like or may be stacked structures of layers including these elements. Further, examples of the material included in the negative electrode and the positive electrode may include organic materials (conductive polymers) such as poly (3, 4-ethylenedioxythiophene)/polystyrene sulfonic acid [PEDOT/PSS]. Additionally, any of these conductive materials may be mixed with a binder (polymer) to form a paste or an ink, which may then be hardened and used as an electrode.

As a film formation method for the first electrode and the like and the second electrode (negative electrode or positive electrode), a dry process or a wet process can be used. Examples of the dry process may include physical vapor deposition (PVD) and chemical vapor deposition (CVD). Examples of a film formation method using PVD include vacuum deposition using resistance heating or high frequency heating, EB (electron beam) deposition, various sputtering methods (magnetron sputtering method, RF-DC coupled bias sputtering method, ECR sputtering method, facing target sputtering method, and high frequency sputtering method), an ion plating method, a laser ablation method, a molecular beam epitaxy method, a laser transfer method, and the like. Additionally, examples of CVD include plasma CVD, thermal CVD, organic metal (MO) CVD, optical CVD, and the like. On the other hand, examples of the wet process include an electroplating method, an electroless plating method, a spin coating method, an ink-jet method, a spray coating method, stamping method, micro contact printing method, a flexographic printing method, an offset printing method, a gravure printing method, a dipping method, and the like. Examples of a patterning method include chemical etching such as shadow masking, laser transfer, and photolithography, physical etching using an ultraviolet ray or a laser, and the like. As a planarization technique for the first electrode and the like and the second electrode, a laser planarization method, a reflow method, CMP (Chemical Mechanical Polishing), and the like can be used.

Examples of the material included in the insulating layer include not only inorganic insulating materials illustrated by a silicon oxide based material; silicon nitride ($SiN_y$); and metal oxide high dielectric insulating materials such as aluminum oxide ($Al_2O_3$) but also organic insulating materials (organic polymer) illustrated by polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2(aminoethyl)3-aminopropyl trimethoxy silane (AEAPTMS), 3-mercaptopropyl trimethoxy silane (MPTMS), and octadecyl trichlorosilane (OTS); novolac phenol resin; fluorine resin; and linear hydrocarbons such as octadecanethiol and dodecyl isocyanate including, at one end, a functional group that can be bound to a control electrode, or combinations thereof can be used. Examples of the silicon oxide material include silicon oxide ($SiO_x$), BPSG, PSG, BSG, AsSG, PbSG, silicon oxynitride (SiON), SOG (Spin On Glass), and low dielectric insulating materials (for example, polyaryl ether, cyclo perfluorocarbon polymer, and benzocyclobutene, cyclic fluorine resin, polytetra fluoroethylene, aryl fluoride ether, polyimide fluoride, amorphous carbon, and organic SOG). The insulating layer may have a single layer configuration or a configuration in which a plurality of (for example, two) layers is stacked. In the latter case, it is sufficient that an insulating underlayer is formed at least on the charge storage electrode and in a region between the charge storage electrode and the first electrode, that planarization treatment is applied to the insulating underlayer to leave the insulating underlayer at least in the region between the charge storage electrode and the first electrode, and that an insulating overlayer is formed on the remaining insulating underlayer and the charge storage electrode. Thus, planarization of the insulating layer can be reliably achieved. It is also sufficient to select the materials included in various interlayer insulating layers, protective material layers, and insulating material layers, from these materials as appropriate.

The configurations and structures of the floating diffusion layer, the amplifying transistor, the reset transistor, and the selection transistor included in the control section may be similar to the configurations and structures of known floating diffusion layers, amplifying transistors, reset transistors, and selection transistors. The drive circuit may also have a well-known configuration and a well-known structure.

The first electrode is connected to the floating diffusion layer and the gate section of the amplifying transistor. It is sufficient to form a contact hole portion so as to connect the first electrode to the floating diffusion layer and the gate section of the amplifying transistor. Examples of a material included in the contact hole portion include polysilicon doped with impurities, high-melting metal and metal silicide such as tungsten, Ti, Pt, Pd, Cu, TiW, TiN, TiNW, $WSi_2$, and $MoSi_2$, and stacked structures of layers including these materials (for example, Ti/TiN/W).

A first carrier blocking layer may be provided between the oxide semiconductor layer and the first electrode, and a second carrier blocking layer may be provided between the organic photoelectric conversion layer and the second electrode. Further, a first electron injection layer may be provided between the first carrier blocking layer and the first electrode, and a second electron injection layer may be provided between the second carrier blocking layer and the second electrode. Examples of a material included in the electron injection layer may include, for example, alkali metal such as lithium (Li), sodium (Na), and potassium (K), fluorides and oxides of the alkali metal, alkali earth metal such as magnesium (Mg) and calcium (Ca), and fluorides and oxides of the alkali earth metal.

Examples of a film formation method for the various organic layers include a dry film formation method and a wet film formation method. Examples of the dry film formation method include vacuum deposition using resistance heating, high frequency heating, or electron beam heating, flash deposition, plasma deposition, EB deposition, various sputtering methods (two-pole sputtering method, direct current sputtering method, direct current magnetron sputtering method, high frequency sputtering method, magnetron sputtering method, RF-DC coupled bias sputtering method, ECR sputtering method, facing target sputtering method, high frequency sputtering method, and ion beam sputtering method), a DC (Direct Current) method, an RF method, a multi-negative-electrode method, an activation reaction method, electrolytic deposition, various ion plating methods such as a high frequency ion plating method and a reactive ion plating method, a laser ablation method, a molecular beam epitaxy method, a laser transfer method, and a molecular beam epitaxy method (MBE method). Additionally, examples of CVD include plasma CVD, thermal CVD, MOCVD, and optical CVD. On the other hand, specific examples of the wet process include a spin coating method; a dipping method; a casting method; a microcontact printing method; a drop casting method; various printing methods such as a screen printing method, an ink-jet printing method, an offset printing method, a gravure printing method, and a flexographic printing method; a stamping method, a spraying method; and various coating method such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, slit orifice coater method, and a calendar coater method. Examples of a solvent for the coating method include organic solvents with no or low polarity such as toluene, chloroform, hexane, and ethanol. Examples of the patterning method include chemical etching such as shadow masking, laser transfer, and photolithography, physical etching using an ultraviolet ray or a laser, and the like. As a planarization technique for the various organic layers, a laser planarization method or a reflow method can be used.

As described above, the image pickup element or the solid image pickup apparatus may be provided with an on-chip microlens or a light shielding layer and is provided with a drive circuit and wiring for driving the image pickup element, as necessary. A shutter for controlling the incidence of light on the image pickup element may be disposed, or an optical cut filter may be provided according to the purpose of the solid image pickup apparatus, as necessary.

Additionally, in the solid image pickup apparatuses of the first and second configurations can be configured such that one on-chip microlens is disposed above one of the image pickup elements and the like of the present disclosure or such that an image pickup element block includes two of the image pickup elements and the like of the present disclosure, with one on-chip microlens disposed above the image pickup element block.

For example, in a case where the solid image pickup apparatus and a readout integrated circuit (ROIC) are stacked, the stacking can be achieved by placing, on top of each other, a driving substrate provided with the readout integrated circuit and a connection section including copper (Cu) and the image pickup element provided with a connection section so as to bring the connection sections in contact with each other and then joining the connection sections, or the connection sections can be joined using a solder bump.

Additionally, a driving method for driving the solid image pickup apparatuses according to the first and second aspects of the present disclosure may be a driving method for the solid image pickup apparatus repeating the steps of in all the image pickup elements, simultaneously emitting charge in the first electrode to the outside of the system while storing charge in the oxide semiconductor layer (or the oxide semiconductor layer and the photoelectric conversion layer), and then, in all the image pickup elements, simultaneously transferring, to the first electrode, the charge stored in the oxide semiconductor layer (or the oxide semiconductor layer and the photoelectric conversion layer), and after the transfer is complete, sequentially reading out the charge transferred to the first electrode in each of the image pickup elements.

In such a driving method for the solid image pickup apparatus, each of the image pickup elements has a structure in which light incident from the second electrode side does not enter the first electrode, and in all the image pickup elements, the charge in the first electrode is emitted to the outside of the system while charge is stored in the oxide semiconductor layer and the like, thus allowing the first electrode to be reliably simultaneously reset in all the image pickup elements. Then, in all the image pickup elements, the charge stored in the oxide semiconductor layer and the like is simultaneously transferred to the first electrode, and after the transfer is complete, the charge transferred to the first electrode in each image pickup element is sequentially read out. Thus, what is called a global shutter function can be easily achieved.

The image pickup element and the solid image pickup apparatus of Embodiment 1 will be described below in detail.

The image pickup element 10 of Embodiment 1 further includes a semiconductor substrate (more specifically, a silicon semiconductor layer) 70, and the photoelectric conversion section is disposed above the semiconductor substrate 70. Additionally, the image pickup element 10 further includes a control section provided on the semiconductor substrate 70 and including a drive circuit to which the first electrode 21 and the second electrode 22 are connected. Here, the light incident surface of the semiconductor substrate 70 is assumed to face in the upward direction, whereas the opposite side of the semiconductor substrate 70 is assumed to face in the downward direction. A wiring layer 62 including a plurality of wires is provided below the semiconductor substrate 70.

The semiconductor substrate 70 is provided at least with the floating diffusion layer $FD_1$ and an amplifying transistor $TR1_{amp}$ included in the control section, and the first electrode 21 is connected to the floating diffusion layer $FD_1$ and a gate section of the amplifying transistor $TR1_{amp}$. The semiconductor substrate 70 is further provided with a reset transistor $TR1_{rst}$ and a selection transistor $TR1_{sel}$ included in the control section. The floating diffusion layer $FD_1$ is connected to one of source/drain regions of the reset transistor $TR1_{rst}$, the other source/drain region of the amplifying transistor $TR1_{amp}$ is connected to one of source/drain regions of the selection transistor $TR1_{sel}$, and the other source/drain region of the selection transistor $TR1_{sel}$ is connected to a signal line $VSL_1$. The amplifying transistor $TR1_{amp}$, the reset transistor $TR1_{rst}$, and the selection transistor $TR1_{sel}$ are included in the drive circuit.

Specifically, the image pickup element and the stacked image pickup element of Embodiment 1 are an image pickup element and a stacked image pickup element of the backside illumination type and have a structure including three image pickup elements stacked on one another. The three image pickup elements include the green light image pickup element of the first type in Embodiment 1 that includes the green light photoelectric conversion layer of the first type absorbing green light and is sensitive to green light (hereinafter referred to as a "first image pickup element"), the known blue light image pickup element of the second type that includes the blue light photoelectric conversion layer of the second type absorbing blue light and is sensitive to blue light (hereinafter referred to as a "second image pickup element"), and the known red light image pickup element of the second type that includes the red light photoelectric conversion layer of the second type absorbing red light and is sensitive to red light (hereinafter referred to as a "third image pickup element"). Here, a red light image pickup element (third image pickup element) 12 and a blue light image pickup element (second image pickup element) 11 are provided in the semiconductor substrate 70, and the second image pickup element 11 is located on the light incidence side with respect to the third image pickup element 12. Additionally, the green light image pickup element (first image pickup element 10) is provided above the blue light image pickup element (second image pickup element 11). The stacked structure of the first image pickup element 10, the second image pickup element 11, and the third image pickup element 12 forms one pixel. No color filter layer is provided.

In the first image pickup element 10, the first electrode 21 and the charge storage electrode 24 are formed on the interlayer insulating layer 81 and spaced apart from each other. The interlayer insulating layer 81 and the charge storage electrode 24 are covered with the insulating layer 82. The oxide semiconductor layer 23C, the oxide film 23B, and the photoelectric conversion layer 23A are formed on the insulating layer 82, and the second electrode 22 is formed on the photoelectric conversion layer 23A. The entire surface including the second electrode 22 is provided with a protective material layer 83, and an on-chip microlens 14 is provided on the protective material layer 83. No color filter layer is provided. The first electrode 21, the charge storage electrode 24, and the second electrode 22 each include, for example, a transparent electrode including ITO (work function: approximately 4.4 eV). The oxide semiconductor layer 23C and the oxide film 23B include the above-described material, and the photoelectric conversion layer 23A includes a layer including a well-known organic photoelectric conversion material which is at least sensitive to green light (for example, a rhodamine-based pigment, a merocyanine-based pigment, an organic material such as quinacridone). The interlayer insulating layer 81, the insulating layer 82, and the protective material layer 83 include a well-known insulating material (for example, $SiO_2$ or SiN). The oxide semiconductor layer 23C and the first electrode 21 are connected by a connection section 67 provided on the insulating layer 82. The oxide semiconductor layer 23C extends through the connection section 67. Specifically, the oxide semiconductor layer 23C extends through an opening 84 formed in the insulating layer 82 and is connected to the first electrode 21.

The charge storage electrode 24 is connected to the drive circuit. Specifically, the charge storage electrode 24 is connected to a vertical drive circuit 112 included in the drive circuit, via a connection hole 66, a pad portion 64, and wiring VOA provided in the interlayer insulating layer 81.

The charge storage electrode 24 is larger in size than the first electrode 21. Assuming that $s_1'$ denotes the area of the charge storage electrode 24 and that $s_1$ denotes the area of the first electrode 21, $4 \leq s_1'/s_1$ is preferably satisfied, which is not restrictive. Further, in Embodiment 1, for example, $s_1'/s_1 = 8$ is set, which is not restrictive.

An element isolation region 71 is formed on the side of a first surface (front surface) 70A of the semiconductor substrate 70, and an insulating material layer 72 is formed on the first surface 70A of the semiconductor substrate 70. Further, on the first surface side of the semiconductor substrate 70, the reset transistor $TR1_{rst}$, the amplifying transistor $TR1_{amp}$, and the selection transistor $TR1_{sel}$ included in the control section of the image pickup element 10 are provided, and the first floating diffusion layer $FD_1$ is further provided.

The reset transistor $TR1_{rst}$ includes a gate section 51, a channel formation region 51A, and source/drain regions 51B and 51C. The gate section 51 of the reset transistor $TR1_{rst}$ is connected to a reset line $RST_1$, and the source/drain region 51C, which is one of the source/drain regions of the reset transistor $TR1_{rst}$, also functions as the first floating diffusion layer $FD_1$. The other source/drain region 51B is connected to a power supply $V_{DD}$.

The first electrode 21 is connected to the one source/drain region 51C (first floating diffusion layer $FD_1$) of the reset transistor $TR_{rst}$ via a connection hole 65 and a pad portion 63 provided in the interlayer insulating layer 81, a contact hole portion 61 formed in the semiconductor substrate 70 and an interlayer insulating layer 76, and the wiring layer 62 formed in the interlayer insulating layer 76.

The amplifying transistor $TR1_{amp}$ includes a gate section 52, a channel formation region 52A, and source/drain regions 52B and 52C. The gate section 52 is connected to the first electrode 21 and the one source/drain region 51C (first floating diffusion layer $FD_1$) of the reset transistor $TR1_{rst}$ via the wiring layer 62. Additionally, the source/drain region 52B, which is one of the source/drain regions, is connected to the power supply $V_{DD}$.

The selection transistor $TR1_{sel}$ includes a gate section 53, a channel formation region 53A, and source/drain regions 53B and 53C. The gate section 53 is connected to a selection line $SEL_1$. Additionally, the source/drain region 53B, which is one of the source/drain regions, shares a region with the other source/drain region 52C included in the amplifying transistor $TR1_{amp}$, and the other source/drain region 53C is connected to the signal line (data output line) $VSL_1$ (117).

The second image pickup element 11 includes, as a photoelectric conversion layer, an n-type semiconductor region 41 provided in the semiconductor substrate 70. A gate section 45 of a transfer transistor $TR2_{trs}$ including a vertical transistor extends to the n-type semiconductor region 41 and is connected to a transfer gate line $TG_2$. Additionally, the second floating diffusion layer $FD_2$ is provided in a region 45C of the semiconductor substrate 70 near the gate section 45 of the transfer transistor $TR2_{trs}$. Charge stored in the n-type semiconductor region 41 is read out to the second floating diffusion layer $FD_2$ via a transfer channel formed along the gate section 45.

In the second image pickup element 11, a reset transistor $TR2_{rst}$, an amplifying transistor $TR2_{amp}$, and a selection transistor $TR2_{sel}$ included in a control section of the second image pickup element 11 are provided on the first surface side of the semiconductor substrate 70.

The reset transistor $TR2_{rst}$ includes a gate section, a channel formation region, and source/drain regions. The gate section of the reset transistor $TR2_{rst}$ is connected to a reset line $RST_2$, one of the source/drain regions of the reset transistor $TR2_{rst}$ is connected to the power supply $V_{DD}$, and the other source/drain region also functions as the second floating diffusion layer $FD_2$.

The amplifying transistor $TR2_{amp}$ includes a gate section, a channel formation region, and source/drain regions. The gate section is connected to the other source/drain region (second floating diffusion layer $FD_2$) of the reset transistor $TR2_{rst}$. Additionally, one of the source/drain regions is connected to the power supply $V_{DD}$.

The selection transistor $TR2_{sel}$ includes a gate section, a channel formation region, and source/drain regions. The gate section is connected to a selection line $SEL_2$. Additionally, one of the source/drain regions shares a region with the other source/drain region included in the amplifying transistor $TR2_{amp}$, and the other source/drain region is connected to a signal line (data output line) $VSL_2$.

The third image pickup element 12 includes, as a photoelectric conversion layer, an n-type semiconductor region 43 provided in the semiconductor substrate 70. A gate section 46 of a transfer transistor $TR3_{trs}$ is connected to a transfer gate line $TG_3$. Additionally, the third floating diffusion layer $FD_3$ is provided in a region 46C of the semiconductor substrate 70 near the gate section 46 of the transfer transistor $TR3_{trs}$. Charge stored in the n-type semiconductor region 43 is read out to the third floating diffusion layer $FD_3$ via a transfer channel 46A formed along the gate section 46.

In the third image pickup element 12, a reset transistor $TR3_{rst}$, an amplifying transistor $TR3_{amp}$, and a selection transistor $TR3_{sel}$ included in a control section of the third image pickup element 12 are further provided on the first surface side of the semiconductor substrate 70.

The reset transistor $TR3_{rst}$ includes a gate section, a channel formation region, and source/drain regions. The gate section of the reset transistor $TR3_{rst}$ is connected to a reset line $RST_3$, one of the source/drain regions of the reset transistor $TR3_{rst}$ is connected to the power supply $V_{DD}$, and the other source/drain region also functions as the third floating diffusion layer $FD_3$.

The amplifying transistor $TR3_{amp}$ includes a gate section, a channel formation region, and source/drain regions. The gate section is connected to the other source/drain region (third floating diffusion layer $FD_3$) of the reset transistor $TR3_{rst}$. Additionally, the one source/drain regions is connected to the power supply $V_{DD}$.

The selection transistor $TR3_{sel}$ includes a gate section, a channel formation region, and source/drain regions. The gate section is connected to a selection line $SEL_3$. Additionally, one of the source/drain regions shares a region with the other source/drain region included in the amplifying transistor $TR3_{amp}$, and the other source/drain region is connected to a signal line (data output line) $VSL_3$.

The reset lines $RST_1$, $RST_2$, and $RST_3$, the selection lines $SEL_1$, $SEL_2$, and $SEL_3$, and transfer gate lines $TG_2$ and $TG_3$ are connected to the vertical drive circuit 112 included in the drive circuit, and the signal lines (data output lines) $VSL_1$, $VSL_2$, and $VSL_3$ are connected to a column signal processing circuit 113 included in the drive circuit.

A $p^+$ layer 44 is provided between the n-type semiconductor region 43 and the front surface 70A of the semiconductor substrate 70 to suppress a possible dark current. A $p^+$ layer 42 is provided between the n-type semiconductor region 41 and the n-type semiconductor region 43, and a part of side surfaces of the n-type semiconductor region 43 is surrounded by the $p^+$ layer 42. A $p^+$ layer 73 is formed on the surface of a back surface 70B of the semiconductor substrate 70, and an $HfO_2$ film 74 and an insulating material film 75 are formed from the $p^+$ layer 73 to a portion inside the semiconductor substrate 70 in which the contact hole portion 61 is to be formed. The interlayer insulating layer 76 includes wiring formed across a plurality of layers, but illustration of the wiring is omitted.

The $HfO_2$ film 74 is a film having negative fixed charge, and provision of such a film allows suppression of a possible dark current. The $HfO_2$ film can be replaced with an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium ($Nd_2O_3$) film, a promethium oxide ($Pm_2O_3$) film, a samarium oxide ($Sm_2O_3$) film, a europium oxide ($Eu_2O_3$) film, a gadolinium oxide (($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or a an aluminum oxynitride film. Examples of a film formation method for these films may include CVD, PVD, and ALD.

Now, with reference to FIGS. 6 and 7A, operations of the stacked image pickup element (first image pickup element 10) including the charge storage electrode according to Embodiment 1 will be described. The image pickup element of Embodiment 1 is provided in the semiconductor substrate 70 and further includes the control section with the drive circuit, and the first electrode 21, the second electrode 22, and the charge storage electrode 24 are connected to the drive circuit. Here, the first electrode 21 has a higher potential than the second electrode 22. Specifically, the first electrode 21 has a positive potential, whereas the second electrode 22 has a negative potential, and charge generated by photoelectric conversion in the photoelectric conversion layer 23A is read out to the floating diffusion layer, for example. Similarly, this applies to the other embodiments. Note that, in a configuration in which the first electrode 21 has a negative potential, whereas the second electrode 22 has a positive potential, and in which holes generated by photoelectric conversion in the photoelectric conversion section are read out to the floating diffusion layer, it is sufficient to reverse the magnitude relation of the potentials described below.

Reference signs used in FIG. 6 and FIGS. 21 and 22 in Embodiment 5 described below are as follows.

$P_A$ . . . Potential at a point $P_A$ in a region of the photoelectric conversion section facing a region located midway between the charge storage electrode 24 or transfer control electrode (charge transfer electrode) 25 and the first electrode 21 $P_B$ . . . Potential at a point $P_B$ in a region of the photoelectric conversion section facing the charge storage electrode 24 $P_C$ . . . Potential at a point $P_C$ in a region of the photoelectric conversion section facing the transfer control electrode (charge transfer electrode) 25 FD . . . Potential at the first floating diffusion layer $FD_1 V_{OA}$ . . . Potential at the charge storage electrode 24 $V_{OT}$ . . . Potential at the transfer control electrode (charge transfer electrode) 25 RST . . . Potential at the gate section 51 of the reset transistor $TR1_{rst} V_{DD}$ . . . Potential at the power supply $VSL_1$ . . . Signal line (data output line) $VSL_1 TR1_{rst}$ . . . Reset transistor $TR1_{rst}$ $TR1_{amp}$ . . . Amplifying transistor $TR1_{amp} TR1_{sel}$ . . . Selection transistor $TR1_{sel}$ During the charge storage period, the drive circuit applies the potential $V_{11}$ to the first electrode 21 and applies the potential $V_{31}$ to the charge storage electrode 24. Light incident on the photoelectric conversion layer 23A induces photoelectric conversion in the photoelectric conversion layer 23A. Holes generated by the photoelectric conversion are transmitted from the second electrode 22 to the drive circuit via wiring Vou. On the other hand, since the first electrode 21 has a higher potential than the second electrode 22, in other words, for example, a positive potential is applied to the first electrode 21, whereas a negative potential is applied to the second electrode 22, $V_{31} \geq V_{11}$, preferably $V_{31} > V_{11}$ is satisfied. Accordingly, electrons generated by the photoelectric conversion are attracted to the charge storage electrode 24 and are lodged in the oxide semiconductor layer 23C, in the oxide semiconductor layer 23C and the photoelectric conversion layer 23A, or in the oxide semiconductor layer 23C, the oxide film 23B, and the photoelectric conversion layer 23A (hereinafter collectively referred to as the "oxide semiconductor layer 23C and the like"), which face the charge storage electrode 24. In other words, charge is stored in the oxide semiconductor layer 23C and the like. Since $V_{31} > V_{11}$ is satisfied, electrons generated inside the photoelectric conversion layer 23A are prevented from migrating toward the first electrode 21. As the time for the photoelectric conversion elapses, the regions of the oxide semiconductor layer 23C and the like, which face the charge storage electrode 24, have a potential with a more negative value.

During the later stage of the charge storage period, a reset operation is performed. This resets the potential of the first floating diffusion layer $FD_1$ to make the potential of the first floating diffusion layer $FD_1$ equal to the potential $V_{DD}$.

After the reset operation is complete, charge is read out. Specifically, during the charge transfer period, the drive circuit applies the potential $V_{12}$ to the first electrode 21 and applies the potential $V_{32}$ to the charge storage electrode 24. Here, it is assumed that $V_{32} < V_{12}$ is satisfied. Thus, the electrons lodged in the regions of the oxide semiconductor layer 23C and the like, which face the charge storage electrode 24, are read out to the first electrode 21 and further to the first floating diffusion layer $FD_1$. In other words, the charge stored in the oxide semiconductor layer 23C and the like is read out to the control section.

The sequence of operations including the charge storage, reset operation, and charge transfer is complete as described above.

Operations of the amplifying transistor $TR1_{amp}$ and the selection transistor $TR1_{sel}$ after the read-out of electrons to the first floating diffusion layer $FD_1$ are the same as the corresponding operations of known transistors. Additionally, the sequence of operations of the second image pickup element 11 and the third image pickup element 12 including the charge storage, reset operation, and charge transfer is similar to the known sequence of operations including the charge storage, reset operation, and charge transfer. Additionally, reset noise in the first floating diffusion layer $FD_1$ can be removed by correlated double sampling (CDS) processing as in the related art.

As described above, in Embodiment 1, the charge storage electrode disposed with a space from the first electrode and disposed so as to face the photoelectric conversion layer across the insulating layer is provided. Thus, when the photoelectric conversion layer is irradiated with light and photoelectric conversion is induced in the photoelectric conversion layer, a type of capacitor is formed by the oxide semiconductor layer and the like, the insulating layer, and the charge storage electrode, allowing charge to be stored in the oxide semiconductor layer and the like. Consequently, when exposure is started, the charge storage section can be completely depleted, enabling charge to be deleted. This allows suppression of a possible phenomenon in which kTC noise becomes louder, random noise is deteriorated, and the quality of captured images is degraded. Additionally, all pixels can be simultaneously reset, allowing what is called a global shutter function to be provided.

FIG. 8 depicts a conceptual diagram of the solid image pickup apparatus of Embodiment 1. A solid image pickup apparatus 100 of Embodiment 1 includes an image pickup region 111 in which stacked image pickup elements 101 are arranged in a two-dimensional array, and a vertical drive circuit 112, column signal processing circuits 113, a horizontal drive circuit 114, an output circuit 115, a drive control circuit 116, and the like used as drive circuits (peripheral circuits) for the image pickup region 111. These circuits may include well-known circuits and, needless to say, may include other circuit configurations (for example, various circuits used in known CCD image pickup apparatuses and CMOS image pickup apparatuses). In FIG. 8, a reference sign "101" for the stacked image pickup element is depicted in only one row.

The drive control circuit 116 generates clock signals and control signals used as references for operations of the vertical drive circuit 112, the column signal processing circuits 113, and the horizontal drive circuit 114, on the basis of a vertical synchronizing signal, a horizontal synchronizing signal, and a master clock. The generated clock signals and control signals are input to the vertical drive circuit 112, the column signal processing circuits 113, and the horizontal drive circuit 114.

The vertical drive circuit 112, for example, includes a shift register to select and scan the respective stacked image pickup elements 101 in the image pickup region 111, in units of rows in the vertical direction. A pixel signal (image signal) based on a current (signal) generated according to the amount of light received in each stacked image pickup element 101 is transmitted to the column signal processing circuits 113 via the signal lines (data output lines) 117 and VSL.

The column signal processing circuits 113 are, for example, disposed for the respective columns of the stacked image pickup elements 101 and use signals from black reference pixels (although not depicted, formed around an effective pixel region) for the respective image pickup elements to execute signal processing such as noise removal and signal amplification on image signals output from the stacked image pickup elements 101 in one row. A horizontal selection switch (not depicted) is connected to an output stage of the column signal processing circuits 113 between the output stage and a horizontal signal line 118.

The horizontal drive circuit 114, for example, includes a shift register and sequentially outputs horizontal scan pulses to sequentially select the column signal processing circuits 113, and each of the column signal processing circuits 113 outputs a signal to the horizontal signal line 118.

The output circuit 115 executes signal processing on signals sequentially fed from the column signal processing circuits 113 via the horizontal signal line 118 and outputs the resultant signals.

Figure 9:
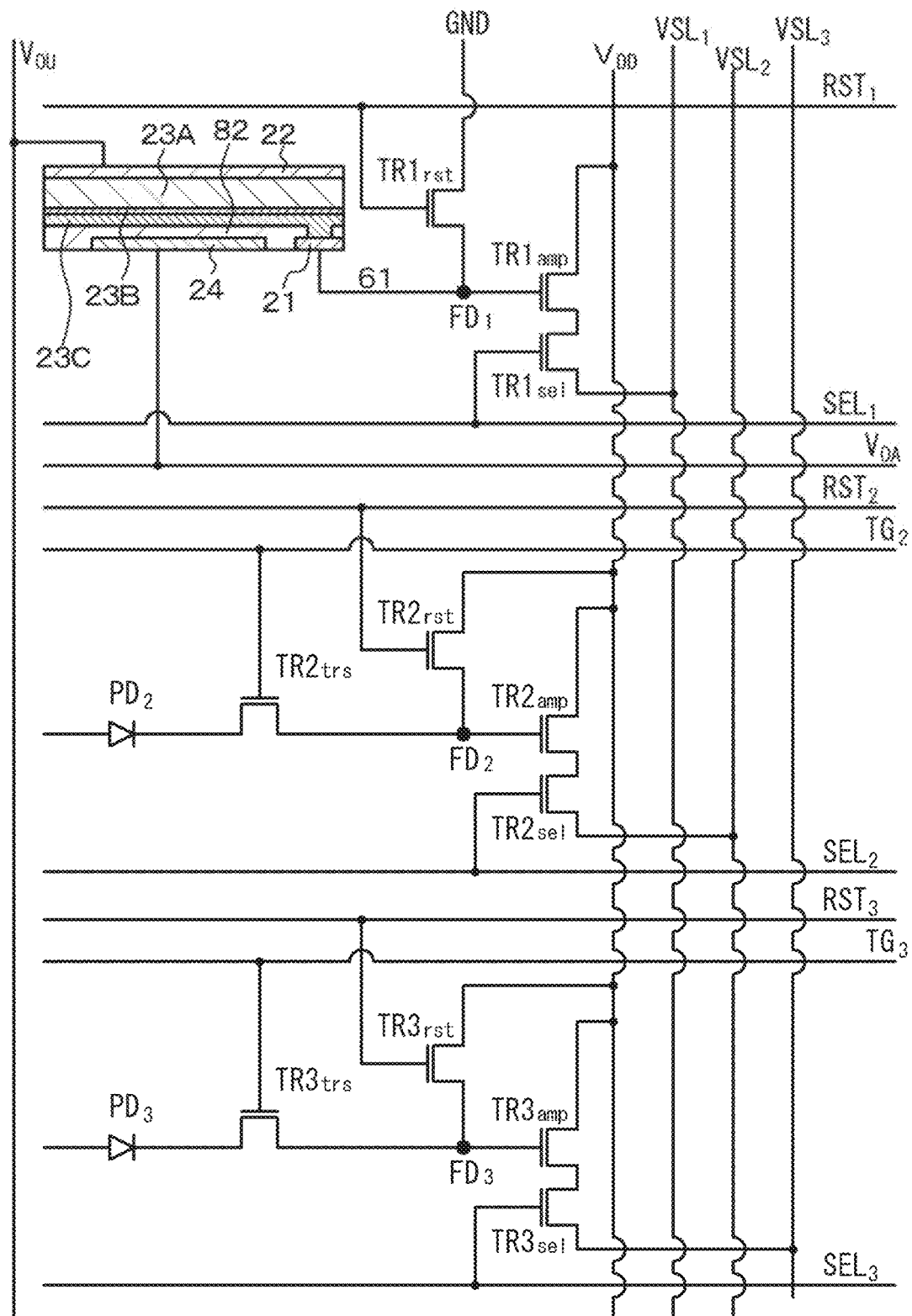
FIG. 9 is an equivalent circuit diagram of a modified example of the image pickup element and the stacked image pickup element of Embodiment 1.
Figure 10:
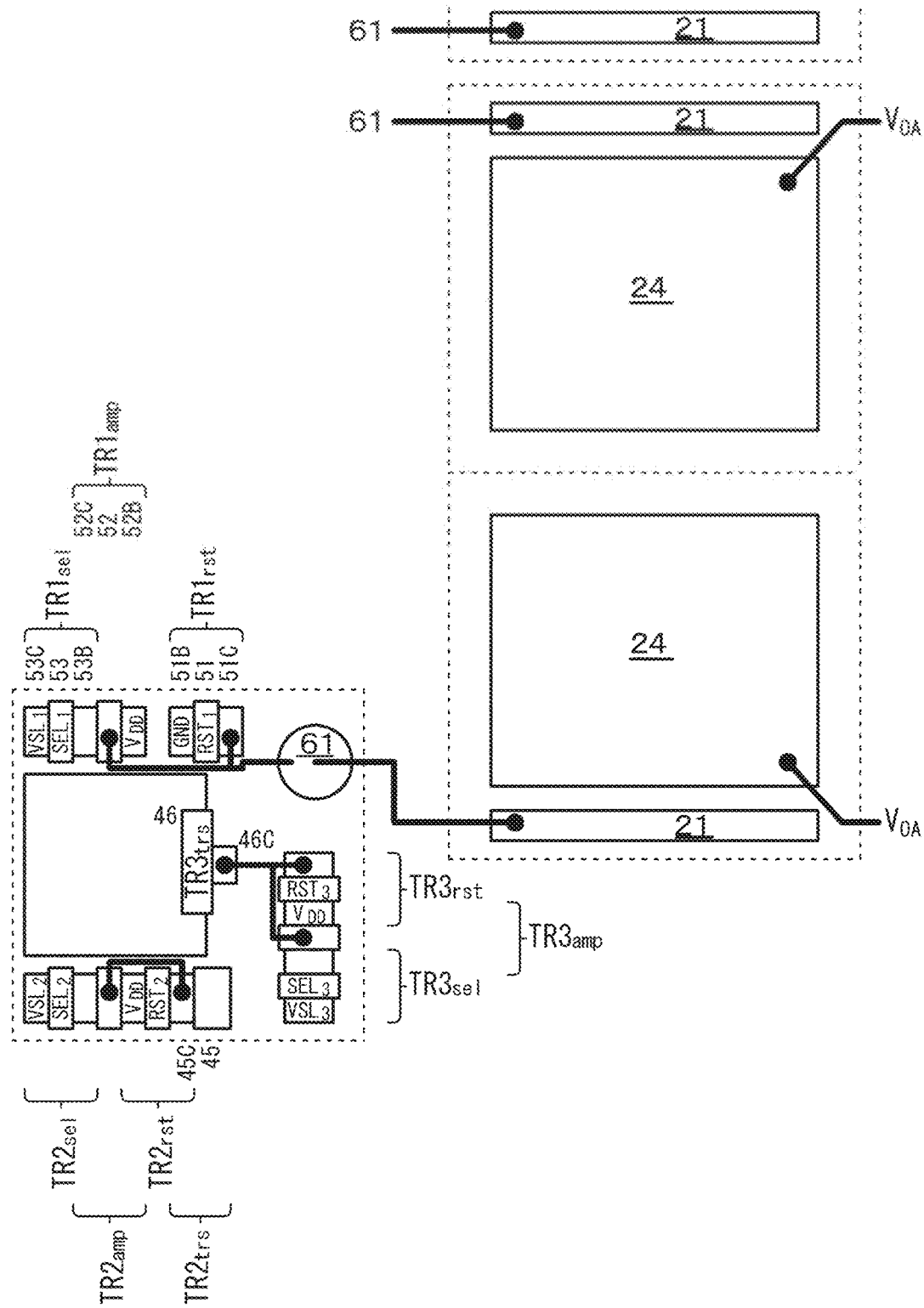
FIG. 10 is a schematic layout diagram of a first electrode and a charge storage electrode included in another modified example of the image pickup element of Embodiment 1 depicted in FIG. 9, and transistors included in a control section.

As illustrated in FIG. 9 depicting an equivalent circuit diagram of a modified example of the image pickup element and the stacked image pickup element of Embodiment 1 and as illustrated in FIG. 10 depicting a schematic layout diagram of the first electrode and the charge storage electrode and transistors included in the control section, the other source/drain region 51B of the reset transistor $TR1_{rst}$ may be grounded instead of being connected to the power supply $V_{DD}$.

The image pickup element and the stacked image pickup element of Embodiment 1 can be produced, for example, by the following method. Specifically, first, an SOI substrate is prepared. Then, a first silicon layer is formed on a front surface of the SOI substrate on the basis of an epitaxial growth method, and the p$^+$ layer 73 and the n-type semiconductor region 41 are formed on the first silicon layer. Then, a second silicon layer is formed on the first silicon layer on the basis of the epitaxial growth method, and the element isolation region 71, the insulating material layer 72, the p$^+$ layer 42, the n-type semiconductor region 43, and the p$^+$ layer 44 are formed on the second silicon layer. Additionally, the various transistors and the like included in the control section of the image pickup element are formed on the second silicon layer, and the wiring layer 62, the interlayer insulating layer 76, and various wires are further formed on the transistors. Subsequently, the interlayer insulating layer 76 is bonded to a support substrate (not depicted). Then, the SOI substrate is removed to expose the first silicon layer. A front surface of the second silicon layer corresponds to the front surface 70A of the semiconductor substrate 70, and a front surface of the first silicon layer corresponds to the back surface 70B of the semiconductor substrate 70. Additionally, the first silicon layer and the second silicon layer are collectively represented as the semiconductor substrate 70. Then, an opening for forming the contact hole portion 61 is formed on the back surface 70B side of the semiconductor substrate 70, the $HfO_2$ film 74, the insulating material film 75, and the contact hole portion 61 are formed, and the pad portions 63 and 64, the interlayer insulating layer 81, the connection holes 65 and 66, the first electrode 21, the charge storage electrode 24, and the insulating layer 82 are further formed. Then, the connection section 67 is opened, and the oxide semiconductor layer 23C, the oxide film 23B, the photoelectric conversion layer 23A, the second electrode 22, the protective material layer 83, and the on-chip microlens 14 are formed. The above-described operations allows the image pickup element and the stacked image pickup element of Embodiment 1 to be obtained.

Additionally, although not depicted, the insulating layer 82 may have two-layer configuration of an insulating underlayer and an insulating overlayer. Specifically, it is sufficient that the insulating underlayer is formed at least on the charge storage electrode 24 and in a region between the charge storage electrode 24 and the first electrode 21 (more specifically, the insulating underlayer is formed on the interlayer insulating layer 81 including the charge storage electrode 24) and that, after planarization treatment is executed on the insulating underlayer, the insulating overlayer is formed on the insulating underlayer and the charge storage electrode 24. Thus, planarization of the insulating layer 82 can be reliably achieved. Then, it is sufficient to open the connection section 67 in the insulating layer 82 thus obtained.

Figure 11:
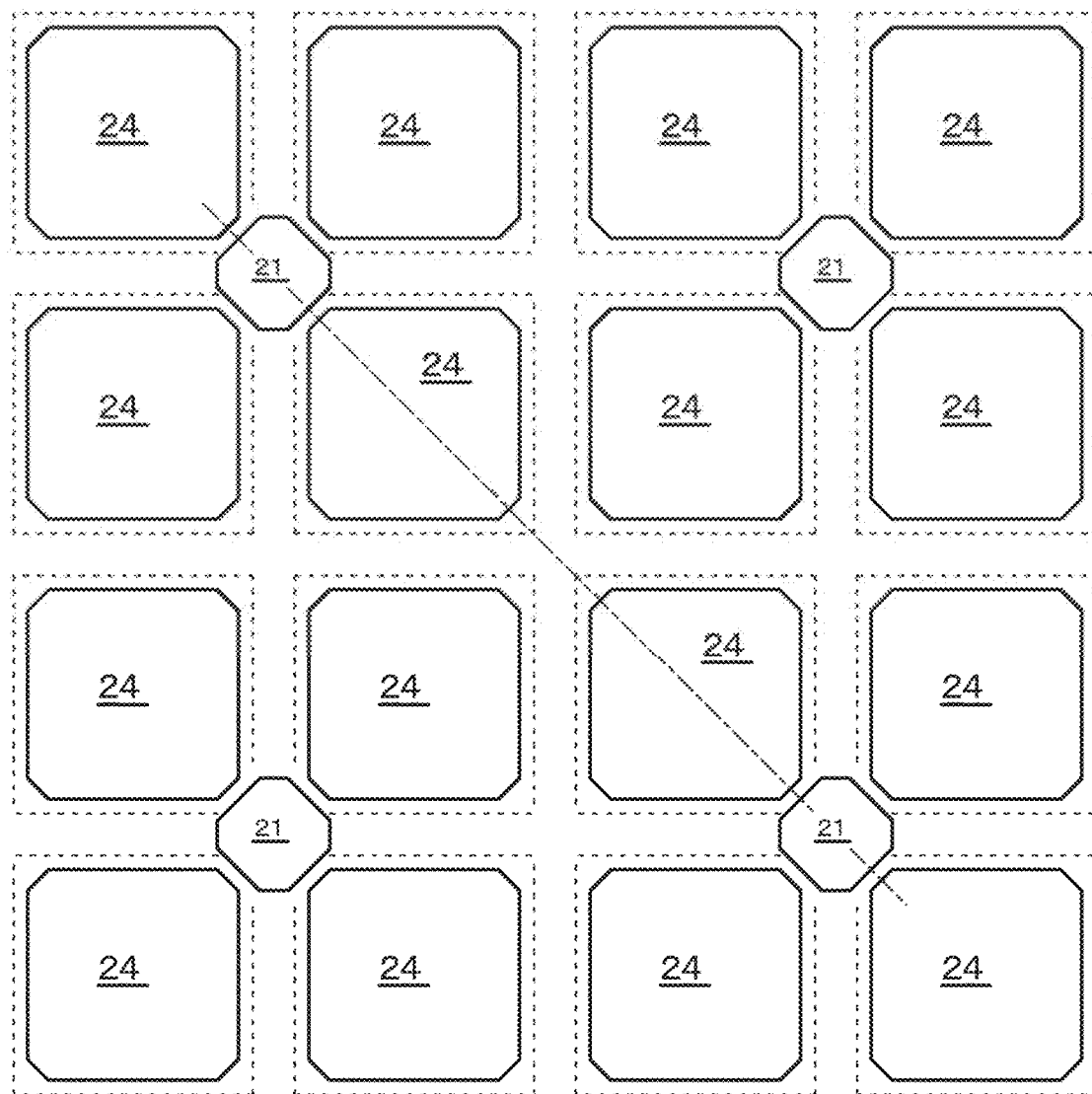
FIG. 11 is a schematic layout diagram of a yet another modified example of the first electrode and the charge storage electrode included in the image pickup element of Embodiment 1.

FIG. 11 depicts a schematic layout diagram of another modified example of the first electrode and the charge storage electrode included in the image pickup element of Embodiment 1, and in this example, in the four image pickup elements, one common first electrode 21 is provided so as to correspond to the four charge storage electrodes 24.

Embodiment 2

Embodiment 2 is a modification of Embodiment 1. In Embodiment 1, the oxide film 23B included, for example, a metal oxide such as $TiO_2$ with a thickness of 10 nm, and the oxide semiconductor layer 23C included, for example, IGZO with a thickness of 50 nm. On the other hand, in Embodiment 2, 1.58 atom % silicon (Si) was added to the oxide film 23B including $TiO_2$. Specifically, an operation in which a desired number of $TiO_2$ layers each with a thickness equal to one atomic layer are stacked on the oxide semiconductor layer 23C on the basis of ALD and in which one Si layer with a thickness equal to a desired one atomic layer is then formed on the layer on the basis of ALD, is repeated a desired number of times. Then, thermal treatment is executed, thereby obtaining the oxide film 23B including $TiO_2$ with Si added thereto. However, it is not limited to such a method, and, for example, the oxide film can be formed on the basis of a co-sputtering method.

Addition of Si to the oxide film 23B including $TiO_2$ allows crystallization of the oxide film to be suppressed, for example, during thermal treatment at 350° C. in a process of manufacturing an image pickup element. In a case where the number of crystal particles per unit area in a $TiO_2$ film to which no silicon (Si) was added was assumed to be "1.00," the number of crystal particles per unit area in a $TiO_2$ film to which silicon (Si) was added was 0.043. This indicates that the number of crystal particles per unit area in the $TiO_2$ film to which silicon (Si) was added is significantly smaller than the number of crystal particles per unit area in the $TiO_2$ film to which no silicon (Si) was added. Note that similar effects were successfully obtained by adding niobium (Nb), tungsten (W), zirconium (Zr), aluminum (Al), carbon (C), or nitrogen (N).

Embodiment 3

Figure 12:
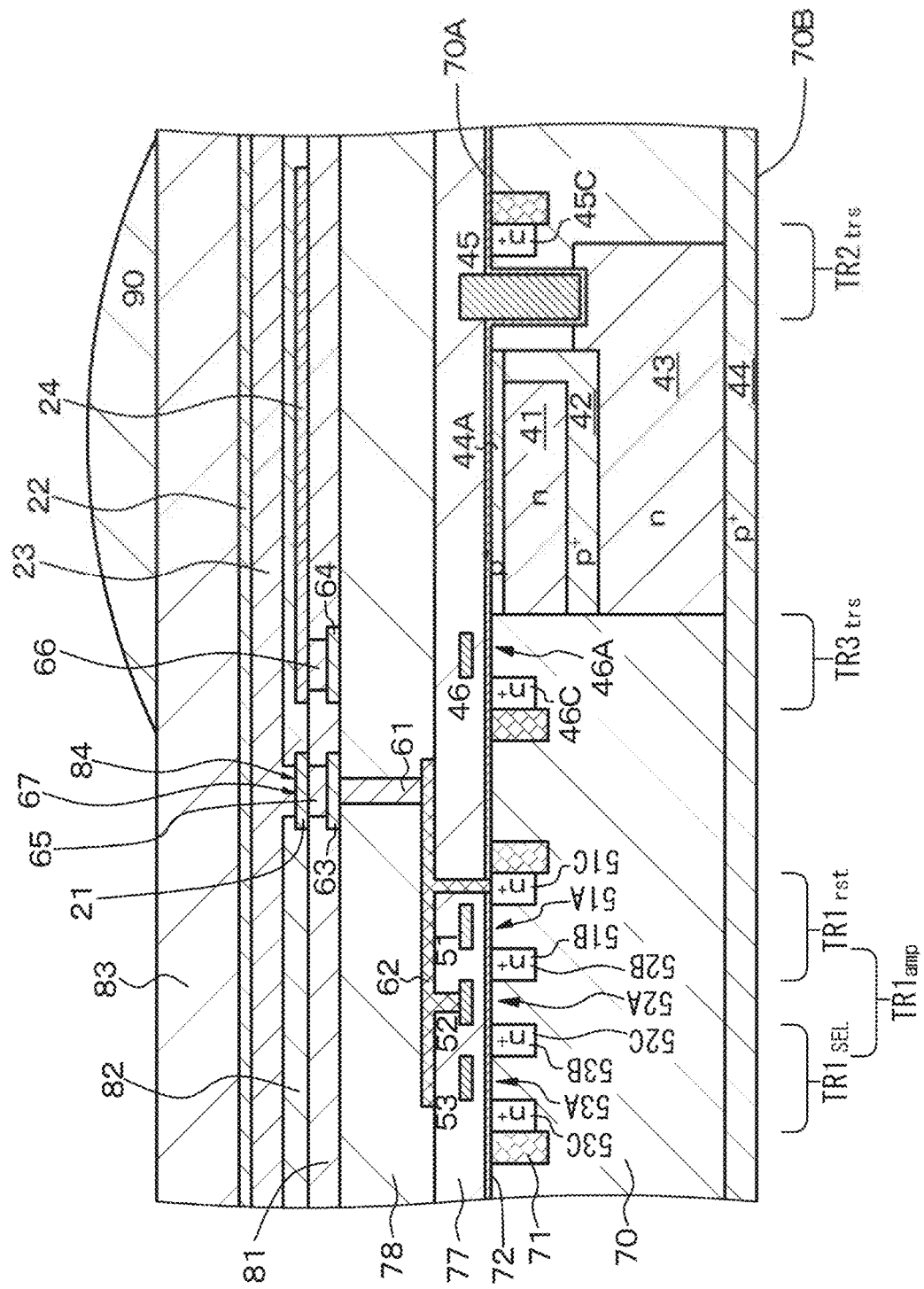
FIG. 12 is a schematic partial cross-sectional view of an image pickup element and a stacked image pickup element of Embodiment 3.

Embodiment 3 is a modification of Embodiments 1 and 2. An image pickup element and a stacked image pickup element of Embodiment 3 depicted in a schematic partial cross-sectional view in FIG. 12 are an image pickup element and a stacked image pickup element of the front-side illumination type and have a structure in which three image pickup elements are stacked. The three image pickup elements include the green light image pickup element of the first type in Embodiments 1 and 2 that includes the green light photoelectric conversion layer of the first type absorbing green light and is sensitive to green light (first image pickup element 10), the known blue light image pickup element of the second type that includes the blue light photoelectric conversion layer of the second type absorbing blue light and is sensitive to blue light (second image pickup element 11), and the known red light image pickup element of the second type that includes the red light photoelectric conversion layer of the second type absorbing red light and is sensitive to red light (third image pickup element 12). Here, the red light image pickup element (third image pickup element 12) and the blue light image pickup element (second image pickup element 11) are provided in the semiconductor substrate 70, and the second image pickup element 11 is located on the light incidence side with respect to the third image pickup element 12. Additionally, the green light image pickup element (first image pickup element 10) is provided above the blue light image pickup element (second image pickup element 11).

FIGS. 17, 24, 39, 40, 41, and 42 collectively depict the oxide film 23B and the oxide semiconductor layer 23C with a reference sign 23D, and FIGS. 26, 32, 33A, 33B, 36A, and 36B collectively depict the photoelectric conversion layer 23A, the oxide film 23B, and the oxide semiconductor layer 23C as a "photoelectric conversion stack 23."

The front surface 70A side of the semiconductor substrate 70 is provided with various transistors included in the control section, similarly to Embodiment 1. The transistors may have configurations and structures substantially similar to the configurations and structures described in Embodiment 1. Additionally, the semiconductor substrate 70 is provided with the second image pickup element 11 and the third image pickup element 12, and these image pickup elements may also have configurations and structures substantially similar to the configurations and structures of the second image pickup element 11 and the third image pickup element 12 described in Embodiment 1.

The interlayer insulating layer 81 is formed above the front surface 70A of the semiconductor substrate 70, and the first electrode 21, the oxide semiconductor layer 23C, the oxide film 23B, the photoelectric conversion layer 23A, the second electrode 22, the charge storage electrode 24, and the like are provided above the interlayer insulating layer 81, similarly to the image pickup elements of Embodiments 1 and 2.

In this manner, the image pickup element and the stacked image pickup element of Embodiment 3 may have a configuration and a structure similar to the configurations and structures of the image pickup elements and stacked image pickup elements of Embodiments 1 and 2 except that the image pickup element and the stacked image pickup element of Embodiment 3 are of the front-side illumination type, and thus, detailed descriptions of the configuration and structure of the image pickup element and the stacked image pickup element of Embodiment 3 are omitted.

Embodiment 4

Embodiment 4 is a modification of Embodiments 1 to 3.

Figure 13:
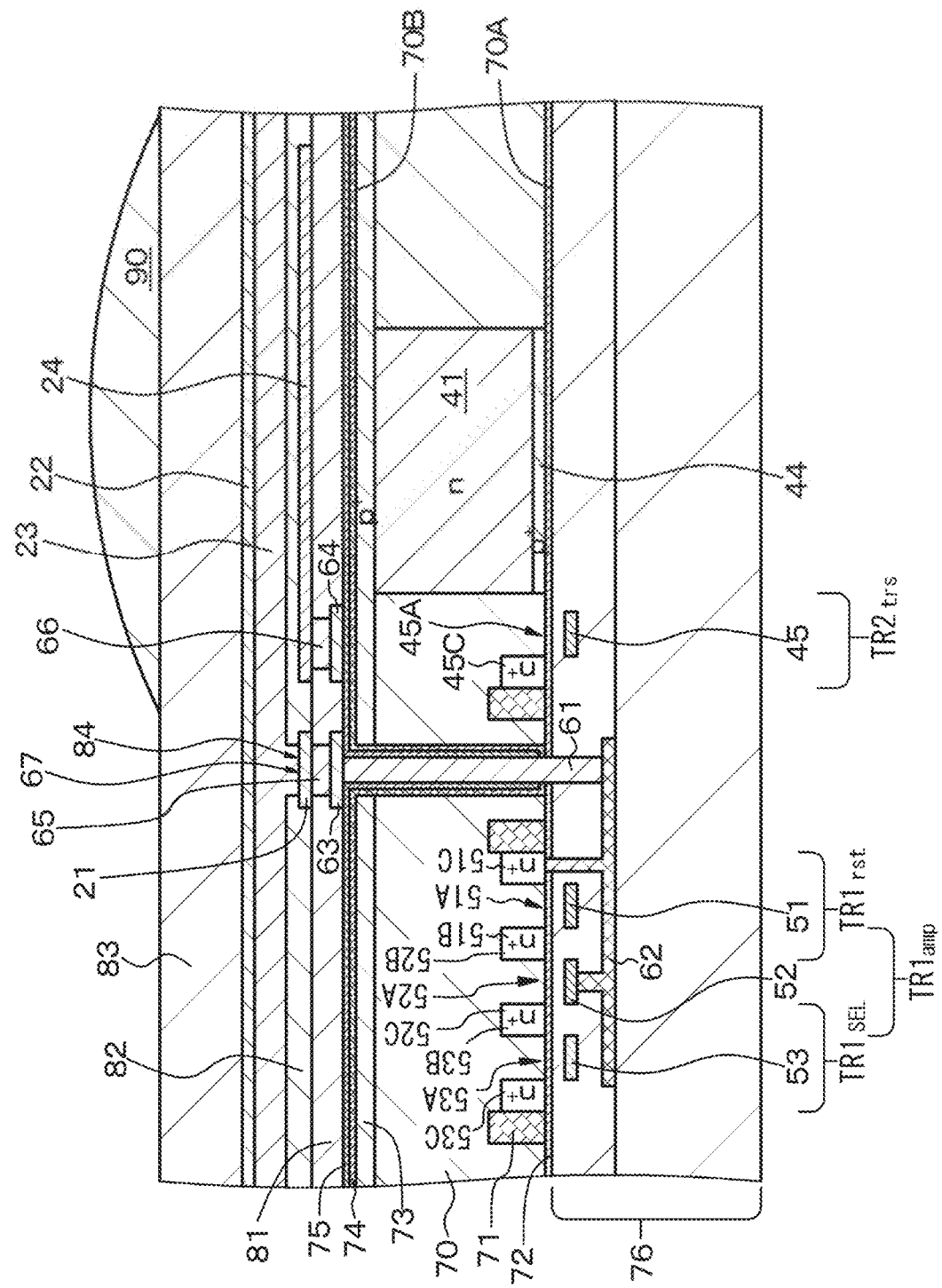
FIG. 13 is a schematic partial cross-sectional view of an image pickup element and a stacked image pickup element of Embodiment 4.
Figure 14:
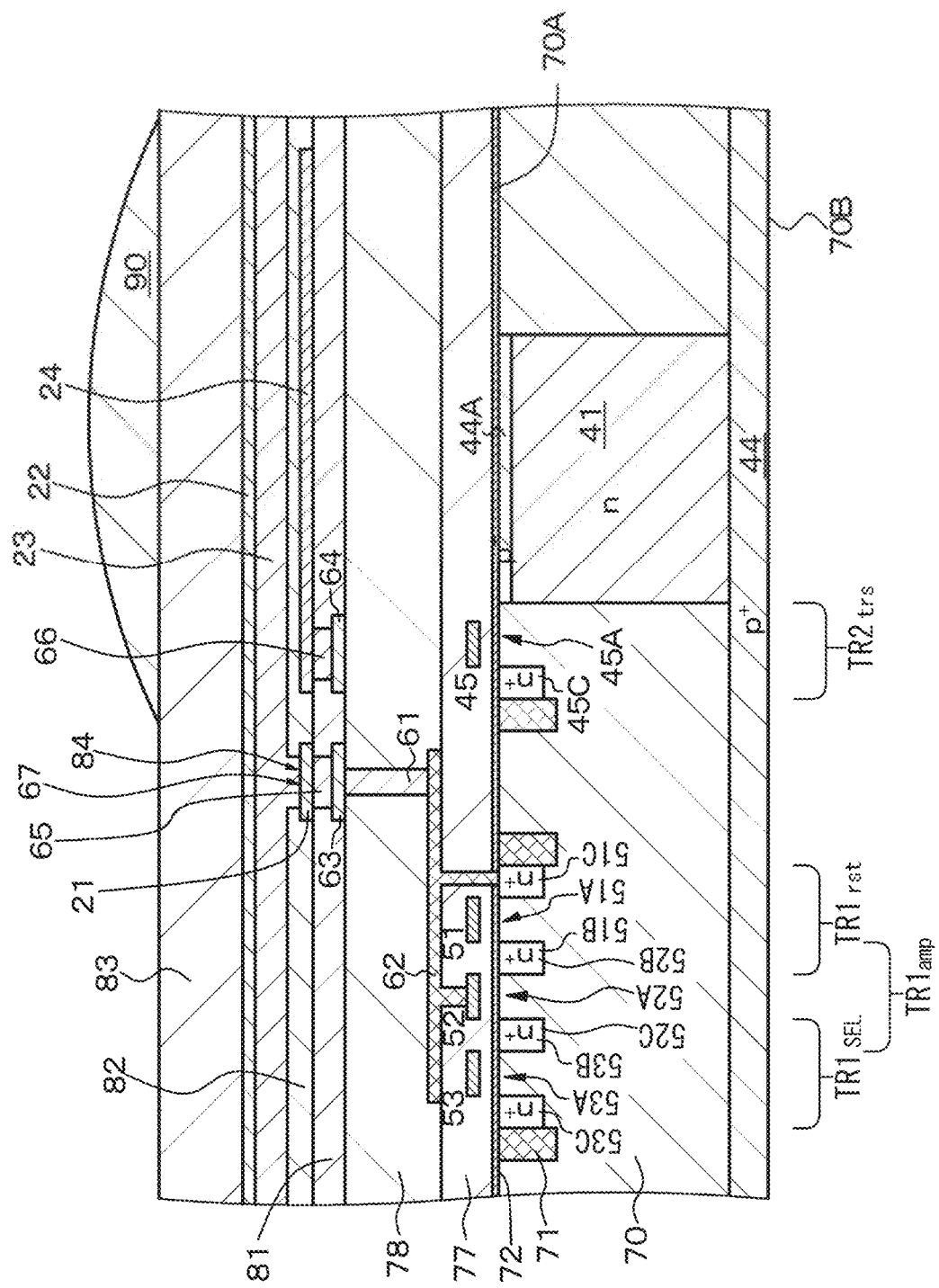
FIG. 14 is a schematic partial cross-sectional view of a modified example of the image pickup element and the stacked image pickup element of Embodiment 4.

An image pickup element and a stacked image pickup element of Embodiment 4 depicted in a schematic partial cross-sectional view in FIG. 13 are of the back-side illumination type and have a structure in which two image pickup elements of the first image pickup element 10 of the first type according to Embodiment 1 and the third image pickup element 12 of the second type are stacked. Additionally, a modified example of the image pickup element and the stacked image pickup element of Embodiment 4 depicted in a schematic partial cross-sectional view in FIG. 14 is of the front-side illumination type and has a structure in which two image pickup elements of the first image pickup element 10 of the first type according to Embodiment 1 and the third image pickup element 12 of the second type are stacked. Here, the first image pickup element 10 absorbs light in a primary color and, and the third image pickup element absorbs light in a complementary color. Alternatively, the first image pickup element 10 absorbs white light and, and the third image pickup element absorbs infrared light.

Figure 15:
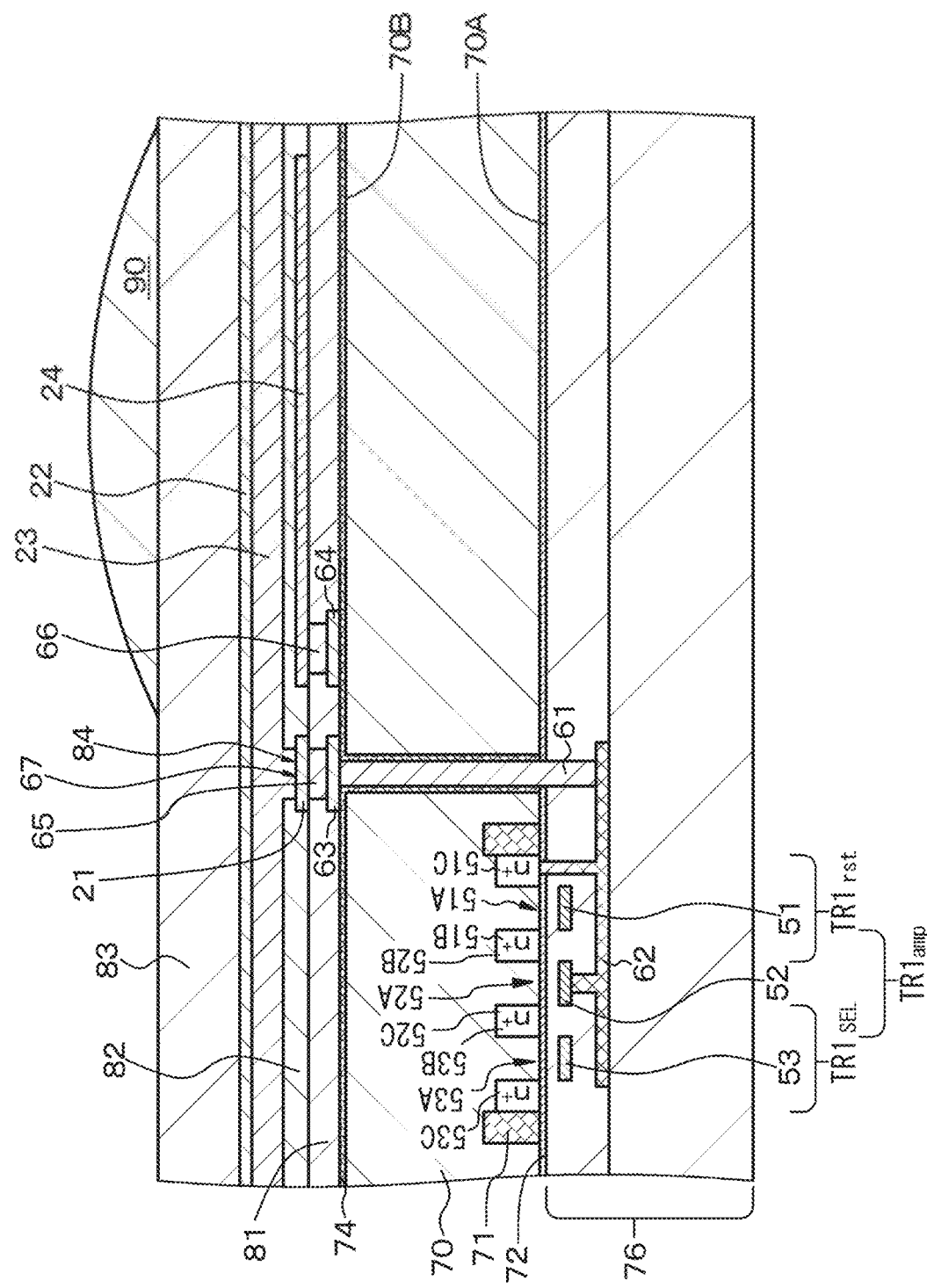
FIG. 15 is a schematic partial cross-sectional view of another modified example of the image pickup element of Embodiment 4.
Figure 16:
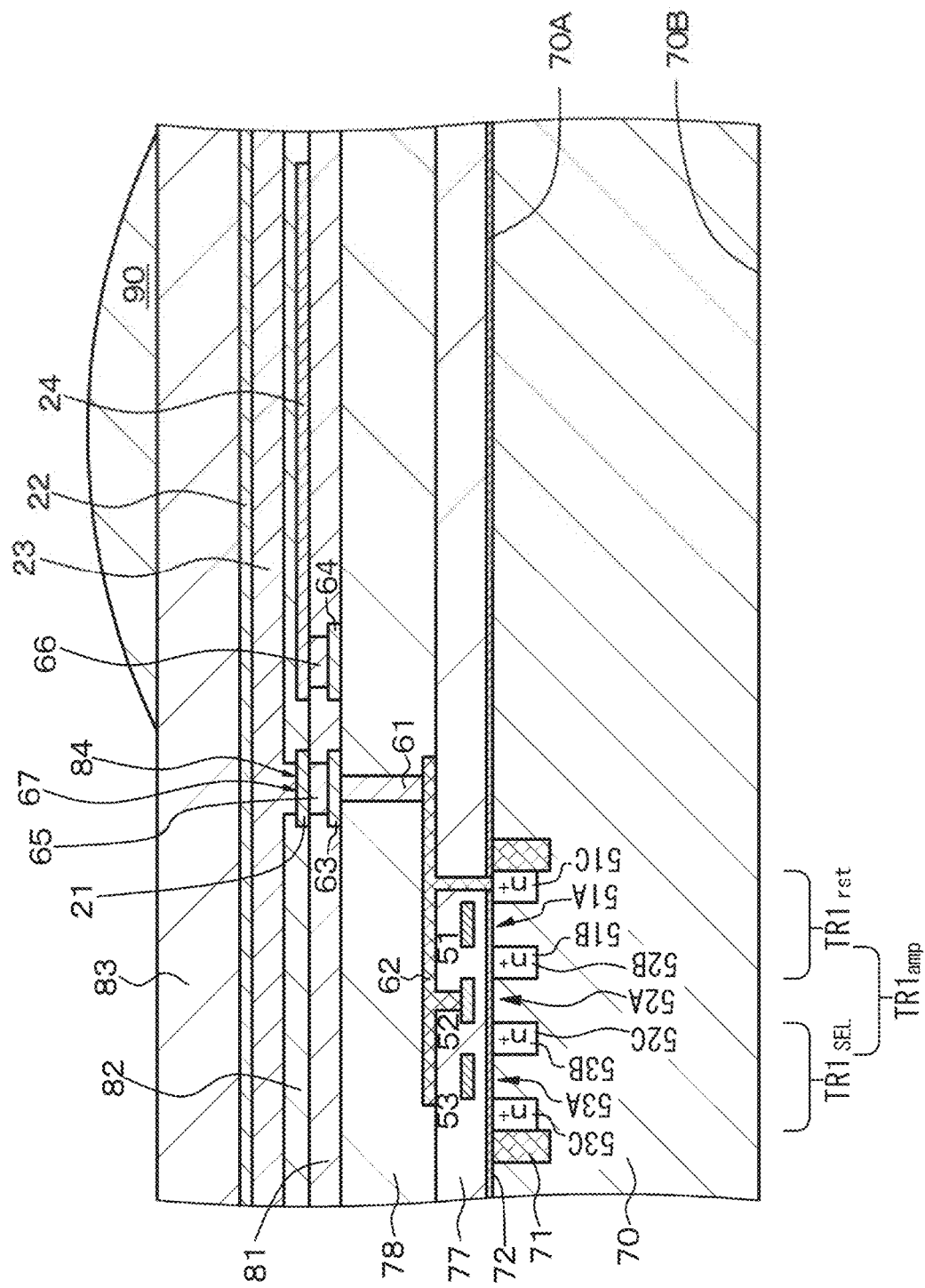
FIG. 16 is a schematic partial cross-sectional view of yet another modified example of the image pickup element of Embodiment 4.

A modified example of the image pickup element and the stacked image pickup element of Embodiment 4 depicted in a schematic partial cross-sectional view in FIG. 15 is of the back-side illumination type and includes the first image pickup element 10 of the first type according to Embodiment 1. Additionally, a modified example of the image pickup element and the stacked image pickup element of Embodiment 4 depicted in a schematic partial cross-sectional view in FIG. 16 is of the front-side illumination type and includes the first image pickup element 10 of the first type according to Embodiment 1. Here, the first image pickup element 10 includes three types of image pickup elements including an image pickup element absorbing red light (red light image pickup element), an image pickup element absorbing green light (green light image pickup element), and an image pickup element absorbing blue light (blue light image pickup element). Further, a plurality of these image pickup elements is included in the solid image pickup apparatus according to the first aspect of the present disclosure. An arrangement of a plurality of these image pickup elements may be a Bayer arrangement.

Instead of one image pickup element of the first type according to Embodiment 1 provided, two image pickup elements of the first type according to Embodiment 1 (that is, two photoelectric conversion sections are stacked and the semiconductor substrate is provided with a control section for the two photoelectric conversion sections) or three image pickup elements of the first type according to Embodiment 1 (that is, three photoelectric conversion sections are stacked and the semiconductor substrate is provided with a control section for the three photoelectric conversion sections) can be stacked. A table below illustrates examples of stacked structures of image pickup elements of the first type and image pickup elements of the second type.

| | first type | second type |
|---|---|---|
| Back-side illumination type and front-side illumination type | 1 green | 2 blue + red |
| | 1 primary color | 1 complementary color |
| | 1 white | 1 infrared ray |
| | 1 Blue, green, or red | 0 |
| | 2 green + infrared light | 2 blue + red |
| | 2 green + blue | 1 red |
| | 2 white + infrared light | 0 |
| | 3 green + blue + red | 2 bluish green (emerald) + infrared light |
| | 3 green + blue + red | 1 infrared light |
| | 3 blue + green + red | 0 |

Embodiment 5

Figure 7B:
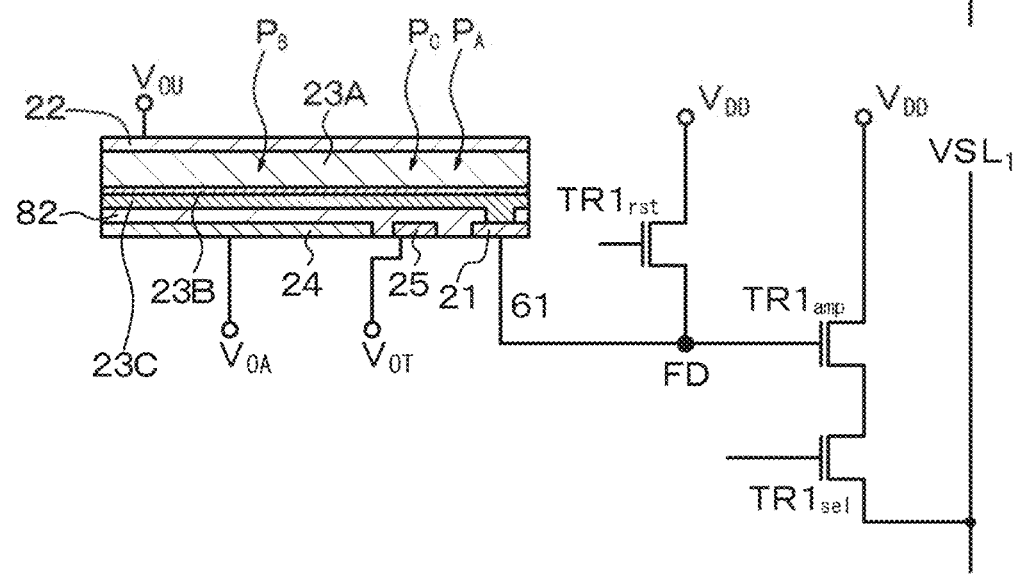
Figure 17:
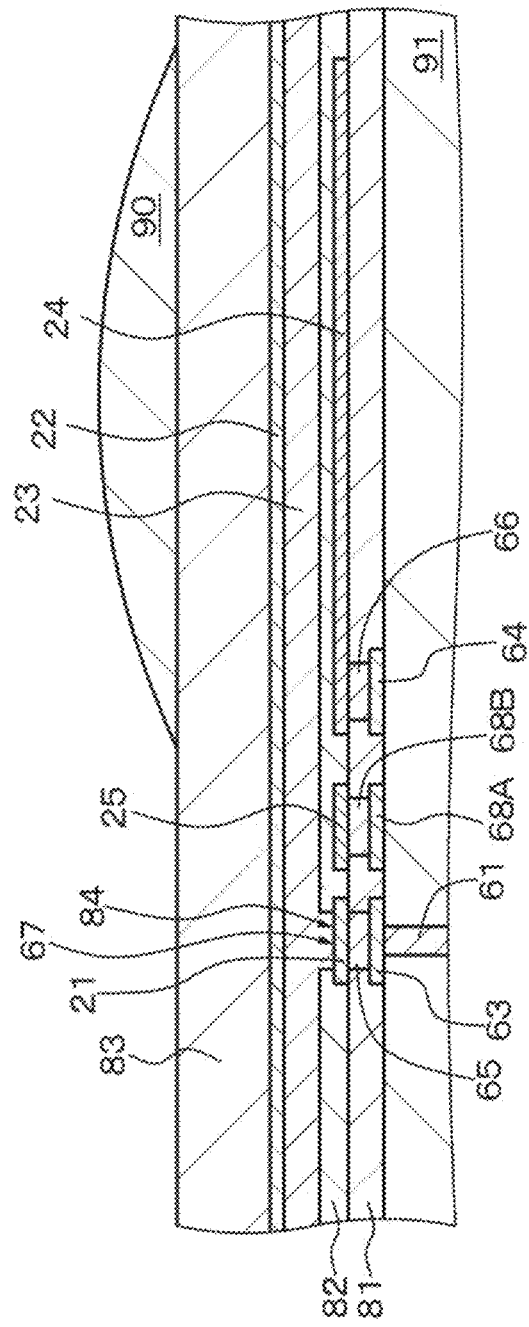
FIG. 17 is a schematic partial cross-sectional view of a part of an image pickup element and a stacked image pickup element of Embodiment 5.
Figure 18:
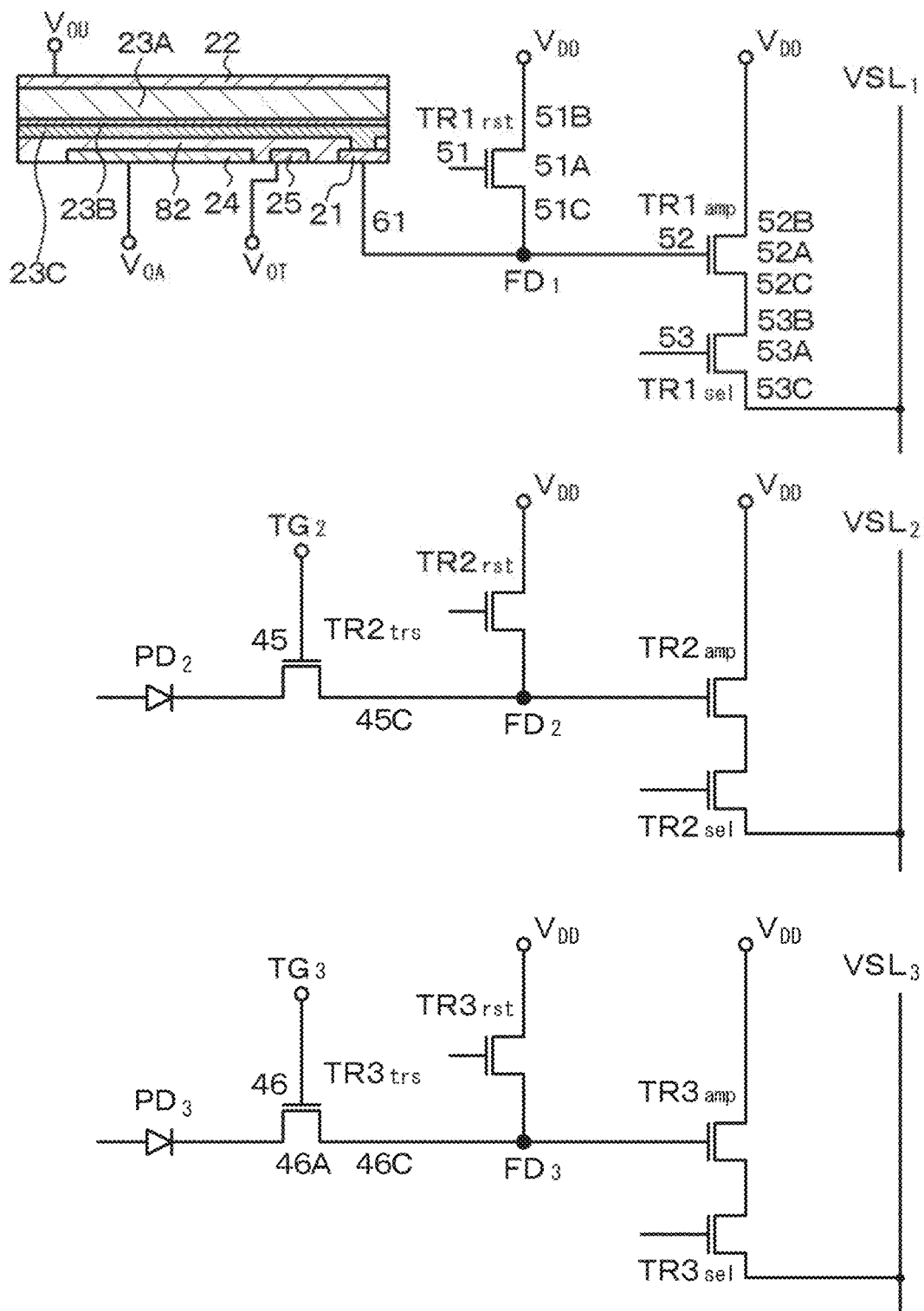
FIG. 18 is an equivalent circuit diagram of the image pickup element and the stacked image pickup element of Embodiment 5.
Figure 19:
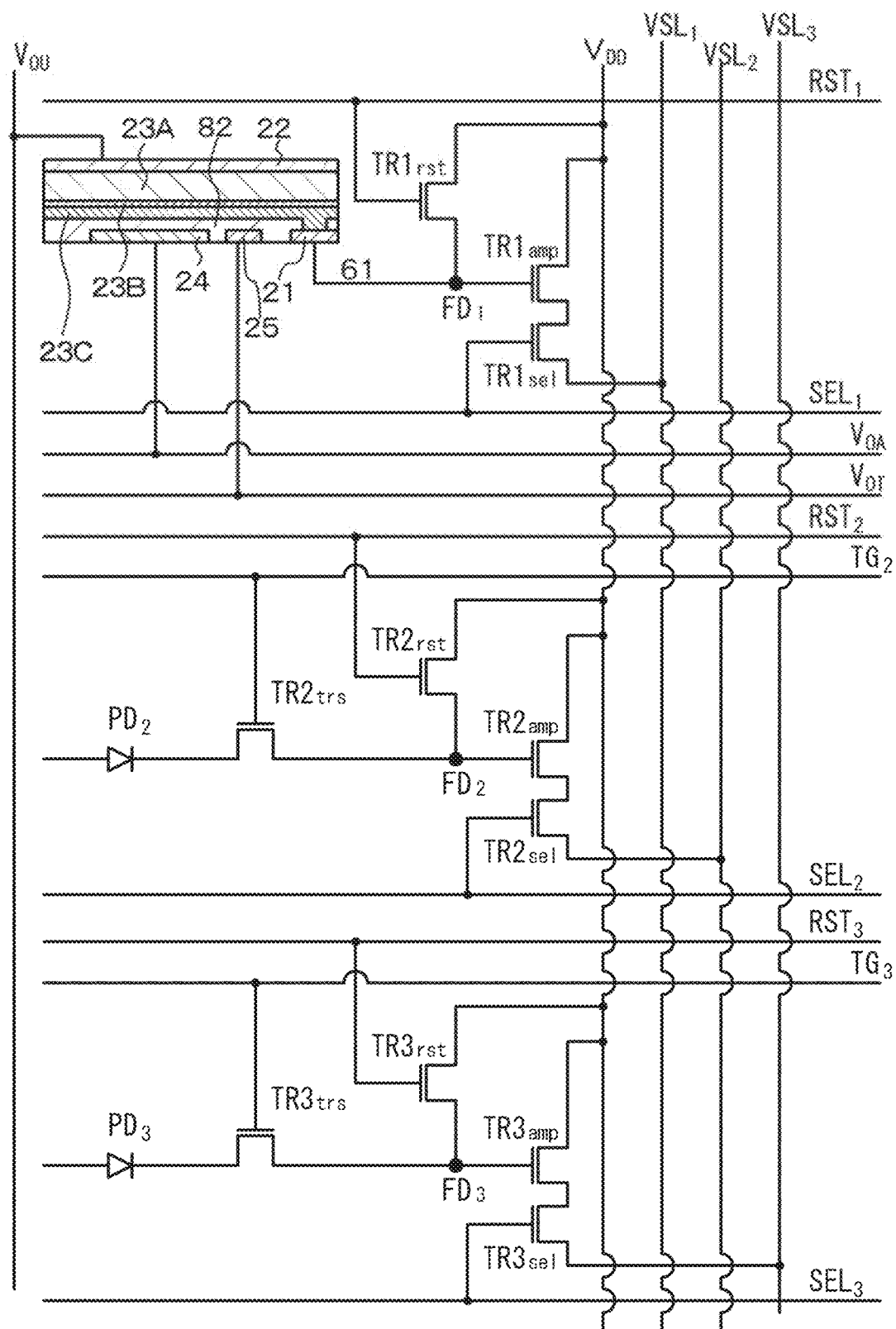
FIG. 19 is an equivalent circuit diagram of the image pickup element and the stacked image pickup element of Embodiment 5.
Figure 20:
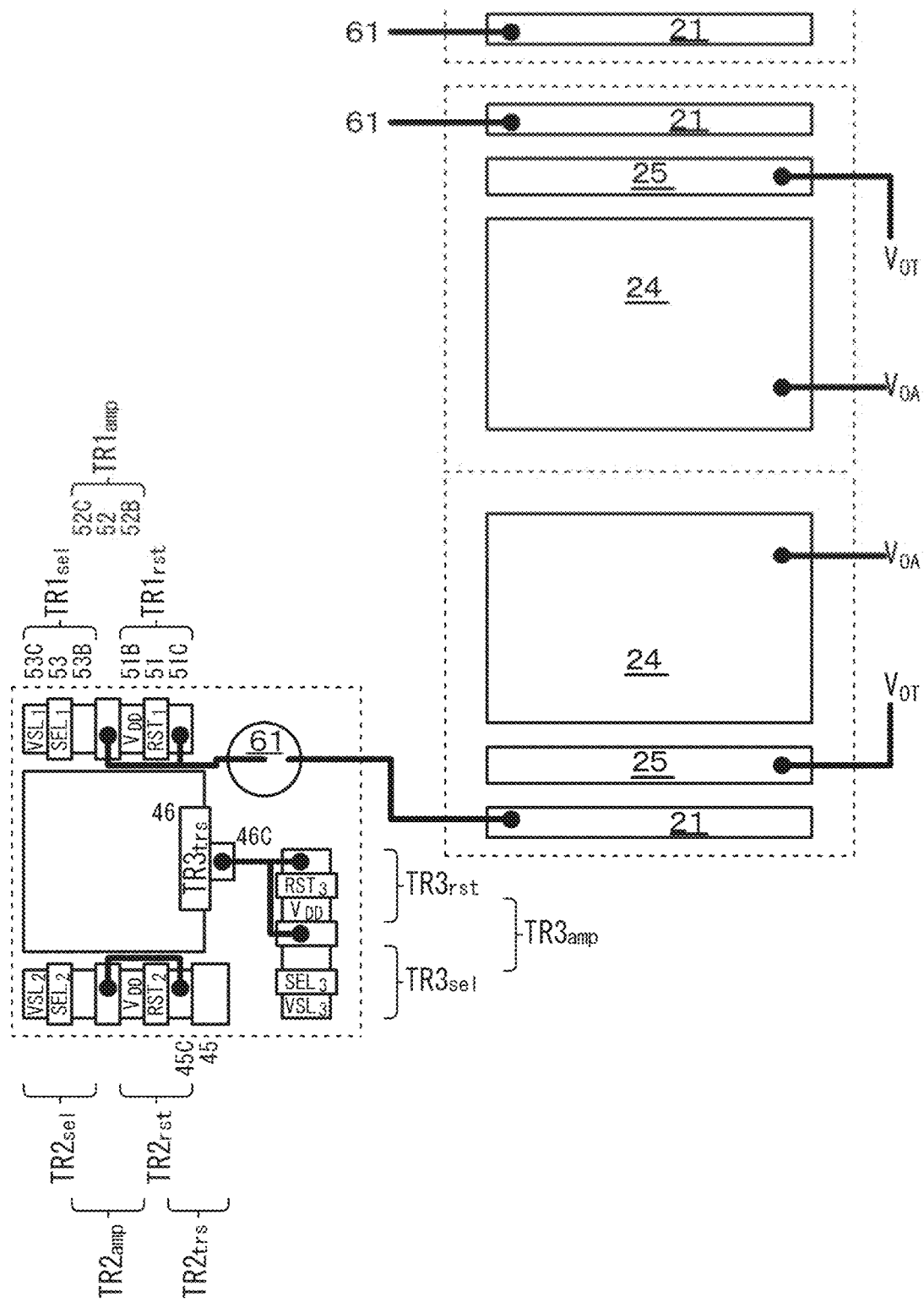
FIG. 20 is a schematic layout diagram of a first electrode, a transfer control electrode, and a charge storage electrode included in the image pickup element of Embodiment 5, and transistors included in a control section.

Embodiment 5 is a modification of Embodiments 1 to 4 and relates to the image pickup element and the like including the transfer control electrode (charge transfer electrode) of the present disclosure. FIG. 17 depicts a schematic partial cross-sectional view of a part of the image pickup element and the stacked image pickup element of Embodiment 5. FIGS. 18 and 19 depict equivalent circuit diagrams of the image pickup element and the stacked image pickup element of Embodiment 5. FIG. 20 depicts a layout diagram of a first electrode, a transfer control electrode, and a charge storage electrode included in the image pickup element of Embodiment 5, and transistors included in a control section. FIGS. 21 and 22 schematically depict the state of potentials at respective sections during operations of the image pickup element of Embodiment 5. FIG. 7B depicts an equivalent circuit diagram for describing the respective sections of the image pickup element of Embodiment 5.

The image pickup element and the stacked image pickup element of Embodiment 5 further includes a transfer control electrode (charge transfer electrode) 25 disposed between the first electrode 21 and the charge storage electrode 24 with a space from the first electrode 21 and the charge storage electrode 24 and disposed so as to face the oxide semiconductor layer 23C across the insulating layer 82. The transfer control electrode 25 is connected to a pixel drive circuit included in a drive circuit, via a connection hole 68B, a pad portion 68A, and wiring $V_{OT}$ provided in the interlayer insulating layer 81.

Figure 21:
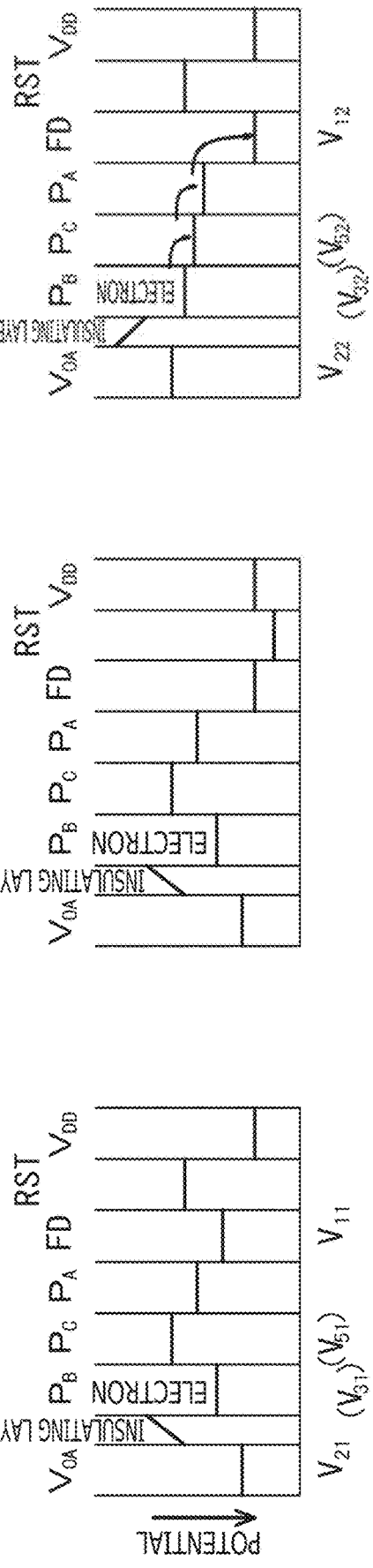
FIG. 21 is a diagram schematically depicting the state of potentials at respective sections during an operation of the image pickup element of Embodiment 5.
Figure 21:
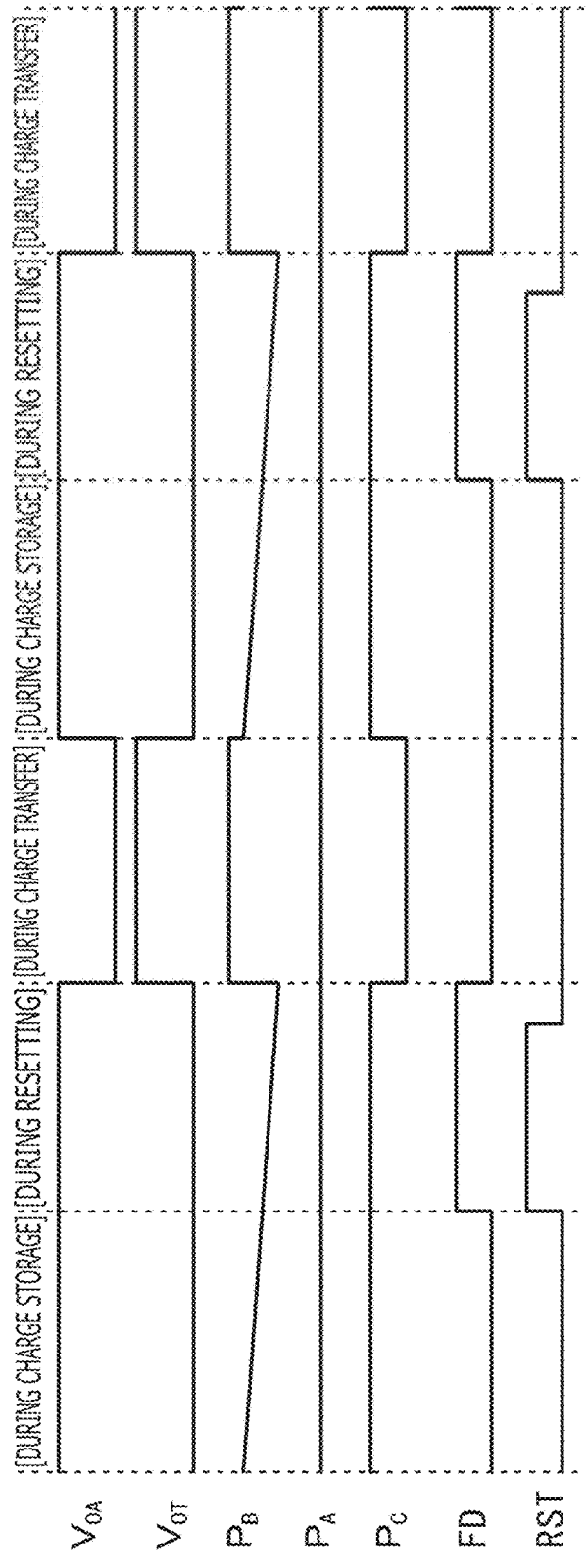

With reference to FIGS. 21 and 22, operations of the image pickup element of Embodiment 5 (first image pickup element 10) will be described below. Note that FIG. 21 and FIG. 22 differ from each other specifically in the values of the potential applied to the charge storage electrode 24 and the potential at the point Pc.

During the charge storage period, the drive circuit applies the potential $V_{11}$ to the first electrode 21, applies the potential $V_{31}$ to the charge storage electrode 24, and applies a potential $V_{51}$ to the transfer control electrode 25. Light incident on the photoelectric conversion layer 23A induces photoelectric conversion in the photoelectric conversion layer 23A. Holes generated by the photoelectric conversion are transmitted from the second electrode 22 to the drive circuit via the wiring Vou. On the other hand, since the first electrode 21 has a higher potential than the second electrode 22, in other words, for example, a positive potential is applied to the first electrode 21, whereas a negative potential is applied to the second electrode 22, it is assumed that $V_{31} > V_{51}$ (for example, $V_{31} > V_{11} > V_{51}$ or $V_{11} > V_{31} > V_{51}$) is satisfied. Accordingly, electrons generated by the photoelectric conversion are attracted to the charge storage electrode 24 and are lodged in the regions of the oxide semiconductor layer 23C and the like, which face the charge storage electrode 24. In other words, charge is stored in the oxide semiconductor layer 23C and the like. Since $V_{31} > V_{51}$ is satisfied, electrons generated inside the photoelectric conversion layer 23A can be reliably prevented from migrating toward the first electrode 21. As the time for the photoelectric conversion elapses, the regions of the oxide semiconductor layer 23C and the like, which face the charge storage electrode 24, have a potential with a more negative value.

During the later stage of the charge storage period, the reset operation is performed. This resets the potential of the first floating diffusion layer $FD_1$ to make the potential of the first floating diffusion layer $FD_1$ equal to the potential $V_{DD}$.

After the reset operation is complete, charge is read out. Specifically, during the charge transfer period, the drive circuit applies the potential $V_{12}$ to the first electrode 21, applies the potential $V_{32}$ to the charge storage electrode 24, and applies the potential $V_{52}$ to the transfer control electrode 25. Here, it is assumed that $V_{32} \leq V_{52} \leq V_{12}$ (preferably $V_{32} < V_{52} < V_{12}$) is satisfied. Thus, the electrons lodged in the regions of the oxide semiconductor layer 23C and the like, which face the charge storage electrode 24, are reliably read out to the first electrode 21 and further to the first floating diffusion layer $FD_1$. In other words, the charge stored in the oxide semiconductor layer 23C and the like is read out to the control section.

The sequence of operations including the charge storage, reset operation, and charge transfer is complete as described above.

Operations of the amplifying transistor $TR1_{amp}$ and the selection transistor $TR1_{sel}$ after the read-out of electrons to the first floating diffusion layer $FD_1$ are the same as the corresponding operations of known transistors. Additionally, the sequence of operations of the second image pickup element 11 and the third image pickup element 12 including the charge storage, reset operation, and charge transfer is similar to the known sequence of operations including the charge storage, reset operation, and charge transfer.

Figure 23:
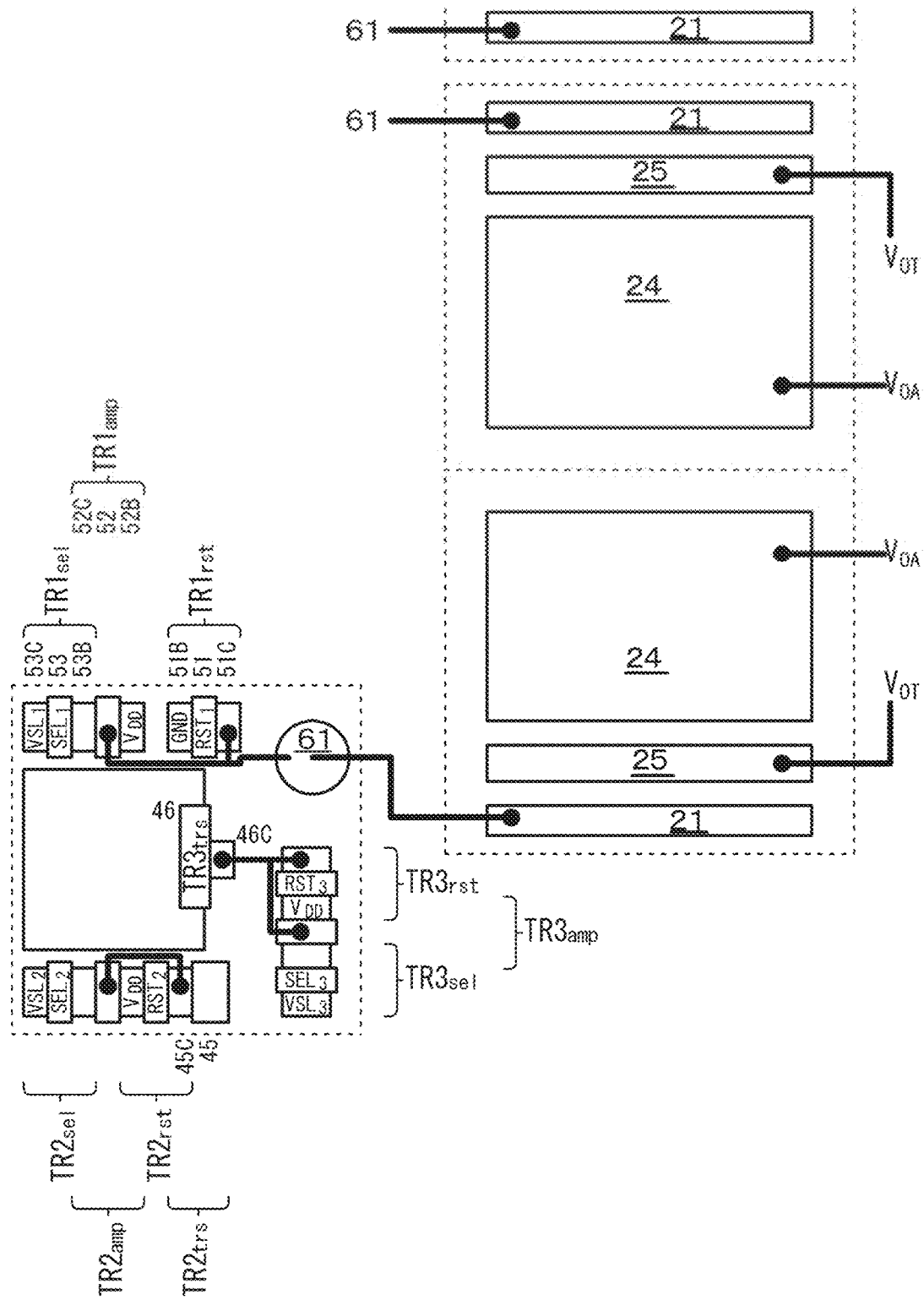
FIG. 23 is a schematic layout diagram of a first electrode, a transfer control electrode, and a charge storage electrode included in a modified example of the image pickup element of Embodiment 5, and transistors included in a control section.

As illustrated in FIG. 23 depicting a schematic layout diagram of a first electrode and a charge storage electrode included in a modified example of the image pickup element of Embodiment 5 and transistors included in a control section, the other source/drain region 51B of the reset transistor $TR1_{rst}$ may be grounded instead of being connected to the power supply $V_{DD}$.

Additionally, a plurality of transfer control electrodes may be provided and arranged from a position closest to the first electrode 21 toward the charge storage electrode 24.

Embodiment 6

Figure 24:
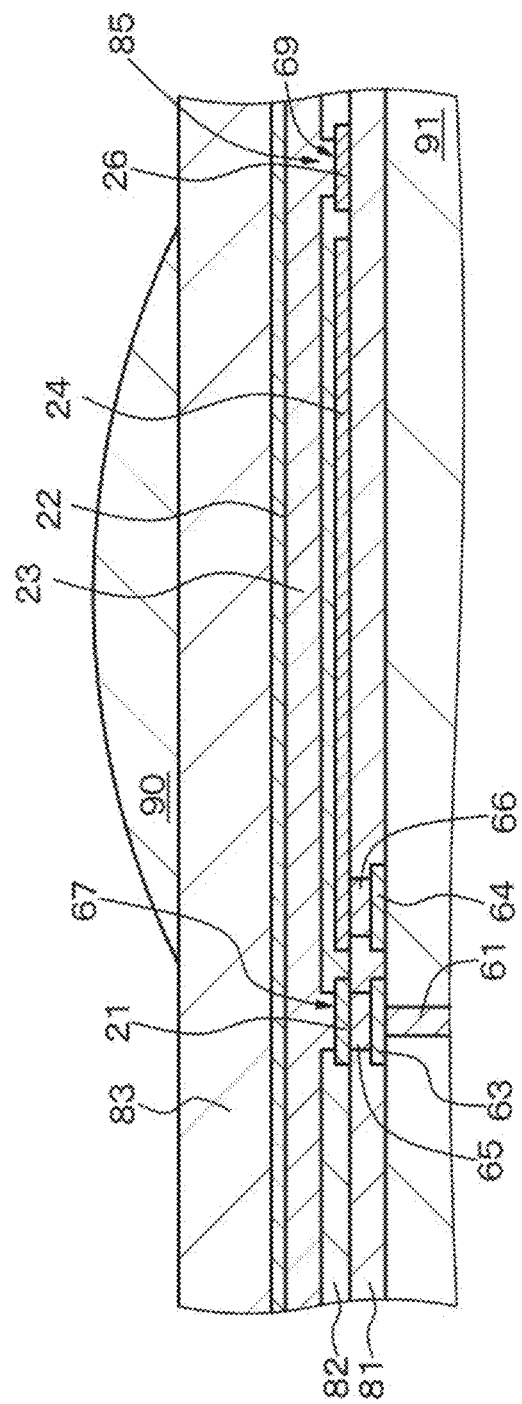
FIG. 24 is a schematic partial cross-sectional view of a part of an image pickup element of Embodiment 6.
Figure 25:
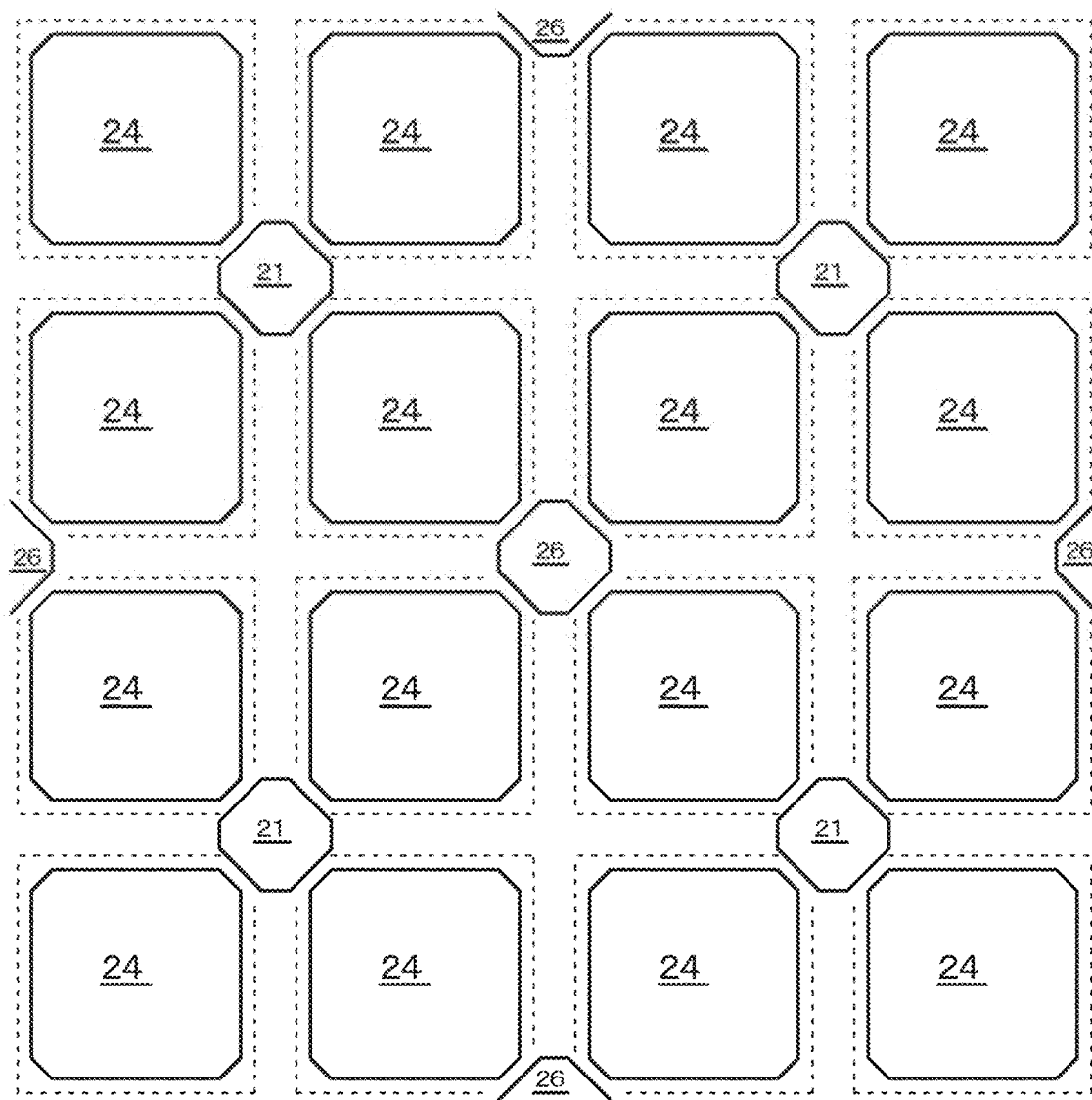
FIG. 25 is a schematic layout diagram of a first electrode, a charge storage electrode, and a charge emission electrode included in a photoelectric conversion section including a charge storage electrode in the image pickup element of Embodiment 6.

Embodiment 6 is a modification of Embodiments 1 to 5 and relates to the image pickup element and the like including the charge emission electrode according to the present disclosure. FIG. 24 depicts a schematic partial cross-sectional view of a part of the image pickup element of Embodiment 6, and FIG. 25 depicts a layout diagram of a first electrode, a charge storage electrode, and a charge emission electrode included in a photoelectric conversion section including the charge storage electrode in the image pickup element of Embodiment 6.

The image pickup element of Embodiment 6 further includes a charge emission electrode 26 connected to the oxide semiconductor layer 23C via a connection section 69 and disposed with a space from the first electrode 21 and the charge storage electrode 24. Here, the charge emission electrode 26 is disposed so as to surround the first electrode 21 and the charge storage electrode 24 (that is, like a frame). The charge emission electrode 26 is connected to a pixel drive circuit included in a drive circuit. The oxide semiconductor layer 23C and the oxide film 23B extend through the connection section 69. Specifically, the oxide semiconductor layer 23C and the oxide film 23B extend through a second opening 85 provided in the insulating layer 82 and are connected to the charge emission electrode 26. The charge emission electrode 26 is shared by (is common to) a plurality of image pickup elements. A slope flaring upward may be formed on a side surface of the second opening 85. The charge emission electrode 26 can be used, for example, for floating diffusion in the photoelectric conversion section or as an overflow drain of the photoelectric conversion section.

In Embodiment 6, during the charge storage period, the drive circuit applies the potential $V_{11}$ to the first electrode 21, applies the potential $V_{31}$ to the charge storage electrode 24, and applies the potential $V_{61}$ to the charge emission electrode 26, and then, charge is stored in the oxide semiconductor layer 23C and the like. Light incident on the photoelectric conversion layer 23A induces photoelectric conversion in the photoelectric conversion layer 23A. Holes generated by the photoelectric conversion are transmitted from the second electrode 22 to the drive circuit via the wiring Vou. On the other hand, since the first electrode 21 has a higher potential than the second electrode 22, in other words, for example, a positive potential is applied to the first electrode 21, whereas a negative potential is applied to the second electrode 22, it is assumed that $V_{61} > V_{11}$ (for example, $V_{31} > V_{61} > V_{11}$) is satisfied. Accordingly, electrons generated by the photoelectric conversion are attracted to the charge storage electrode 24 and are lodged in regions of the oxide semiconductor layer 23C and the like, which face the charge storage electrode 24, and the electrons can be reliably prevented from migrating toward the first electrode 21. However, electrons having failed to be sufficiently attracted to the charge storage electrode 24 or to be fully stored in the oxide semiconductor layer 23C and the like (what is called overflowing electrons) are transmitted to the drive circuit via the charge emission electrode 26.

During the later stage of the charge storage period, the reset operation is performed. This resets the potential of the first floating diffusion layer $FD_1$ to make the potential of the first floating diffusion layer $FD_1$ equal to the potential $V_{DD}$.

After the reset operation is complete, charge is read out. Specifically, during the charge transfer period, the drive circuit applies the potential $V_{12}$ to the first electrode 21, applies the potential $V_{32}$ to the charge storage electrode 24, and applies the potential $V_{62}$ to the charge emission electrode 26. Here, it is assumed that $V_{62} < V_{12}$ (preferably $V_{62} < V_{32} < V_{12}$) is satisfied. Thus, the electrons lodged in the regions of the oxide semiconductor layer 23C and the like, which face the charge storage electrode 24, are reliably read out to the first electrode 21 and further to the first floating diffusion layer $FD_1$. In other words, the charge stored in the oxide semiconductor layer 23C and the like is read out to the control section.

The sequence of operations including the charge storage, reset operation, and charge transfer is complete as described above.

Operations of the amplifying transistor $TR1_{amp}$ and the selection transistor $TR1_{sel}$ after the read-out of electrons to the first floating diffusion layer $FD_1$ are the same as the corresponding operations of known transistors. Additionally, the sequence of operations of the second image pickup element and the third image pickup element including the charge storage, reset operation, and charge transfer is similar to the known sequence of operations including the charge storage, reset operation, and charge transfer.

In Embodiment 6, what is called overflowing electrons are transmitted to the drive circuit via the charge emission electrode 26, so that leakage from the adjacent pixels to the charge storage sections can be prevented and possible blooming can also be inhibited. This allows the image pickup performance of the image pickup element to be improved.

Embodiment 7

Figure 26:
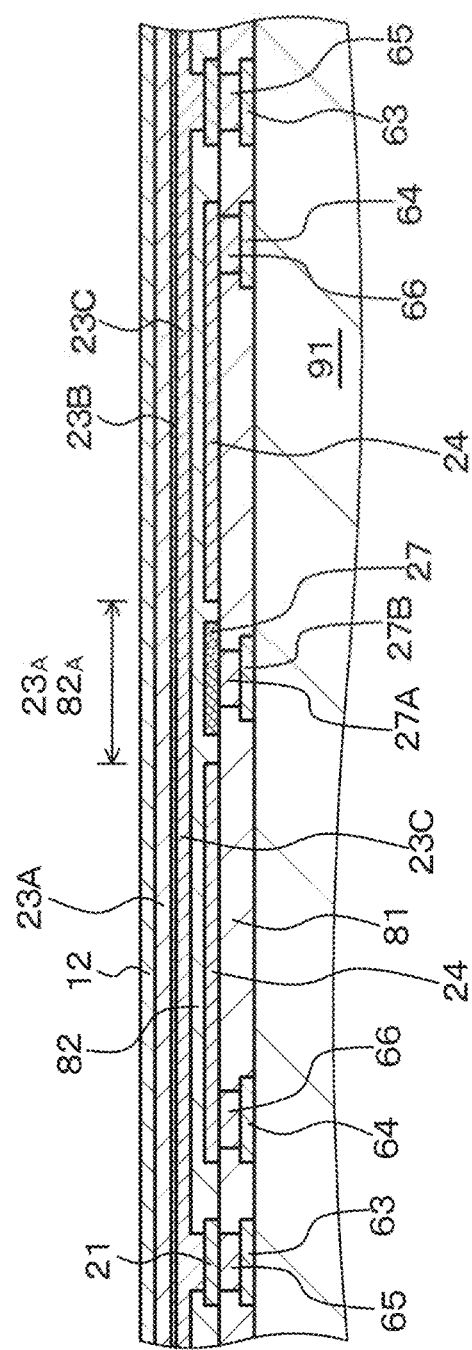
FIG. 26 is a schematic cross-sectional view of a part of an image pickup element of Embodiment 7 (two juxtaposed image pickup elements).
Figure 27:
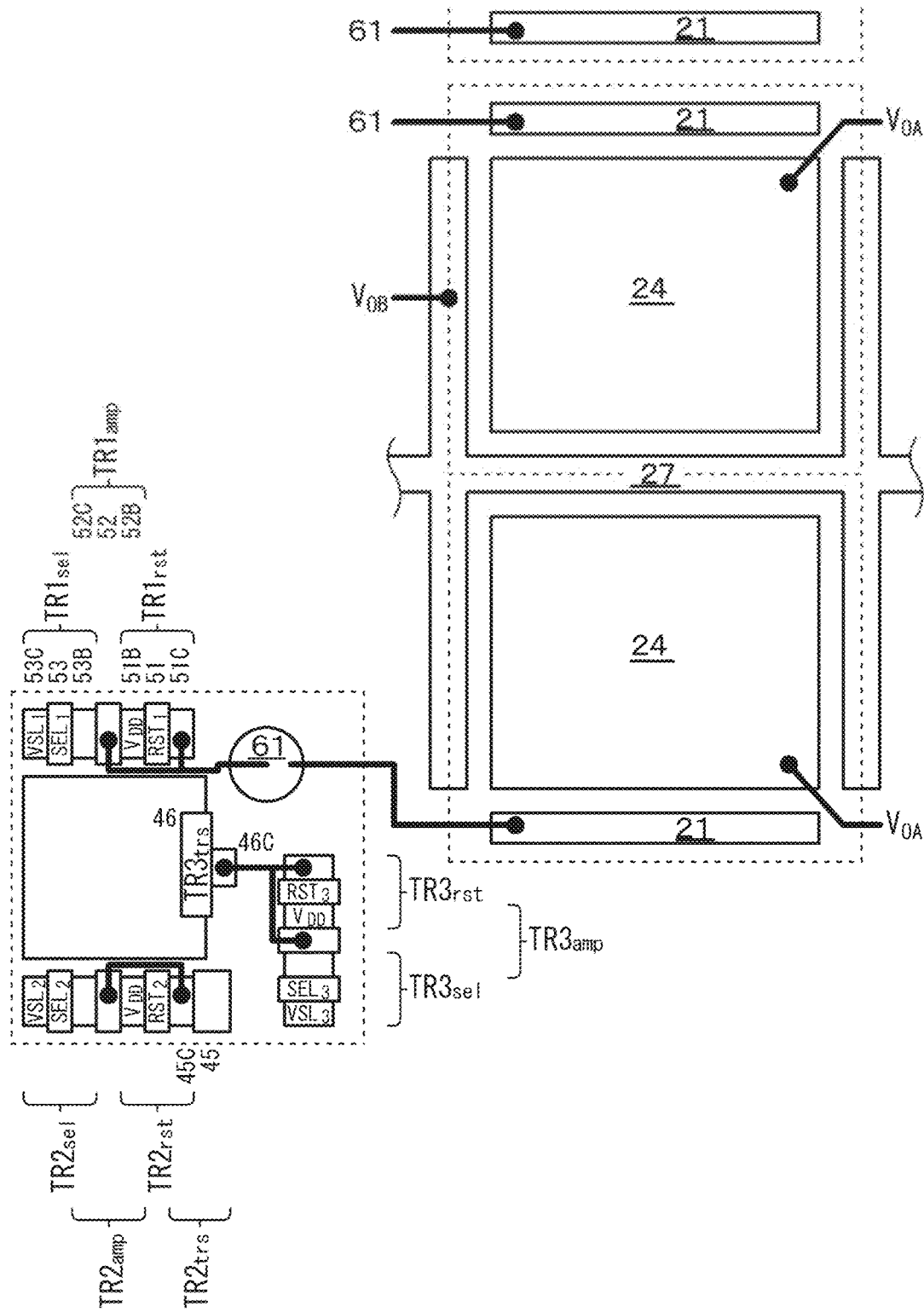
FIG. 27 is a schematic layout diagram of a first electrode, a charge storage electrode, and the like included in the image pickup element of Embodiment 7, and transistors included in a control section.
Figure 28:
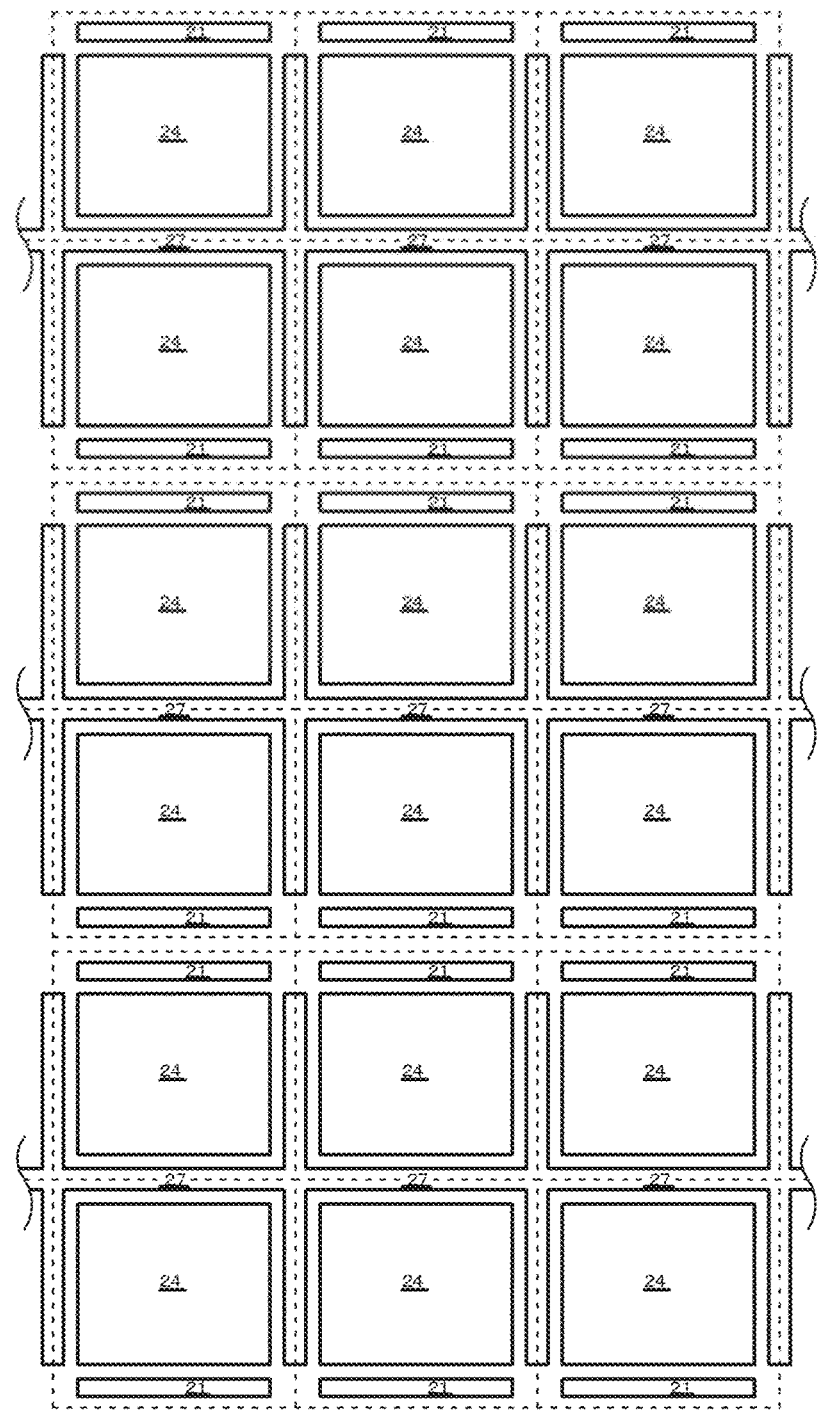
FIG. 28 is a schematic layout diagram of the first electrode, the charge storage electrode, and the like included in the image pickup element of Embodiment 7.
Figure 29:
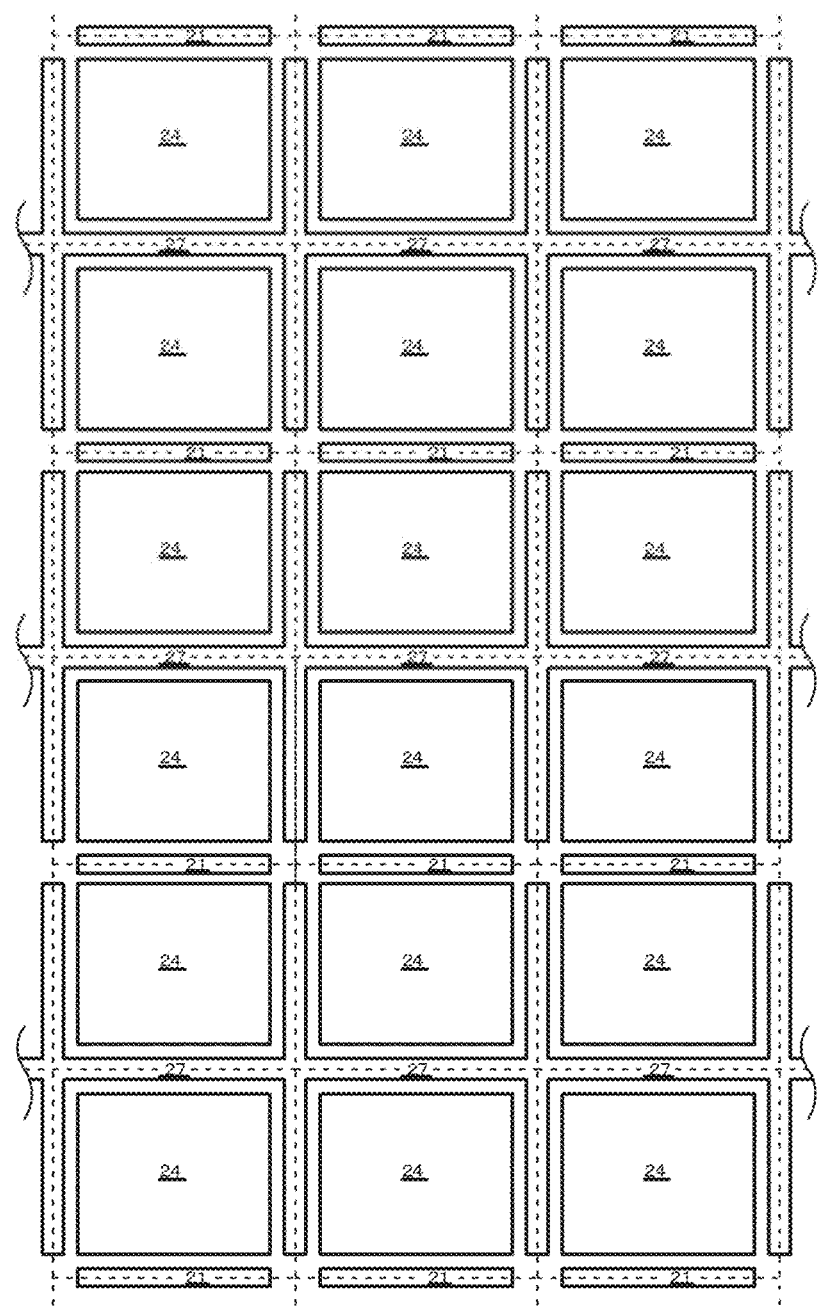
FIG. 29 is a schematic layout diagram of a modified example of the first electrode, the charge storage electrode, and the like included in the image pickup element of Embodiment 7.

Embodiment 7 is a modification of Embodiments 1 to 6 and relates to the image pickup element and the like including the charge transfer control electrode of the present disclosure, and specifically to the image pickup element and the like including the lower charge transfer control electrode (downside charge transfer control electrode) of the present disclosure. FIG. 26 depicts a schematic partial cross-sectional view of a part of the image pickup element of Embodiment 7. FIG. 27 depicts a schematic layout diagram of a first electrode and a charge storage electrode included in the image pickup element of Embodiment 7 and transistors included in a control section. FIGS. 28 and 29 are schematic layout diagrams of a first electrode, a charge storage electrode, and a lower charge transfer control electrode included in a photoelectric conversion section including the charge storage electrode in the image pickup element of Embodiment 7.

In the image pickup element of Embodiment 7, a lower charge transfer control electrode 27 is formed in a region facing, across the insulating layer 82, a region (region -A of the photoelectric conversion layer) 23A of the photoelectric conversion stack 23 located between adjacent image pickup elements. In other words, the lower charge transfer control electrode 27 is formed below a portion (region -A of the insulating layer 82) 82A of the insulating layer 82 in a region (region-a) sandwiched between the charge storage electrode 24 and the charge storage electrode 24 included in the respective adjacent image pickup elements. The lower charge transfer control electrode 27 is spaced apart from the charge storage electrode 24. Alternatively, in other words, the lower charge transfer control electrode 27 surrounds the charge storage electrode 24 with a space from the charge storage electrode 24 and is disposed so as to face the region -A (23A) of the photoelectric conversion layer across the insulating layer 82. The lower charge transfer control electrode 27 is shared by image pickup elements. The lower charge transfer control electrode 27 is also connected to the drive circuit. Specifically, the lower charge transfer control electrode 27 is connected to the vertical drive circuit 112 included in the drive circuit, via a connection hole 27A, a pad portion 27B, and wiring Vag provided in the interlayer insulating layer 81. The lower charge transfer control electrode 27 may be formed at the same level as that of the first electrode 21 or the charge storage electrode 24 or at a level different from the level of the first electrode 21 or the charge storage electrode 24 (specifically, at a level below the first electrode 21 or the charge storage electrode 24). In the former case, the distance between the charge transfer control electrode 27 and the photoelectric conversion layer 23A can be reduced, facilitating control of the potential. On the other hand, the latter case enables a reduction in the distance between the charge transfer control electrode 27 and the charge storage electrode 24 and is thus advantageous for miniaturization.

In the image pickup element of Embodiment 7, when light is incident on the photoelectric conversion layer 23A to induce photoelectric conversion in the photoelectric conversion layer 23A, charge generated by the photoelectric conversion is powerfully attracted to a portion of the oxide semiconductor layer 23C facing the charge storage electrode 24 because a potential applied to a portion of the photoelectric conversion layer 23A facing the charge storage electrode 24 has a larger absolute value than a potential applied to the region -A of the photoelectric conversion layer 23A. This allows suppression of flow of the charge generated by the photoelectric conversion into the adjacent image pickup elements, preventing the quality of captured videos (images) from being degraded. Alternatively, the lower charge transfer control electrode 27 is formed in the region facing the region -A of the photoelectric conversion layer 23A across the insulating layer, allowing control of an electric field and the potential of the region -A of the photoelectric conversion layer 23A located above the lower charge transfer control electrode 27. As a result, the lower charge transfer control electrode 27 allows suppression of flow of the charge generated by the photoelectric conversion into the adjacent image pickup elements, preventing the quality of captured videos (images) from being degraded.

Figure 30:
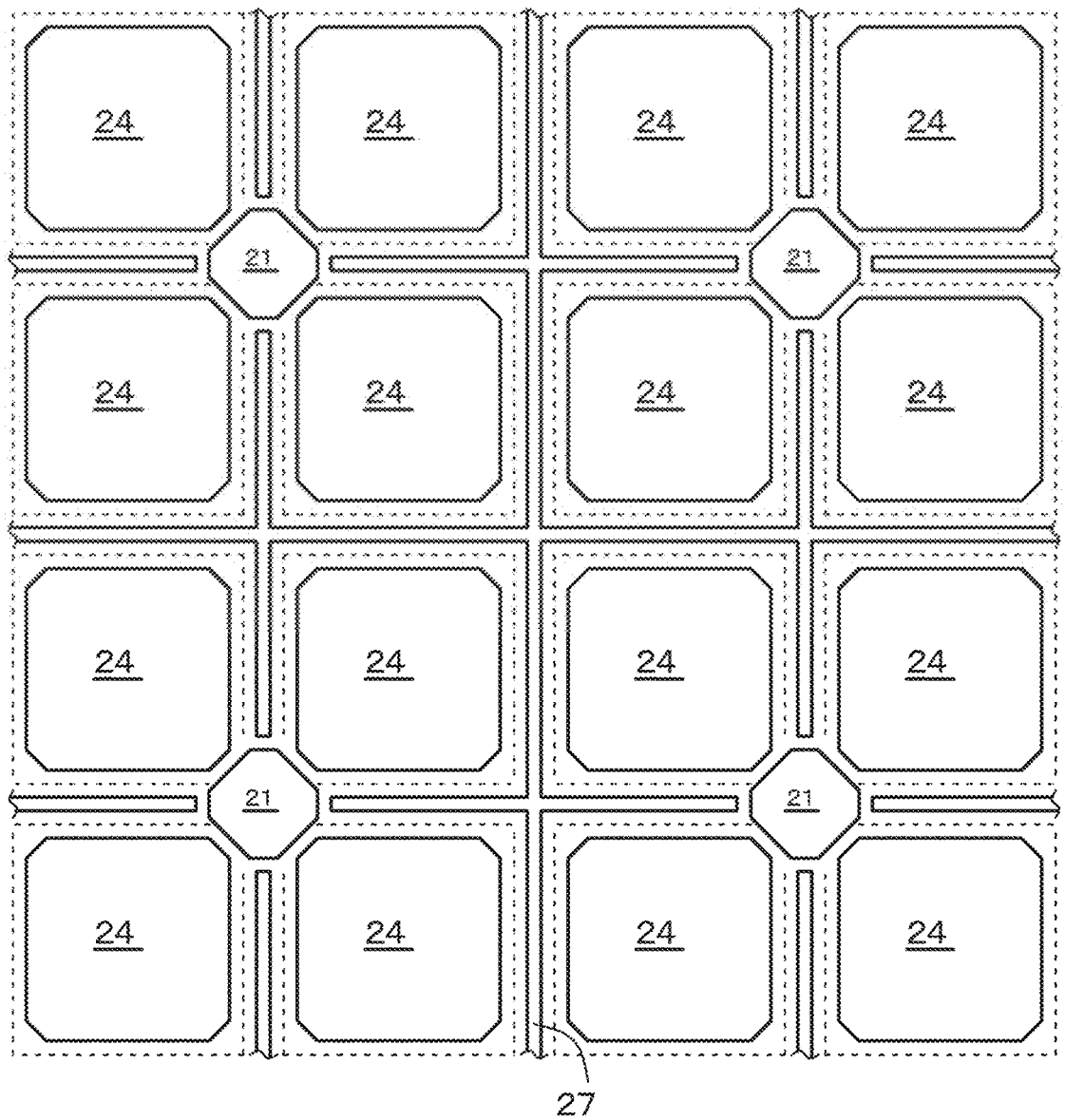
FIG. 30 is a schematic layout diagram of a modified example of the first electrode, the charge storage electrode, and the like included in the image pickup element of Embodiment 7.
Figure 31A:
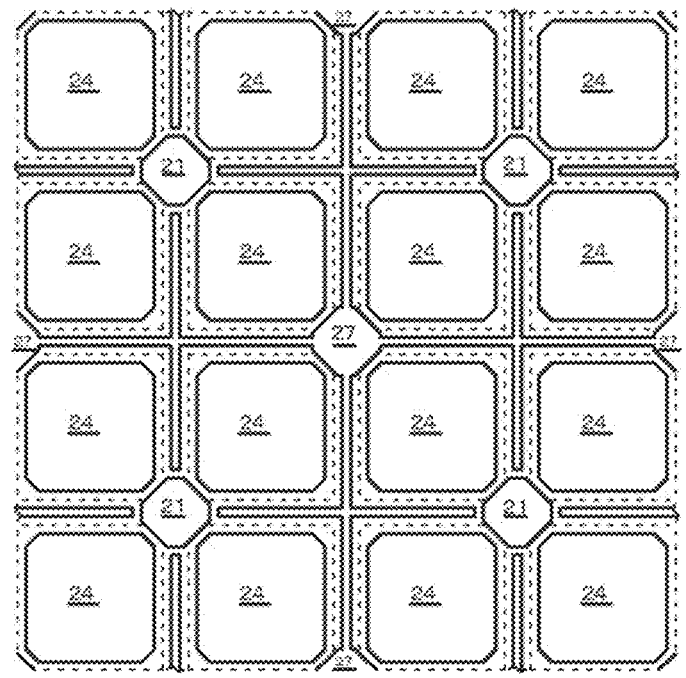
FIGS. 31A and 31B are schematic layout diagrams of modified examples of the first electrode, the charge storage electrode, and the like included in the image pickup element of Embodiment 7.

In an example depicted in FIGS. 28 and 29, the lower charge transfer control electrode 27 is formed below the portion 82A of the insulating layer 82 in the region (region -a) sandwiched between the charge storage electrode 24 and the charge storage electrode 24. On the other hand, in an example depicted in FIGS. 30, 31A, and 31B, the lower charge transfer control electrode 27 is formed below a portion of the insulating layer 82 in the region surrounded by four charge storage electrodes 24. Note that the example depicted in FIGS. 30, 31A, and 31B corresponds to the solid image pickup apparatuses of the first and second configurations. In four image pickup elements, one first electrode 21 is provided so as to correspond to four charge storage electrodes 24.

Figure 31B:
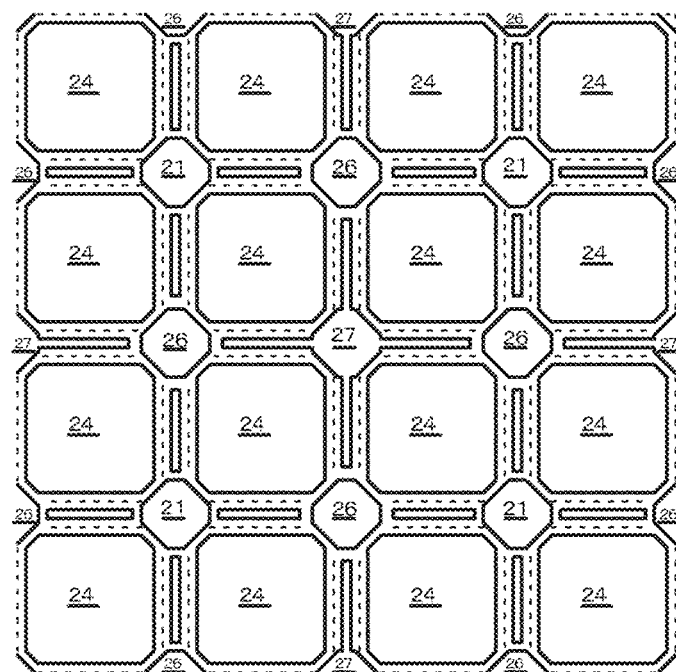

In an example depicted in FIG. 31B, in four image pickup elements, one first electrode 21 is provided so as to correspond to four charge storage electrodes 24. The lower charge transfer control electrode 27 is formed below a portion of the insulating layer 82 in the region surrounded by four charge storage electrodes 24. Further, the charge emission electrode 26 is formed below a portion of the insulating layer 82 in the region surrounded by four charge storage electrodes 24. As described above, the charge emission electrode 26 can be used, for example, for floating diffusion in the photoelectric conversion section or as an overflow drain of the photoelectric conversion section.

Embodiment 8

Figure 32:
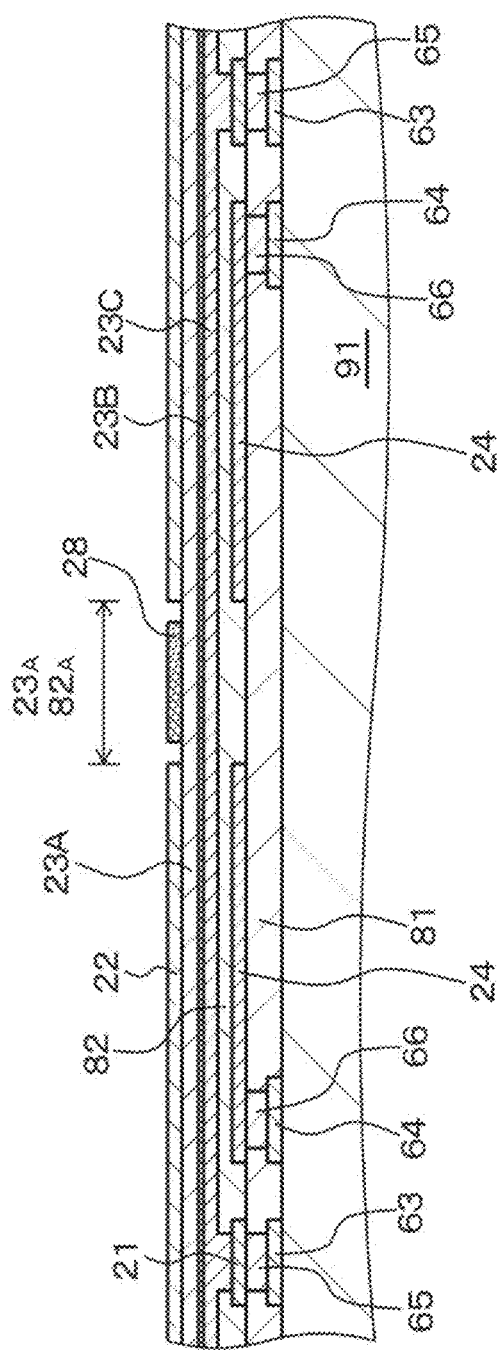
FIG. 32 is a schematic cross-sectional view of a part of an image pickup element of Embodiment 8 (two juxtaposed image pickup elements).
Figure 34:
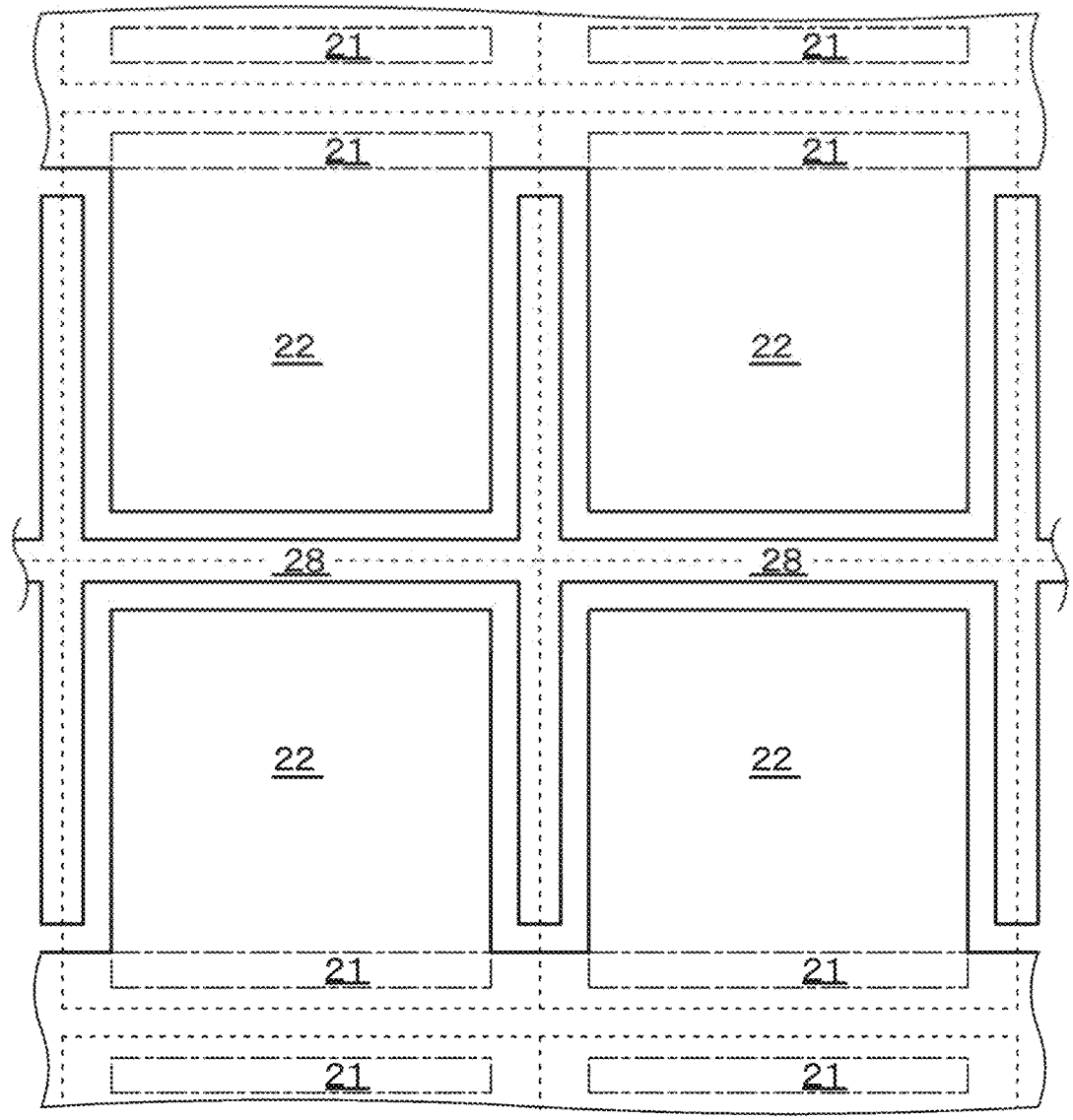
FIG. 34 is a schematic plan view of a part of the image pickup element of Embodiment 8 (2×2 juxtaposed image pickup elements).
Figure 35:
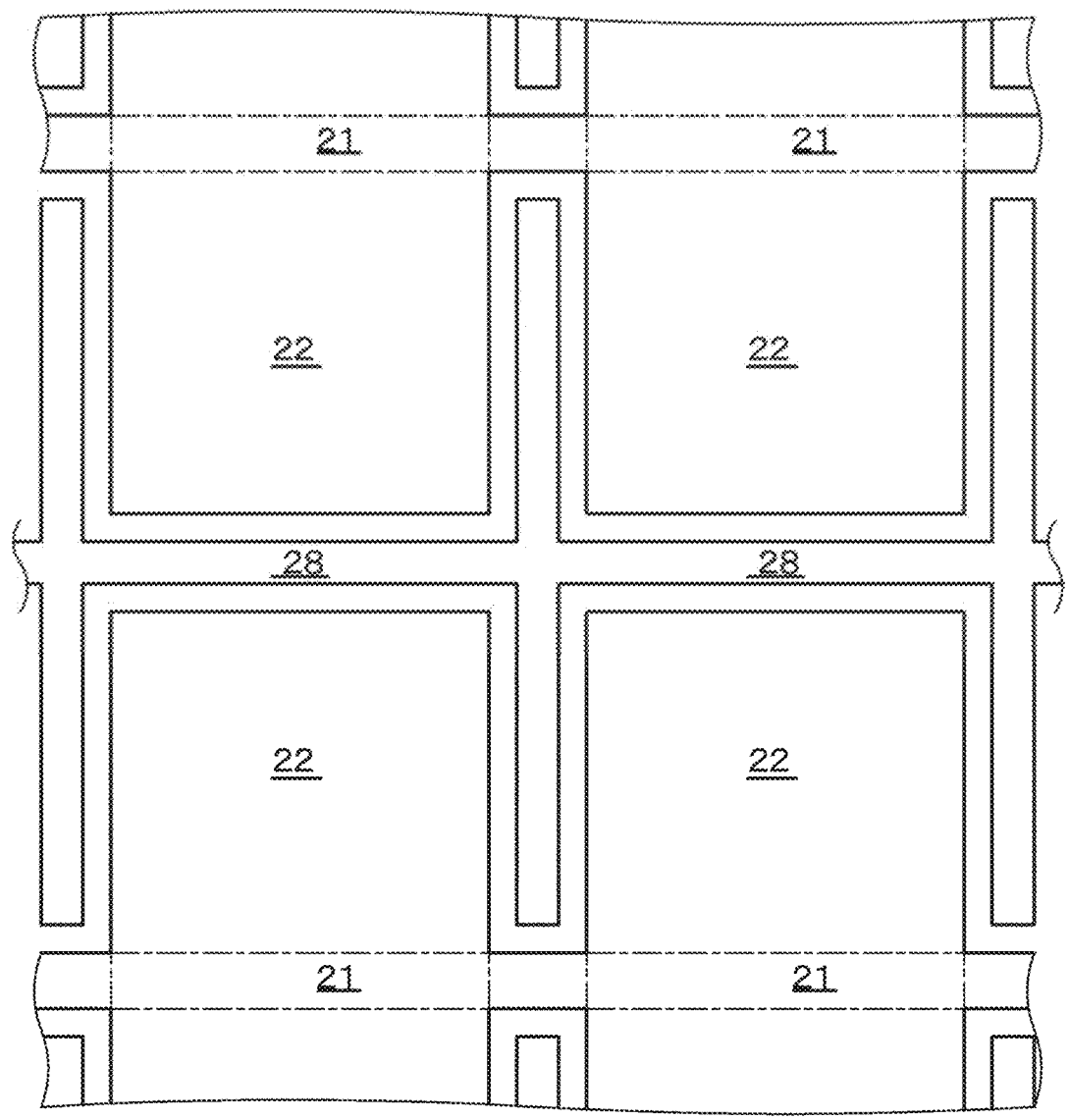
FIG. 35 is a schematic plan view of a part of a modified example of the image pickup element of Embodiment 8 (2×2 juxtaposed image pickup elements).

Embodiment 8 is a modification of Embodiments 1 to 7 and relates to the image pickup element and the like including the upper charge transfer control electrode (upside charge transfer control electrode) according to the present disclosure. FIG. 32 depicts a schematic cross-sectional view of a part of the image pickup element of Embodiment 8 (two juxtaposed image pickup elements), and FIGS. 34 and 35 depict plan views of a part of the image pickup element of Embodiment 8 (2×2 image pickup elements). In the image pickup element of Embodiment 8, instead of the second electrode 22, the upper charge transfer control electrode 28 is formed on the region $23_A$ of the photoelectric conversion stack 23 located between adjacent image pickup elements. The upper charge transfer control electrode 28 is spaced apart from the second electrode 22. In other words, the second electrode 22 is provided for each image pickup element, and the upper charge transfer control electrode 28 surrounds at least a part of the second electrode 22 with a space from the second electrode 22 and is formed on the region -A of the photoelectric conversion stack 23. The upper charge transfer control electrode 28 is formed at the same level as that of the second electrode 22.

Figure 33A:
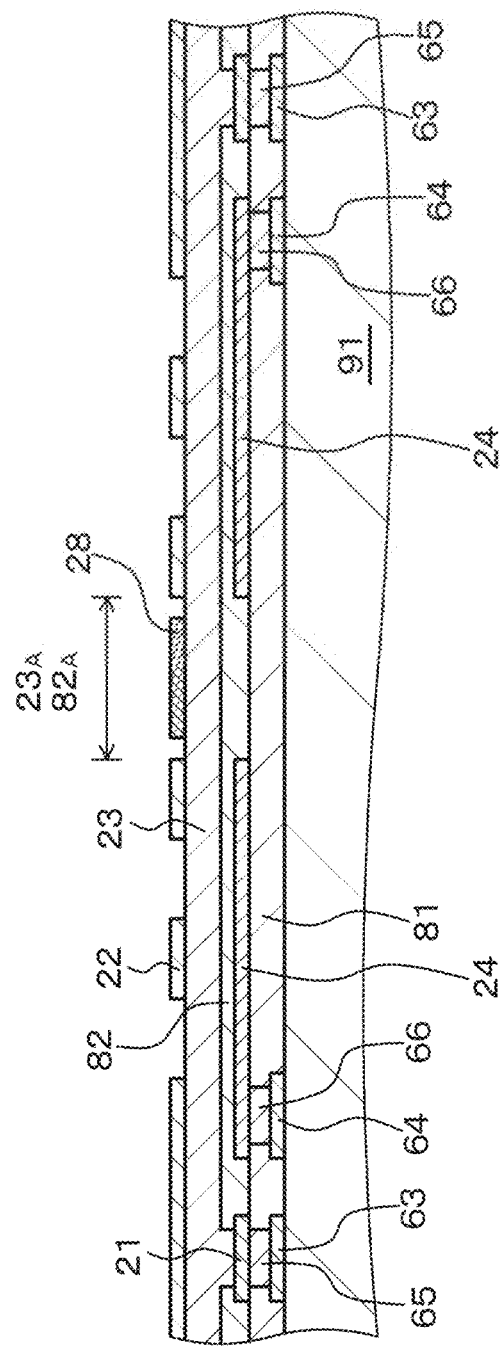
FIGS. 33A and 33B are schematic cross-sectional views of parts of modified examples of the image pickup element of Embodiment 8 (two juxtaposed image pickup elements).
Figure 33B:
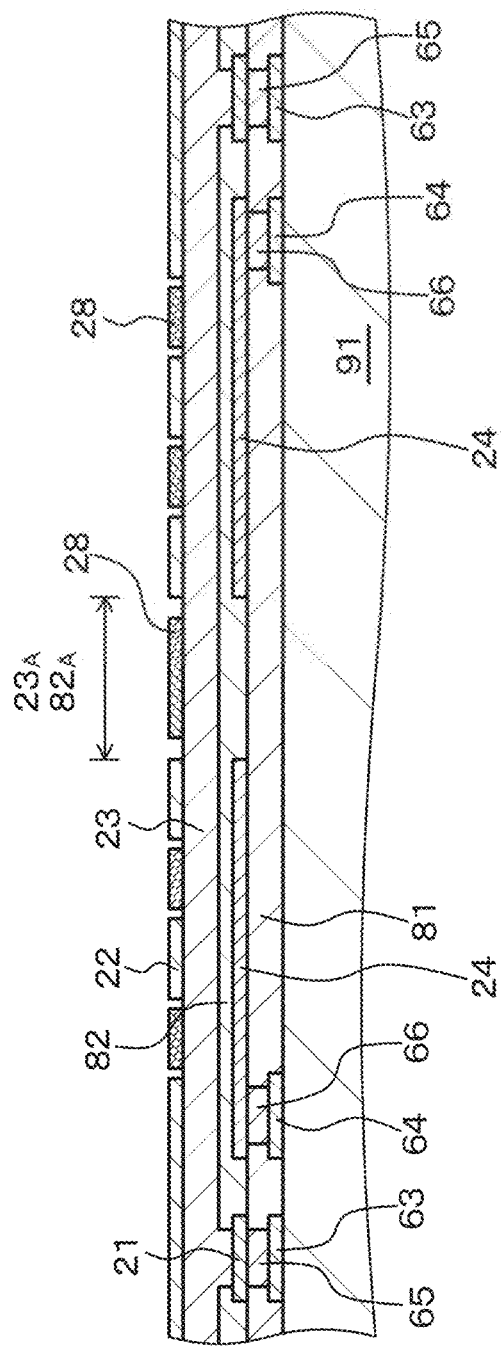

Additionally, as illustrated in FIG. 33A depicting a schematic cross-sectional view of a part of the image pickup element of Embodiment 8 (two juxtaposed image pickup elements), the second electrode 22 may be divided into a plurality of pieces, and different potentials may be applied to the respective pieces of the second electrode 22. Further, as illustrated in FIG. 33B, the upper charge transfer control electrode 28 may be provided between the pieces of the second electrode 22 resulting from the division.

In an example depicted in FIG. 34, in one image pickup element, one charge storage electrode 24 is provided so as to correspond to one first electrode 21. On the other hand, in a modified example depicted in FIG. 35, in two image pickup elements, one common first electrode 21 is provided so as to correspond to two charge storage electrodes 24. A schematic cross-sectional view of a part of the image pickup element of Embodiment 8 depicted in FIG. 32 (two juxtaposed image pickup elements) corresponds to FIG. 35.

In Embodiment 8, each of the second electrodes 22 located on the light incidence side is shared by the image pickup elements arranged in the lateral direction of the sheet of FIG. 34 and is shared by a pair of image pickup elements arranged in the vertical direction of the sheet of FIG. 34. Additionally, each of the upper charge transfer control electrodes 28 is shared by the image pickup elements arranged in the lateral direction of the sheet of FIG. 34 and is shared by a pair of image pickup elements arranged in the vertical direction of the sheet of FIG. 34. The second electrode 22 and the upper charge transfer control electrode 28 can be obtained by forming, on the photoelectric conversion stack 23, material layers included in the second electrode 22 and the upper charge transfer control electrode 28 and then patterning the material layers. The second electrodes 22 and the upper charge transfer control electrodes 28 are connected to the respective wires (not depicted) individually, which are connected to the drive circuit. Each of the wires connected to the second electrodes 22 is shared by a plurality of image pickup elements. Each of the wires connected to the upper charge transfer control electrodes 28 is also shared by a plurality of image pickup elements.

In the image pickup element of Embodiment 8, during the charge storage period, the drive circuit applies the potential $V_{21}$ to the second electrode 22, applies the potential $V_{41}$ to the upper charge transfer control electrode 28, and stores charge in the photoelectric conversion stack 23. During the charge transfer period, the drive circuit applies the potential $V_{22}$ to the second electrode 22, applies the potential $V_{42}$ to the upper charge transfer control electrode 28, and reads out the charge stored in the photoelectric conversion stack 23 to the control section via the first electrode 21. Here, since the first electrode 21 has a higher potential than the second electrode 22, $V_{21} \geq V_{41}$ and $V_{22} \geq V_{42}$ are satisfied.

In the image pickup element of Embodiment 8, instead of the second electrode, the charge transfer control electrode is formed on the region of the photoelectric conversion layer located between adjacent image pickup elements, as described above. Consequently, the charge transfer control electrode can suppress the flow of charge generated by photoelectric conversion into the adjacent image pickup elements, preventing the quality of captured videos (images) from being degraded.

Figure 37A:
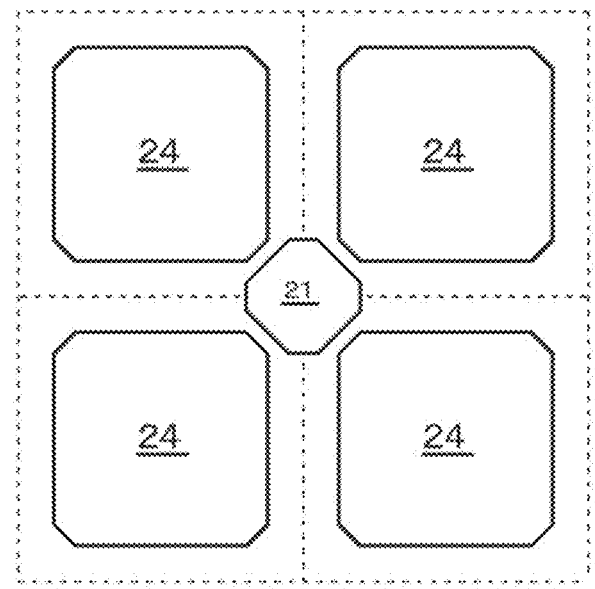
FIGS. 37A and 37B are schematic plan views of parts of modified examples of the image pickup element of Embodiment 8.
Figure 37B:
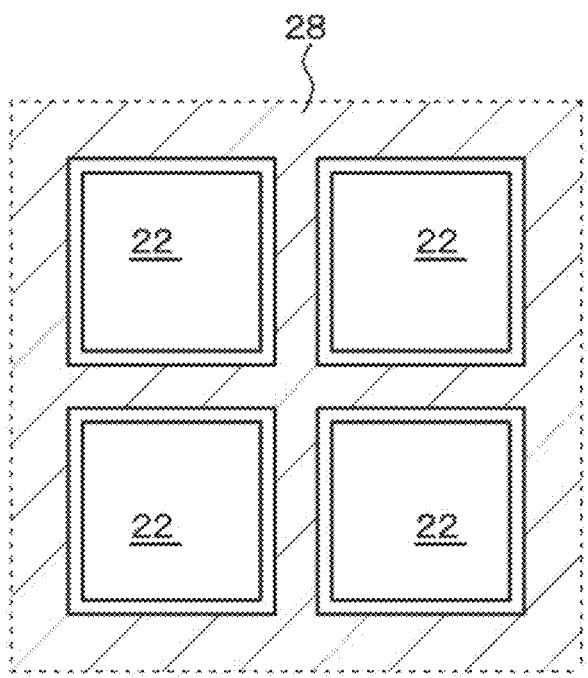

FIG. 36A depicts a schematic cross-sectional view of a part of a modified example of the image pickup element of Embodiment 8 (two juxtaposed image pickup elements), and FIGS. 37A and 37B depict schematic plan views of a part of the image pickup element. In this modified example, the second electrode 22 is provided for each image pickup element, the upper charge transfer control electrode 28 surrounds at least a part of the second electrode 22 and is spaced apart from the second electrode 22, and a part of the charge storage electrode 24 is present below the upper charge transfer control electrode 28. The second electrode 22 is provided above the charge storage electrode 24 and is smaller in size than the charge storage electrode 24.

Figure 38A:
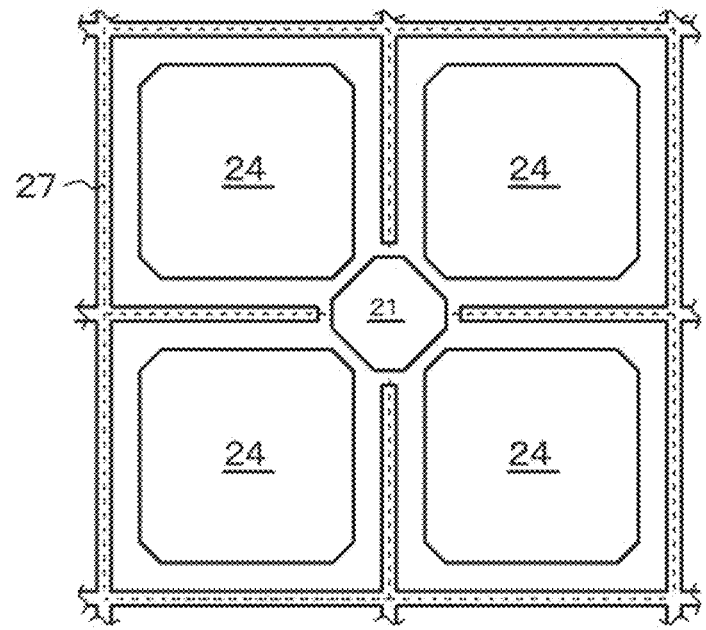
FIGS. 38A and 38B are schematic plan views of parts of modified examples of the image pickup element of Embodiment 8.
Figure 38B:
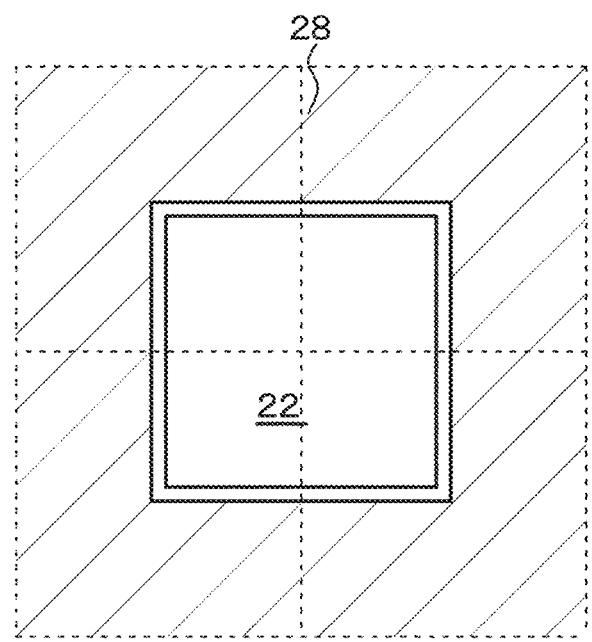

FIG. 36B depicts a schematic cross-sectional view of a part of a modified example of the image pickup element of Embodiment 8 (two juxtaposed image pickup elements), and FIGS. 38A and 38B depict schematic plan views of a part of the image pickup element. In this modified example, the second electrode 22 is provided for each image pickup element, and the upper charge transfer control electrode 28 surrounds at least a part of the second electrode 22 and is spaced apart from the second electrode 22. A part of the charge storage electrode 24 is present below the upper charge transfer control electrode 28, and the lower charge transfer control electrode (downside charge transfer control electrode) 27 is further provided below the upper charge transfer control electrode (upside charge transfer control electrode) 28. The second electrode 22 is smaller in size than the second electrode 22 in the modified example depicted in FIG. 36A. Specifically, a region of the second electrode 22 facing the upper charge transfer control electrode 28 is located closer to the first electrode 21 than the region of the second electrode 22 facing the upper charge transfer control electrode 28 in the modified example depicted in FIG. 36A. The charge storage electrode 24 is surrounded by the lower charge transfer control electrode 27.

The present disclosure has been described on the basis of the preferred embodiments but is not limited to the embodiments. The structures and configurations, manufacturing conditions, manufacturing methods, and materials used for the image pickup element, stacked image pickup element, and solid image pickup apparatus described in the embodiments are illustrative and can be changed as appropriate. The image pickup elements of the embodiments can be combined as appropriate. The configurations and structures of the image pickup element of the present disclosure can be applied to light emitting elements, for example, organic EL elements, and to channel formation regions of thin film transistors.

The floating diffusion layers $FD_1$, $FD_2$, $FD_3$, 51C, 45C, and 46C can possibly be shared as described above.

Figure 39:
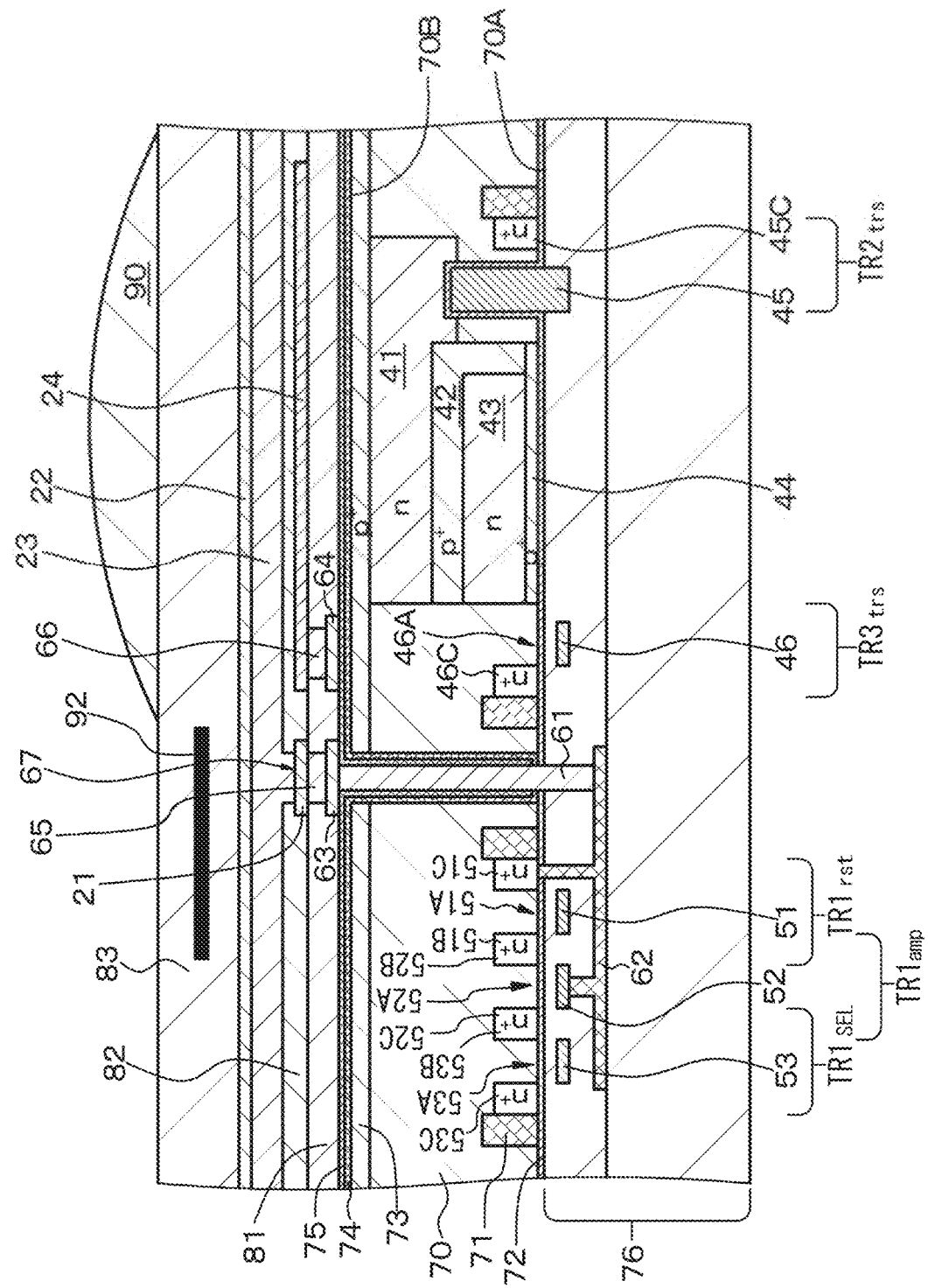
FIG. 39 is a schematic partial cross-sectional view of yet another modified example of the image pickup element and the stacked image pickup element of Embodiment 1.

Additionally, as depicted in FIG. 39, for example, in a modified example of the image pickup element and the stacked image pickup element described in Embodiment 1, the image pickup element and the stacked image pickup element can be configured such that light is incident from the second electrode 22 side and a light shielding layer 15 is formed on the light incidence side and closer to the second electrode 22. Note that the various wires provided on the light incidence side with respect to the photoelectric conversion layer can be caused to function as a light shielding layer.

Figure 40:
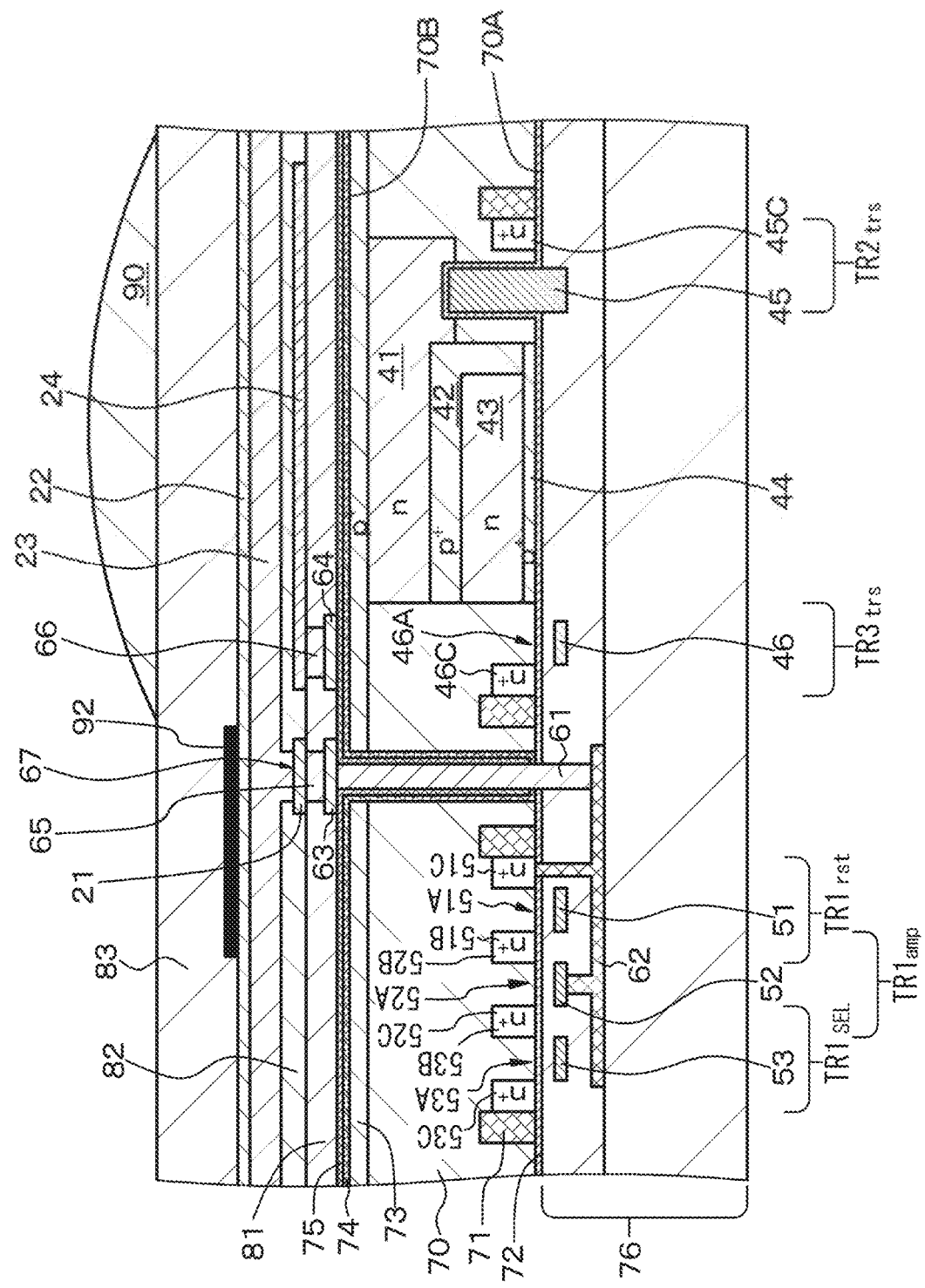
FIG. 40 is a schematic partial cross-sectional view of further another modified example of the image pickup element and the stacked image pickup element of Embodiment 1.
Figure 41:
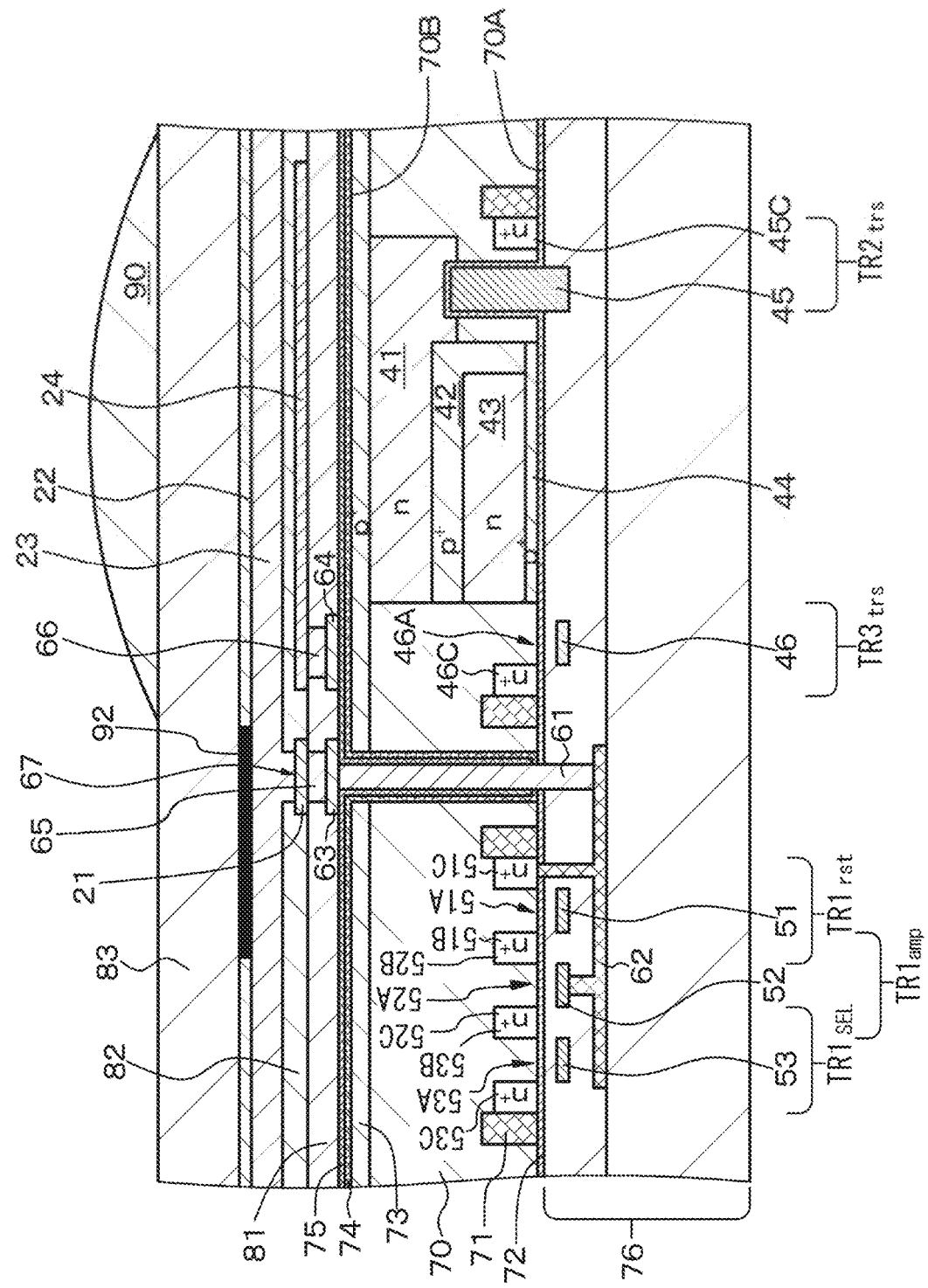
FIG. 41 is a schematic partial cross-sectional view of further another modified example of the image pickup element and the stacked image pickup element of Embodiment 1.

Note that, in the example depicted in FIG. 39, the light shielding layer 15 is formed above the second electrode 22, that is, the light shielding layer 15 is formed on the light incidence side and closer to the second electrode 22 and above the first electrode 21 but that the light shielding layer 15 may be disposed on the light incidence side surface of the second electrode 22 as depicted in FIG. 40. Additionally, as depicted in FIG. 41, the light shielding layer 15 may possibly be formed in the second electrode 22.

Figure 42:
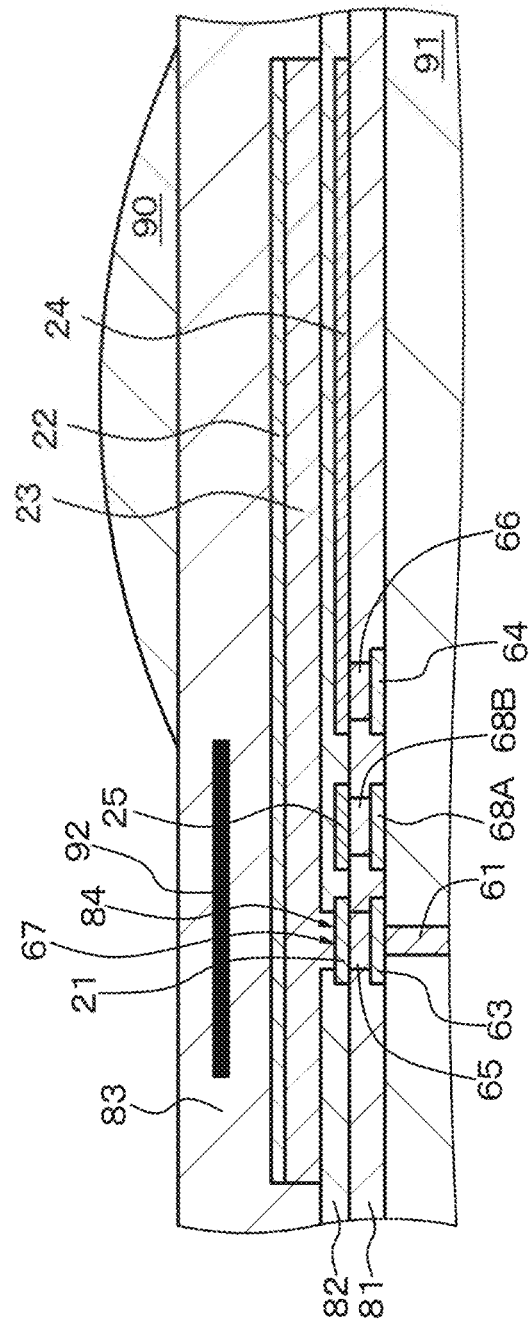
FIG. 42 is a schematic partial cross-sectional view of further another modified example of the image pickup element and the stacked image pickup element of Embodiment 1.
Figure 43:
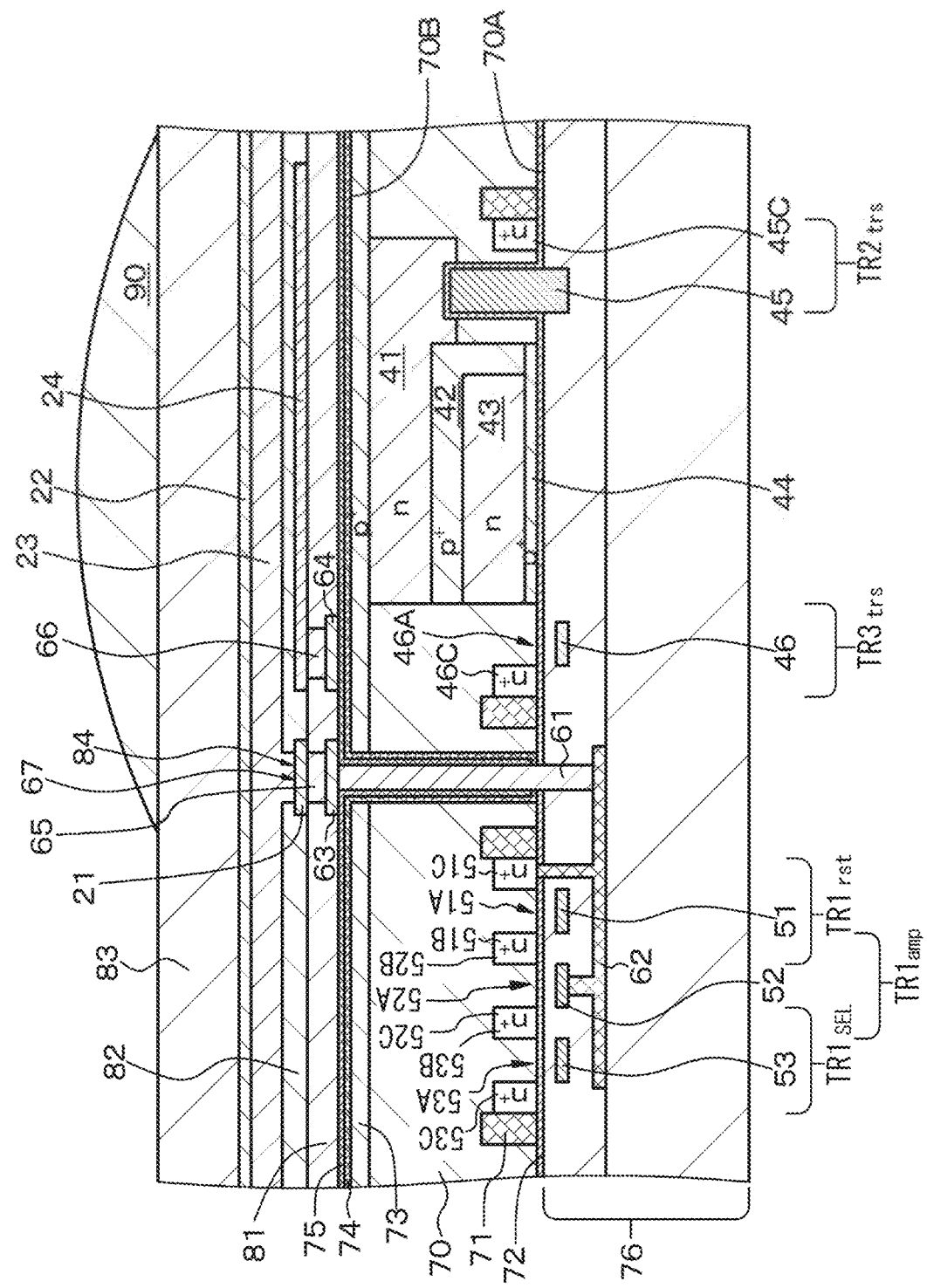
FIG. 43 is a schematic partial cross-sectional view of further another modified example of the image pickup element and the stacked image pickup element of Embodiment 1.

Alternatively, the structure may be arranged such that light is incident from the second electrode 22 side and such that no light is incident on the first electrode 21. Specifically, as illustrated in FIG. 39, the light shielding layer 15 is formed on the light incidence side and closer to the second electrode 22 and above the first electrode 21. Alternatively, as depicted in FIG. 43, the structure may be arranged such that the on-chip microlens 14 is provided above the charge storage electrode 24 and the second electrode 22 and such that light incident on the on-chip microlens 14 is focused on the charge storage electrode 24 and does not reach the first electrode 21. Note that the configuration may be arranged such that, in a case where the transfer control electrode 25 is provided, no light is incident on the first electrode 21 and the transfer control electrode 25 as described in Embodiment 5 and specifically that the structure may be arranged such that the light shielding layer 15 is formed above the first electrode 21 and the transfer control electrode 25 as depicted in FIG. 42. Alternatively, the structure may be arranged such that light incident on the on-chip microlens 14 does not reach the first electrode 21 or the first electrode 21 and the transfer control electrode 25.

When these configurations and structures are adopted or when the light shielding layer 15 is provided or the on-chip microlens 14 is designed such that light is incident only on the portion of the photoelectric conversion section located above the charge storage electrode 24, the portion of the photoelectric conversion section located above the first electrode 21 (or above the first electrode 21 and the transfer control electrode 25) does not contribute to photoelectric conversion. This allows all pixels to be reliably simultaneously reset to more easily achieve the global shutter function. In other words, a method for driving a solid image pickup apparatus including a plurality of the image pickup elements with these configurations and structures repeats the steps of in all the image pickup elements, simultaneously emitting charge in the first electrode 21 to the outside of the system while storing charge in the oxide semiconductor layer 23C and the like, and then, in all the image pickup elements, simultaneously transferring, to the first electrode 21, the charge stored in the oxide semiconductor layer 23C and the like, and after the transfer is complete, sequentially reading out the charge transferred to the first electrode 21 in each of the image pickup elements.

In such a driving method for the solid image pickup apparatuses, each of the image pickup elements has a structure in which light incident from the second electrode side does not enter the first electrode, and in all the image pickup elements, the charge in the first electrode is emitted to the outside of the system while charge is stored in the oxide semiconductor layer and the like. This allows the first electrode to be simultaneously reset in all the image pickup elements. Subsequently, in all the image pickup elements, the charge stored in the oxide semiconductor layer and the like is transferred to the first electrode, and after the transfer is complete, the charge transferred to the first electrode in each of the image pickup elements is read out. Consequently, what is called the global shutter function can be easily achieved.

In a case where one oxide semiconductor layer 23C and the oxide film 23B shared by a plurality of image pickup elements are formed, ends of the oxide semiconductor layer 23C and the oxide film 23B are desirably covered at least with the photoelectric conversion layer 23A in terms of protection of the ends of the oxide semiconductor layer 23C and the oxide film 23B. It is sufficient that the structure of the image pickup element in this case is arranged as illustrated at right ends of the oxide semiconductor layer 23C and the oxide film 23B in FIG. 2 depicting a schematic cross-sectional view.

Figure 44:
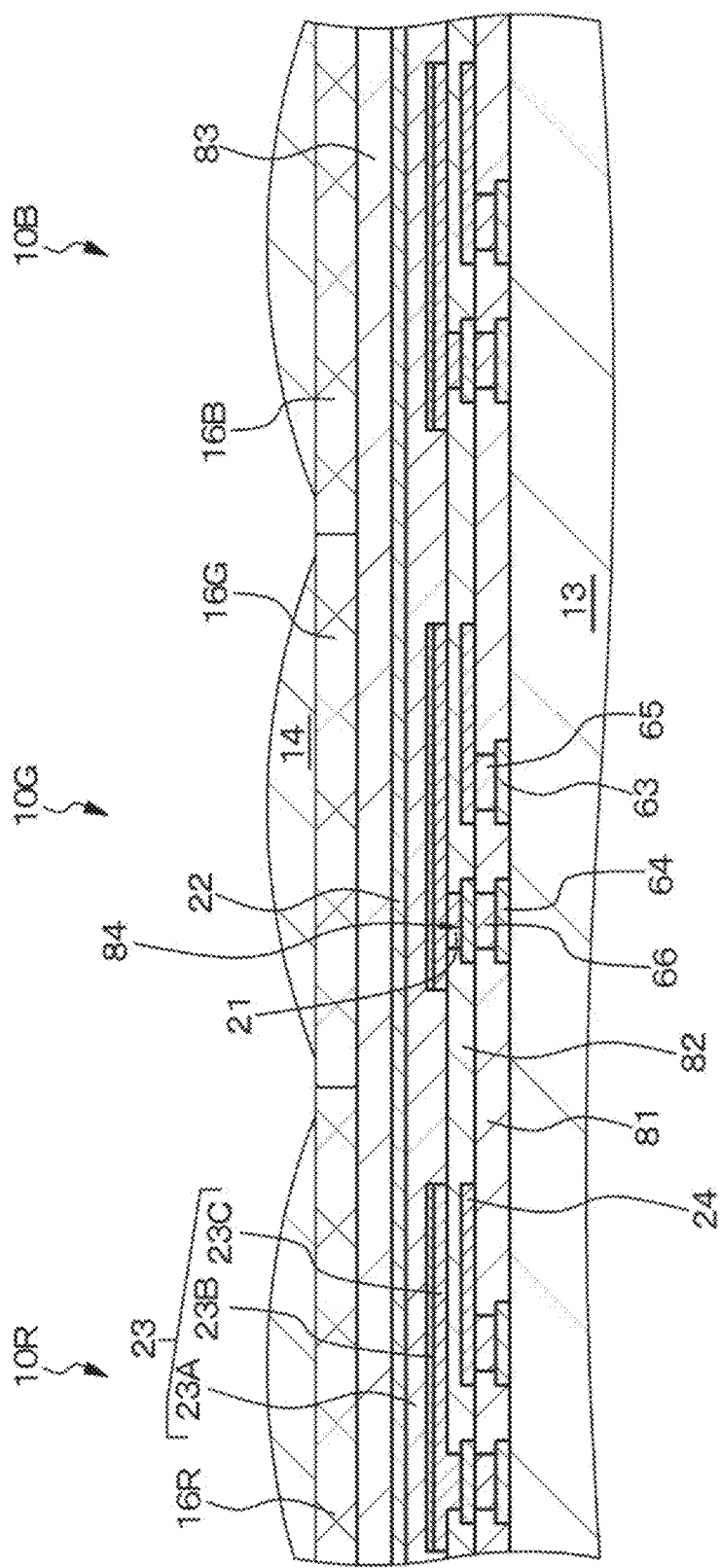
FIG. 44 is a schematic partial cross-sectional view of a part of further another modified example of the image pickup element and the stacked image pickup element of Embodiment 4.

In a modified example of the image pickup element of Embodiment 4 in FIG. 44 depicting a schematic partial cross-sectional view, color filters layers 16B, 16G, and 16R for dispersing light into blue, green, and red are disposed on the light incidence side of each of the image pickup elements (blue light image pickup element 10B, green light image pickup element 10G, and red light image pickup element 10R). In this case, it is sufficient that the image pickup elements 10R, 10G, and 10B include image pickup elements of the back-side illumination type or front-side illumination type provided with the photoelectric conversion layer 23A absorbing white light. The image pickup elements 10B, 10G, and 10R have the same configuration and structure except that the color filter layers 16B, 16G, and 16R differ from one another. Additionally, the photoelectric conversion layer 23A can be shared by the image pickup elements 10B, 10G, and 10R.

In the embodiments, the signal charge is assumed to include electrons, and the photoelectric conversion layer formed in the semiconductor substrate is assumed to have n-type conductivity. However, the embodiments can be applied to solid image pickup apparatuses in which the signal charge includes holes. In this case, it is sufficient that each semiconductor region includes a semiconductor region with opposite type conductivity and that the photoelectric conversion layer formed in the semiconductor substrate has p-type conductivity.

Additionally, the embodiments have been described taking, as an example, the case of application to CMOS solid image pickup apparatuses that includes unit pixels arranged in a matrix and sensing signal charge corresponding to the amount of incident light as a physical quantity. However, the embodiments are not limited to the application to CMOS solid image pickup apparatuses but may be applied to CCD solid image pickup apparatuses. In the latter case, the signal charge is transferred in the vertical direction by a vertical transfer register with a CCD structure and transferred in the horizontal direction by a horizontal transfer register to be amplified, leading to output of pixel signals (image signals). Additionally, the embodiments are not limited to column-type solid image pickup apparatuses in general including pixels formed in a two-dimensional matrix and column signal processing circuits each disposed for a corresponding pixel row. Further, the selection transistors can possibly be omitted.

Moreover, the image pickup element and the stacked image pickup element of the present disclosure can be applied not only to solid image pickup apparatuses that senses the distribution of the amount of incident visible light to capture the light as an image but also to solid image pickup apparatuses that captures the distribution of the amount of incident infrared rays, X rays, particles, or the like as an image. Additionally, in a broad sense, the embodiments can be applied to solid image pickup apparatuses such as a fingerprint detection sensor in general which senses the distribution of other physical quantities such as pressure and capacitance to capture the distribution as an image (physical quantity distribution sensing apparatuses).

Further, the embodiments are not limited to solid image pickup apparatuses that scans unit pixels in an image pickup region in units of rows to read out a pixel signal from each of the unit pixels. The embodiments can be applied to an X-Y address type solid image pickup apparatus that selects any pixels in units of pixels and reads out pixel signals from the selected pixels in units of pixels. The solid image pickup apparatus may be formed as one chip or may be modularly configured and have an image pickup function including an image pickup region and a drive circuit or an optical system collectively packaged.

Additionally, the embodiments are not limited to the application to solid image pickup apparatuses but can also be applied to image pickup apparatuses. Here, the image pickup apparatus refers to electronic equipment having an image pickup function, for example, a camera system such as a digital still camera or a video camera, or a cellular phone. The image pickup apparatus may be a modular configuration mounted in electronic equipment, that is, a camera module.

Figure 50:
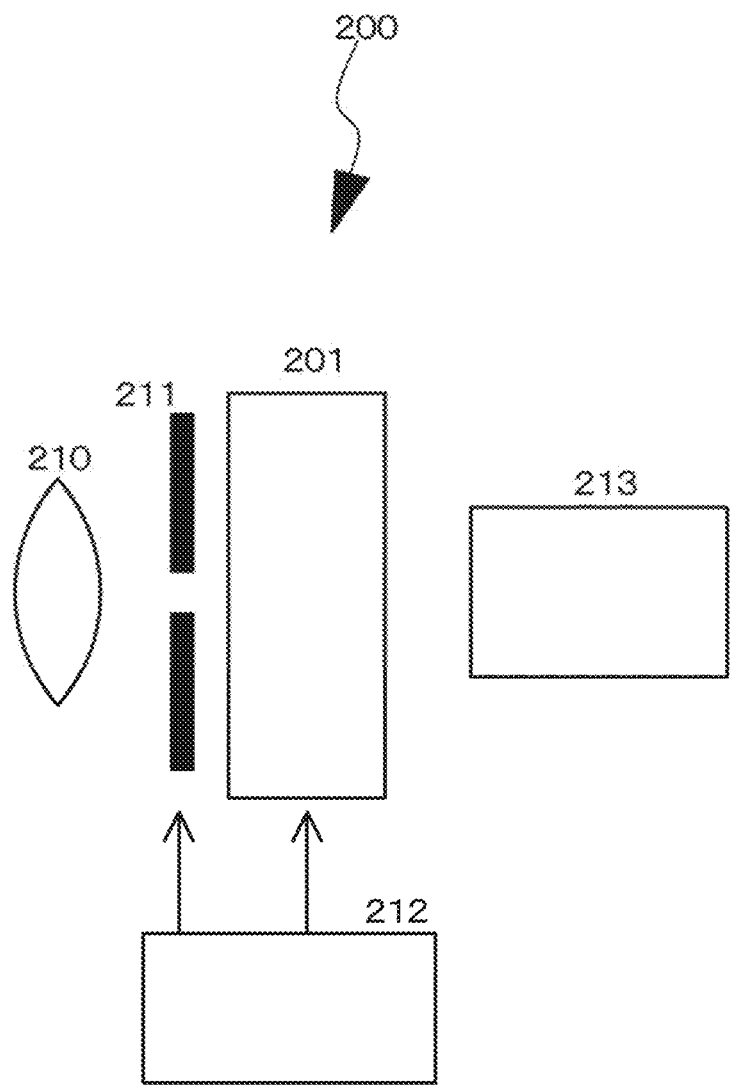
FIG. 50 is a conceptual diagram of an example using, for electronic equipment (camera), a solid image pickup apparatus including the image pickup element and the stacked image pickup element of the present disclosure.

FIG. 50 depicts a conceptual diagram of an example in which a solid image pickup apparatus 201 including the image pickup element and the stacked image pickup element of the present disclosure is used for electronic equipment (camera) 200. The electronic equipment 200 includes the solid image pickup apparatus 201, an optical lens 210, a shutter apparatus 211, a drive circuit 212, and a signal processing circuit 213. The optical lens 210 forms image light (incident light) from a subject into an image on an image pickup surface of the solid image pickup apparatus 201. This causes signal charge to be stored in the solid image pickup apparatus 201 for a certain period of time. The shutter apparatus 211 controls a light irradiation period and a light shielding period for the solid image pickup apparatus 201. The drive circuit 212 feeds drive signals controlling a transfer operation and the like of the solid image pickup apparatus 201 and a shutter operation of the shutter apparatus 211. Drive signals (timing signals) fed from the drive circuit 212 cause the solid image pickup apparatus 201 to perform signal transfer. The signal processing circuit 213 executes various types of signal processing. Video signals subjected to the signal processing are stored in a storage medium such as a memory or output to a monitor. Such electronic equipment 200 allows miniaturization of the pixel size in the solid image pickup apparatus 201 and improvement of transfer efficiency. Thus, the electronic equipment 200 with improved pixel characteristics can be obtained. The electronic equipment 200 to which the solid image pickup apparatus 201 can be applied is not limited to cameras but can be applied to image pickup apparatuses such as camera modules for mobile equipment such as a digital still camera and a cellular phone.

The technique according to the present disclosure (present technique) can be applied to various products. For example, the technique according to the present disclosure may be implemented as an apparatus mounted in any type of moving bodies such as an automobile, an electric car, a hybrid electric car, a motor cycle, a bicycle, a personal mobility vehicle, an airplane, a drone, a ship, or a robot.

Figure 52:
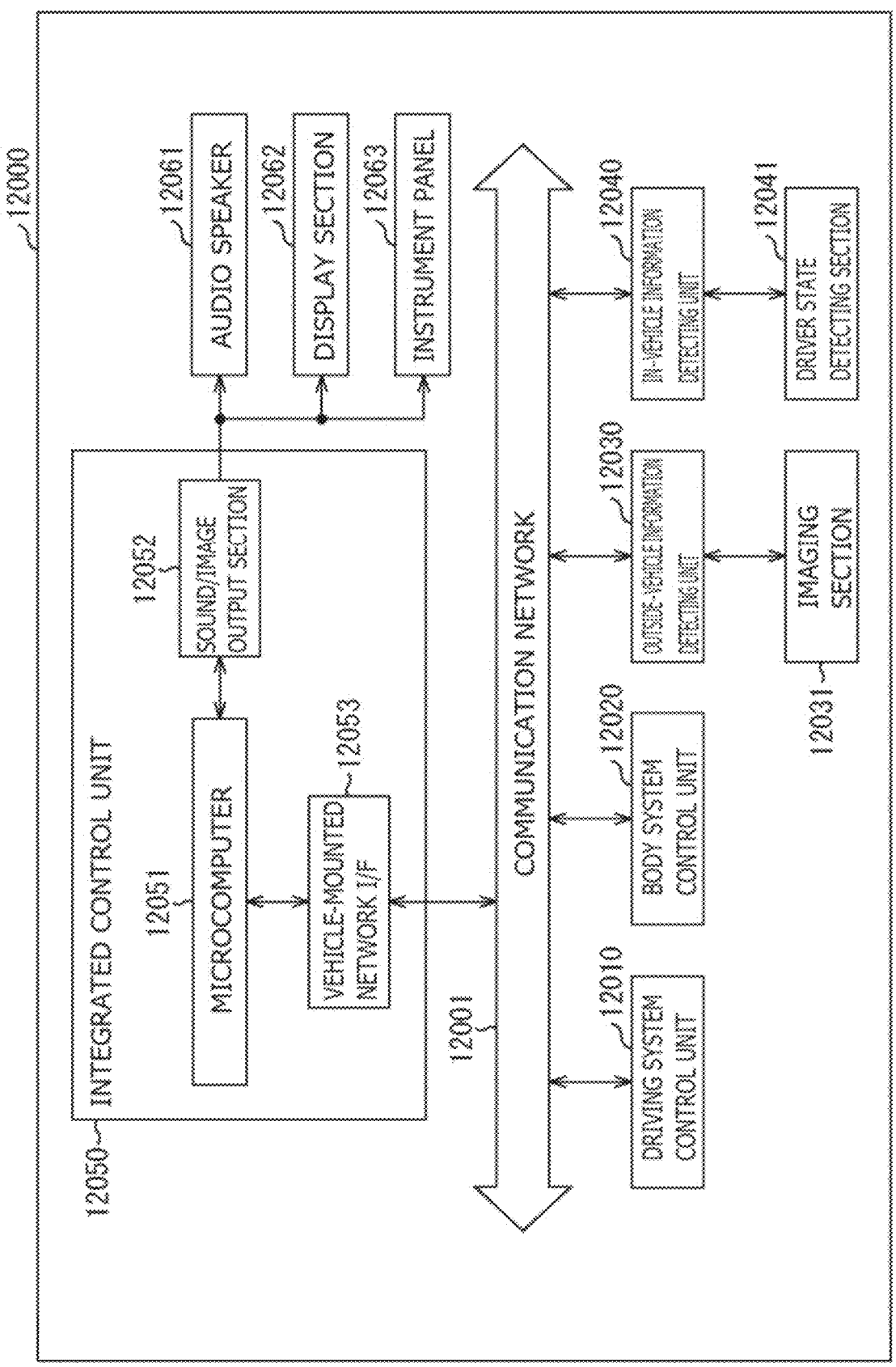
FIG. 52 is a block diagram depicting an example of schematic configuration of a vehicle control system.

FIG. 52 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 52, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 52, an audio speaker 12061, a display section 12062, and an instrument panel 12063 are illustrated as the output device. The display section 12062 may, for example, include at least one of an on-board display and a head-up display.

Figure 53:
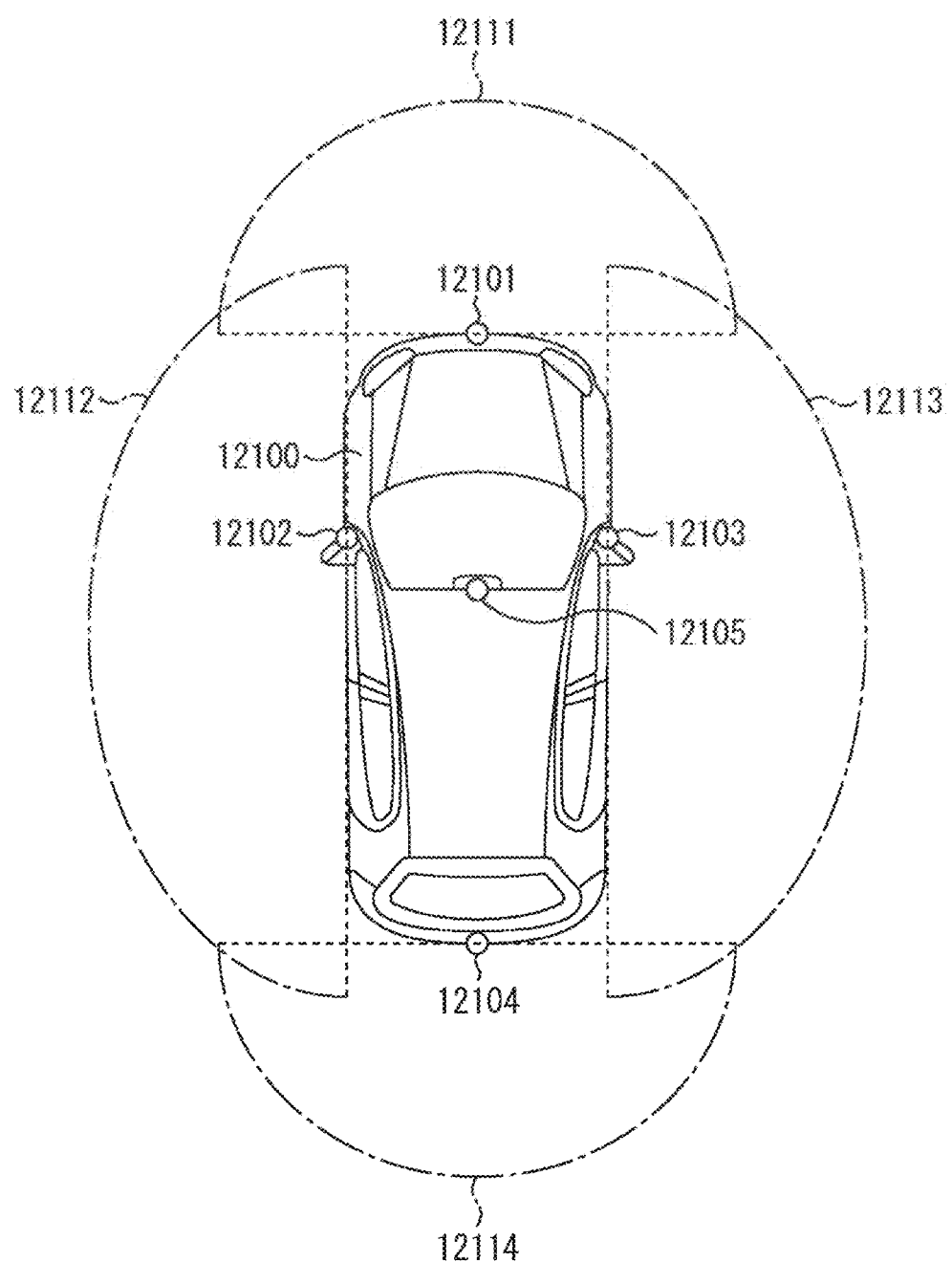
FIG. 53 is a diagram of assistance in explaining an example of installation positions of an outside-vehicle information detecting section and an imaging section.

FIG. 53 is a diagram depicting an example of the installation position of the imaging section 12031.

In FIG. 53, as the imaging section 12031, the vehicle 12100 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front side obtained by the imaging sections 1201 and 12105 is used mainly to detect a preceding vehicle, a pedestrian, an obstacle, a signal, a traffic sign, a lane, or the like.

Incidentally, FIG. 53 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle.

In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Additionally, the technique according to the present disclosure may be applied to an endoscopic surgery system.

Figure 54:
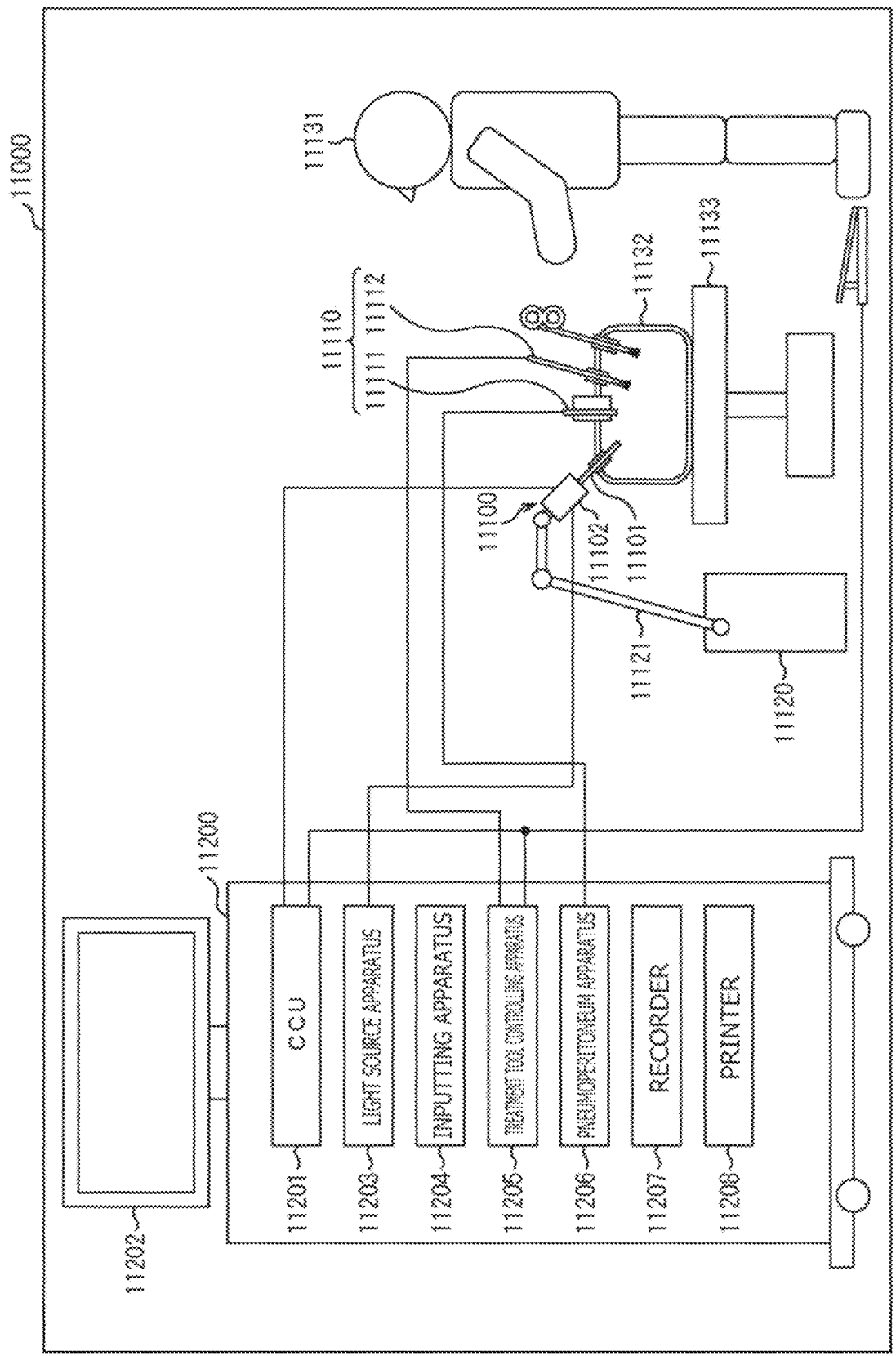
FIG. 54 is a view depicting an example of a schematic configuration of an endoscopic surgery system.

FIG. 54 is a view depicting an example of a schematic configuration of an endoscopic surgery system to which the technology according to an embodiment of the present disclosure (present technology) can be applied.

In FIG. 54, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 55:
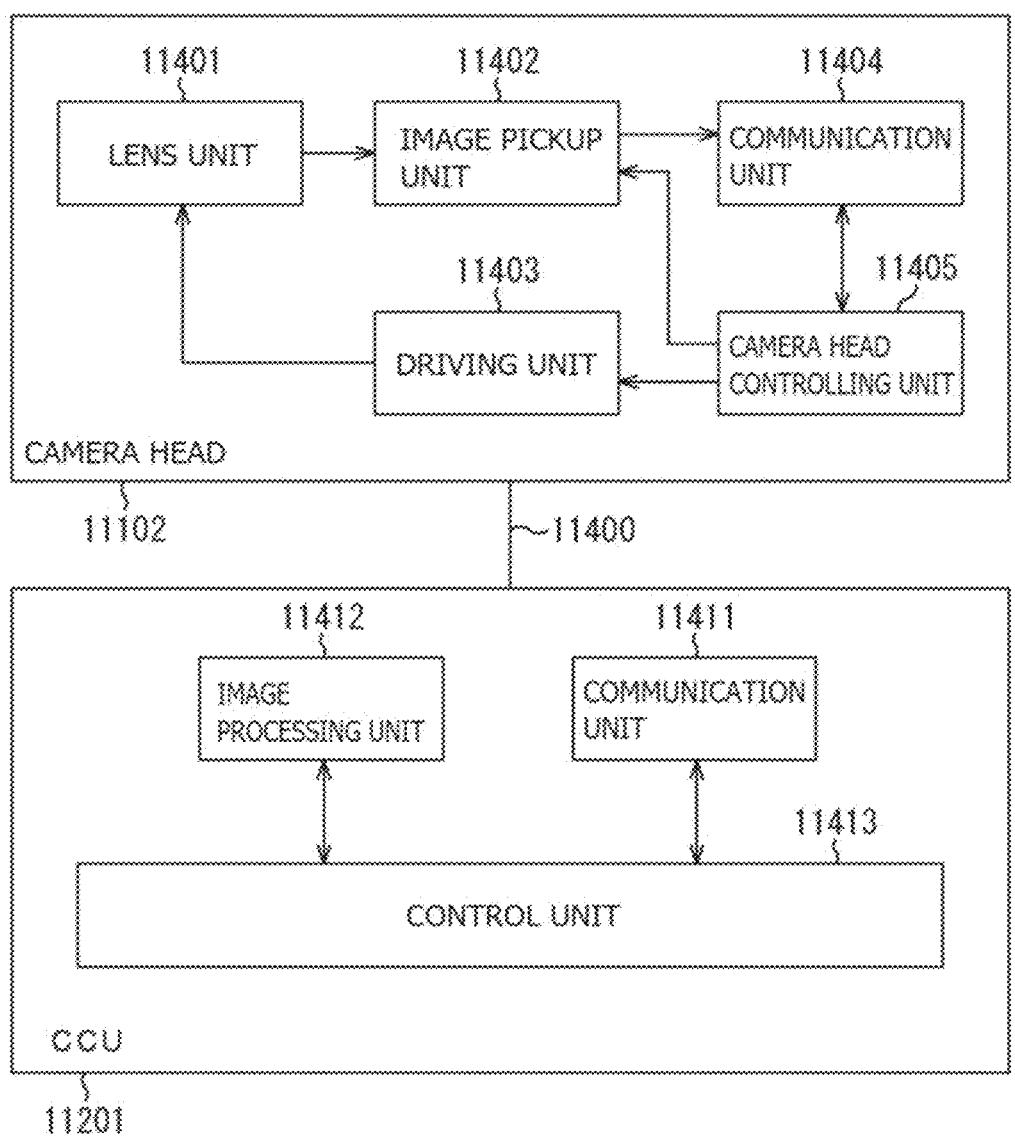
FIG. 55 is a block diagram depicting an example of a functional configuration of a camera head and a camera control unit (CCU).

FIG. 55 is a block diagram depicting an example of a functional configuration of the camera head 11102 and the CCU 11201 depicted in FIG. 54.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Note that the endoscopic surgery system has been described as an example but that the technique according to the present disclosure may be applied to any other surgery system, for example, a microsurgery system.

Note that the present disclosure can also take configurations described below.

Image Pickup Element

[A01] An image pickup element including:
a photoelectric conversion section including a first electrode, a photoelectric conversion layer, and a second electrode stacked on one another, in which,
immediately below the photoelectric conversion layer, an oxide film and an oxide semiconductor layer are formed from a photoelectric conversion layer side.

[A02] The image pickup element according to [A01], in which
at least some of elements included in the oxide film are different from elements included in the oxide semiconductor layer.

[A03] The image pickup element according to [A01] or [A02], in which,
assuming that $E_2$ denotes an energy average value at a maximum energy value of a conductance band of the oxide semiconductor layer and that $E_1$ denotes an energy average value at a maximum energy value of a conductance band of the oxide film, $E_1-E_2 \geq -0.4$ (eV) is satisfied.

[A04] The image pickup element according to [A03], in which, assuming that $E_0$ denotes an energy average value at a LUMO value for the photoelectric conversion layer, $E_0-E_1 \geq -0.4$ (eV) is satisfied.

[A05] The image pickup element according to [A04], in which $E_0 \geq E_1 \geq E_2$ is satisfied.

[A06] The image pickup element according to any one of [A01] to [A05], in which, assuming that $E_4$ denotes an energy average value at a minimum energy value for a valence band of the oxide film and that $E_3$ denotes an energy average value at a HOMO value for the photoelectric conversion layer, $E_3-E_4 \geq -0.4$ (eV) is satisfied.

[A07] The image pickup element according to [A06], in which, assuming that $E_5$ denotes an energy average value at a minimum energy value for a valence band of the oxide semiconductor layer, $E_4-E_5 \geq -0.4$ (eV) is satisfied.

[A08] The image pickup element according to [A07], in which $E_3 \geq E_4 \geq E_5$ is satisfied.

[A09] The image pickup element according to any one of [A01] to [A08], in which a material included in the oxide film (oxide film constituent material) includes a metal oxide.

[A10] The image pickup element according to [A09], in which the metal oxide includes at least one type of element selected from the group including tantalum, titanium, vanadium, niobium, tungsten, zirconium, hafnium, scandium, yttrium, lanthanum, gallium, and magnesium.

[A11] The image pickup element according to [A10], in which the oxide film includes an addition of at least one type of element selected from the group including silicon (Si), tantalum (Ta), vanadium (V), niobium (Nb), tungsten (W), zirconium (Zr), hafnium (Hf), scandium (Sc), yttrium (Y), lanthanum (La), gallium (Ga), magnesium (Mg), aluminum (Al), strontium (Sr), germanium (Ge), hydrogen (H), carbon (C), and nitrogen (N) (however, the element is different from the element included in the metal oxide).

[A12] The image pickup element according to [A11], in which the oxide film includes an addition of at least one type of element selected from the group including silicon (Si), niobium (Nb), tungsten (W), zirconium (Zr), aluminum (Al), carbon (C), and nitrogen (N) (however, the element is different from the element included in the metal oxide).

[A13] The image pickup element according to any one of [A09] to [A12], in which the oxide film has a thickness equal to or larger than one atomic layer and equal to or smaller than $1 \times 10^{-7}$ m.

[A14] The image pickup element according to any one of [A01] to [A08], in which the oxide film includes a tunnel oxide film.

[A15] The image pickup element according to [A14], in which the tunnel oxide film includes at least one type of material selected from the group including $SiO_x$, SiON, SiOC, and $AlO_y$.

[A16] The image pickup element according to any one of [A14] or [A15], in which the tunnel oxide film has a thickness equal to or larger than one atomic layer and equal to or smaller than $5 \times 10^{-9}$ m.

[A17] The image pickup element according to any one of [A01] to [A08], in which the oxide film includes a stacked structure of a film including a metal oxide and a tunnel oxide film.

[A18] The image pickup element according to [A17], in which the metal oxide includes at least one type of element selected from the group including tantalum, titanium, vanadium, niobium, tungsten, zirconium, hafnium, scandium, yttrium, lanthanum, gallium, and magnesium.

[A19] The image pickup element according to [A18], in which the oxide film includes an addition of at least one type of element selected from the group including silicon (Si), tantalum (Ta), vanadium (V), niobium (Nb), tungsten (W), zirconium (Zr), hafnium (Hf), scandium (Sc), yttrium (Y), lanthanum (La), gallium (Ga), magnesium (Mg), aluminum (Al), strontium (Sr), germanium (Ge), hydrogen (H), carbon (C), and nitrogen (N) (however, the element is different from the element included in the metal oxide).

[A20] The image pickup element according to [A19], in which the oxide film includes an addition of at least one type of element selected from the group including silicon (Si), niobium (Nb), tungsten (W), zirconium (Zr), aluminum (Al), carbon (C), and nitrogen (N) (however, the element is different from the element included in the metal oxide).

[A21] The image pickup element according to any one of [A17] to [A20], in which the film including the metal oxide has a thickness equal to or larger than one atomic layer and equal to or smaller than $1\times10^{-7}$ m.

[A22] The image pickup element according to any one of [A17] to [A21], in which the tunnel oxide film includes at least one type of material selected from the group including $SiO_x$, SiON, SiOC, and $AlO_y$.

[A23] The image pickup element according to any one of [A17] to [A22], in which the tunnel oxide film has a thickness equal to or larger than one atomic layer and equal to or smaller than $5\times10^{-9}$ m.

[A24] The image pickup element according to any one of [A01] to [A23], in which an average value $Conc_{H-1}$ of a concentration of hydrogen atoms in a portion of the oxide semiconductor layer near an interface between the oxide film and the oxide semiconductor layer is higher than an average value $Conc_{H-2}$ of a concentration of hydrogen atoms in a central portion of the oxide semiconductor layer along a thickness direction.

[A25] The image pickup element according to [A24], in which $Conc_{H-1}/Conc_{H-2} \geq 1.1$ is satisfied.

[A26] The image pickup element according to any one of [A01] to [A25], in which, assuming that $Conc_{H-1}$ denotes a value of the concentration of hydrogen atoms in the portion of the oxide semiconductor layer near the interface between the oxide film and the oxide semiconductor layer and that $Conc_{M-1}$ denotes a value of the concentration of atoms included in the oxide film in the portion of the oxide semiconductor layer near the interface between the oxide film and the oxide semiconductor layer, an average change rate $\Delta Conc_{H-1}$ of $Conc_{H-1}$ toward the central portion along the thickness direction of the oxide semiconductor layer is larger than an average change rate $\Delta Conc_{M-1}$ of $Conc_{M-1}$ toward the central portion along the thickness direction of the oxide semiconductor layer.

[A27] The image pickup element according to any one of [A01] to [A26], in which a color filter layer is provided above the second electrode, and the photoelectric conversion layer absorbs white light.

[A28] The image pickup element according to any one of [A01] to [A27], in which charge generated in the photoelectric conversion layer migrates to the first electrode via the oxide film and the oxide semiconductor layer.

[A29] The image pickup element according to [A28], in which the charge includes electrons.

[B01] The image pickup element according to any one of [A01] to [A29], in which the photoelectric conversion section further includes an insulating layer and a charge storage electrode spaced apart from the first electrode and disposed so as to face the oxide semiconductor layer across the insulating layer.

[B02] The image pickup element according to any one of [A01] to [B01], in which charge generated in the photoelectric conversion layer migrates to the first electrode via the oxide film and the oxide semiconductor layer.

[B03] The image pickup element according to [B02], in which the charge includes electrons.

[B04] The image pickup element according to any one of [A01] to [B03], in which the oxide semiconductor layer has a carrier mobility of 10 cm²/Vs.

[B05] The image pickup element according to any one of [A01] to [B04], in which the oxide semiconductor layer has a carrier concentration (carrier density) of less than $1\times10^{16}/cm^3$.

[B06] The image pickup element according to any one of [A01] to [B05], in which the oxide semiconductor layer is amorphous.

[B07] The image pickup element according to any one of [A01] to [B06], in which the oxide semiconductor layer has a thickness of $1\times10^{-8}$ m to $1.5\times10^{-7}$ m.

[C01] The image pickup element according to any one of [A01] to [B07], further including: a semiconductor substrate, in which the photoelectric conversion section is disposed above the semiconductor substrate.

[C02] The image pickup element according to any one of [A01] to [C01], in which the first electrode extends through an opening provided in the insulating layer and is connected to the oxide semiconductor layer.

[C03] The image pickup element according to any one of [A01] to [C01], in which the oxide semiconductor layer and a protective layer extend through an opening provided in the insulating layer and are connected to the first electrode.

[C04] The image pickup element according to [C03], in which edges of a top surface of the first electrode are covered with the insulating layer, the first electrode is exposed on a bottom surface of the opening, and assuming that a surface of the insulating layer in contact with the top surface of the first electrode is a first surface and that a surface of the insulating layer in contact with a portion of the oxide semiconductor layer facing the charge storage electrode is a second surface, a side surface of the opening includes a slope flaring from the first surface to the second surface.

[C05] The image pickup element according to [C04], in which the side surface of the opening including the slope flaring from the first surface to the second surface is located on the charge storage electrode side.

Control of Potentials of First Electrode and Charge Storage Electrode

[C06] The image pickup element according to any one of [A01] to [C05], further including: a control section provided in the semiconductor substrate and including a drive circuit, in which the first electrode and the charge storage electrode are connected to the drive circuit, during a charge storage period, the drive circuit applies a potential $V_{11}$ to the first electrode, applies a potential $V_{31}$ to the charge storage electrode, and stores charge in the oxide semiconductor layer (or the oxide semiconductor layer, the protective layer, and the photoelectric conversion layer), and during a charge transfer period, the drive circuit applies a potential $V_{12}$ to the first electrode, applies a potential $V_{32}$ to the charge storage electrode, and reads out the charge stored in the oxide semiconductor layer (or the oxide semiconductor layer, the protective layer, and the photoelectric conversion layer), to the control section via the first electrode. However, the first electrode has a higher potential than the second electrode, and $V_{31} \geq V_{11}$ and $V_{32} < V_{12}$ are satisfied.

Lower Charge Transfer Control Electrode

[C07] The image pickup element according to any one of [A01] to [C06], in which a lower charge transfer control electrode is formed in a region facing a region of the photoelectric conversion layer across the insulating layer, the region of the photoelectric conversion layer being located between adjacent image pickup elements.

Control of Potentials of First Electrode, Charge Storage Electrode, and Lower Charge Transfer Control Electrode

[C08] The image pickup element according to [C07], further including: the control section provided in the semiconductor substrate and including the drive circuit, in which the first electrode, the second electrode, the charge storage electrode, and the lower charge transfer control electrode are connected to the drive circuit, during the charge storage period, the drive circuit applies the potential $V_{11}$ to the first electrode, applies the potential $V_{31}$ to the charge storage electrode, applies a potential $V_{41}$ to the lower charge transfer control electrode, and stores charge in the oxide semiconductor layer (or the oxide semiconductor layer, the protective layer, and the photoelectric conversion layer), and during the charge transfer period, the drive circuit applies the potential $V_{12}$ to the first electrode, applies the potential $V_{32}$ to the charge storage electrode, applies a potential $V_{42}$ to the lower charge transfer control electrode, and reads out the charge stored in the oxide semiconductor layer (or the oxide semiconductor layer, the protective layer, and the photoelectric conversion layer), to the control section via the first electrode. However, $V_{31} \geq V_{11}$, $V_{31} > V_{41}$, and $V_{12} > V_{32} > V_{42}$ are satisfied.

Upper Charge Transfer Control Electrode

[C09] The image pickup element according to any one of [A01] to [C06], in which, instead of the second electrode, an upper charge transfer control electrode is formed on a region of the photoelectric conversion layer located between adjacent image pickup elements.

[C10] The image pickup element according to [C09], in which the second electrode is provided for each image pickup element, and the upper charge transfer control electrode surrounds at least a part of the second electrode with a space from the second electrode and is provided above a region -A of the photoelectric conversion layer.

[C11] The image pickup element according to [C09], in which the second electrode is provided for each image pickup element, the upper charge transfer control electrode surrounds at least a part of the second electrode with a space from the second electrode, and a part of the charge storage electrode is present below the upper charge transfer control electrode.

[C12] The image pickup element according to any one of [C09] to [C11], in which the second electrode is provided for each image pickup element, the upper charge transfer control electrode surrounds at least a part of the second electrode with a space from the second electrode, a part of the charge storage electrode is present below the upper charge transfer control electrode, and the lower charge transfer control electrode is further formed below the upper charge transfer control electrode.

Control of Potentials of First Electrode, Charge Storage Electrode, and Charge Transfer Control Electrode

[C13] The image pickup element according to any one of [C09] to [CU], further including: the control section provided in the semiconductor substrate and including the drive circuit, in which the first electrode, the second electrode, the charge storage electrode, and the charge transfer control electrode are connected to the drive circuit, during the charge storage period, the drive circuit applies a potential $V_{21}$ to the second electrode, applies a potential $V_{41}$ to the charge transfer control electrode, and stores charge in the oxide semiconductor layer (or the oxide semiconductor layer, the protective layer, and the photoelectric conversion layer), and during the charge transfer period, the drive circuit applies a potential $V_{22}$ to the second electrode, applies a potential $V_{42}$ to the charge transfer control electrode, and reads out the charge stored in the oxide semiconductor layer (or the oxide semiconductor layer, the protective layer, and the photoelectric conversion layer), to the control section via the first electrode. However, $V_{21} \geq V_{41}$ and $V_{22} \geq V_{42}$ are satisfied.

Transfer Control Electrode

[C14] The image pickup element according to any one of [A01] to [C13], further including: a transfer control electrode disposed between the first electrode and the charge storage electrode with a space from the first electrode and the charge storage electrode and disposed so as to face the oxide semiconductor layer across the insulating layer.

Control of Potentials of First Electrode, Charge Storage Electrode, and Transfer Control Electrode

[C15] The image pickup element according to [C14], further including: the control section provided in the semiconductor substrate and including the drive circuit, in which the first electrode, the charge storage electrode, and the transfer control electrode are connected to the drive circuit, during the charge storage period, the drive circuit applies the potential $V_{11}$ to the first electrode, applies the potential $V_{31}$ to the charge storage electrode, applies the potential $V_{51}$ to the transfer control electrode, and stores charge in the oxide semiconductor layer (or the oxide semiconductor layer, the protective layer, and the photoelectric conversion layer), and during the charge transfer period, the drive circuit applies the potential $V_{12}$ to the first electrode, applies the potential $V_{32}$ to the charge storage electrode, applies the potential $V_{52}$ to the transfer control electrode, and reads out the charge stored in the oxide semiconductor layer (or the oxide semiconductor layer, the protective layer, and the photoelectric conversion layer), to the control section via the first electrode. However, the first electrode has a higher potential than the second electrode, and $V_{31} > V_{51}$ and $V_{32} \leq V_{52} \leq V_{12}$ are satisfied.

Charge Emission Electrode

[C16] The image pickup element according to any one of [A01] to [C15], further including: a charge emission electrode connected to the oxide semiconductor layer and spaced apart from the first electrode and the charge storage electrode.

[C17] The image pickup element according to [C16], in which the charge emission electrode is disposed so as to surround the first electrode and the charge storage electrode.

[C18] The image pickup element according to [C16] or [C17], in which the oxide semiconductor layer and the protective layer extend through a second opening provided in the insulating layer and are connected to the charge emission electrode, edges of a top surface of the charge emission electrode are covered with the insulating layer, the charge emission electrode is exposed on a bottom surface of the second opening, and assuming that a surface of the insulating layer in contact with the top surface of the charge emission electrode is a third surface and that a surface of the insulating layer in contact with a portion of the oxide semiconductor layer facing the charge storage electrode is a second surface, a side surface of the second opening includes a slope flaring from the third surface to the second surface.

<<Control of Potentials of First Electrode, Charge Storage Electrode, and Charge Emission Electrode>>

[C19] The image pickup element according to any one of [C16] to [C18], further including: the control section provided in the semiconductor substrate and including the drive circuit, the first electrode, the charge storage electrode, and the charge emission electrode are connected to the drive circuit, during the charge storage period, the drive circuit applies the potential $V_{11}$ to the first electrode, applies the potential $V_{31}$ to the charge storage electrode, applies a potential $V_{61}$ to the charge emission electrode, and stores charge in the oxide semiconductor layer (or the oxide semiconductor layer, the protective layer, and the photoelectric conversion layer), and during the charge transfer period, the drive circuit applies the potential $V_{12}$ to the first electrode, applies the potential $V_{32}$ to the charge storage electrode, applies a potential $V_{62}$ to the charge emission electrode, and reads out the charge stored in the oxide semiconductor layer (or the oxide semiconductor layer, the protective layer, and the photoelectric conversion layer), to the control section via the first electrode. However, the first electrode has a higher potential than the second electrode, and $V_{61}>V_{11}$ and $V_{62}<V_{12}$ are satisfied Charge Storage Electrode Segment

[C20] The image pickup element according to any one of [A01] to [C19], in which the charge storage electrode includes a plurality of charge storage electrode segments.

[C21] The image pickup element according to [C20], in which, in a case where the first electrode has a higher potential than the second electrode, the potential applied during the charge transfer period to the charge storage electrode segment located closest to the first electrode is higher than the potential applied during the charge transfer period to the charge storage electrode segment located farthest from the first electrode, and in a case where the first electrode has a lower potential than the second electrode, the potential applied during the charge transfer period to the charge storage electrode segment located closest to the first electrode is lower than the potential applied during the charge transfer period to the charge storage electrode segment located farthest from the first electrode.

[C22] The image pickup element according to any one of [A01] to [C21], in which the semiconductor substrate is provided with a floating diffusion layer and an amplifying transistor included in the control section, and the first electrode is connected to the floating diffusion layer and a gate section of the amplifying transistor.

[C23] The image pickup element according to [C22], in which the semiconductor substrate is further provided with a reset transistor and a selection transistor included in the control section, the floating diffusion layer is connected to one of source/drain regions of the reset transistor, and one of source/drain regions of the amplifying transistor is connected to one of source/drain regions of the selection transistor, and the other source/drain region of the selection transistor is connected to a signal line.

[C24] The image pickup element according to any one of [A01] to [C23], in which the charge storage electrode is larger in size than the first electrode.

[C25] The image pickup element according to any one of [A01] to [C24], in which light is incident from the second electrode side, and a light shielding layer is formed closer to the light incidence side than the second electrode.

[C26] The image pickup element according to any one of [A01] to [C24], in which light is incident from the second electrode side and is not incident on the first electrode.

[C27] The image pickup element according to [C26], in which a light shielding layer is formed closer to the light incidence side than the second electrode and above the first electrode.

[C28] The image pickup element according to [C26], in which an on-chip microlens is provided above the charge storage electrode and the second electrode, and light incident on the on-chip microlens is focused on the charge storage electrode.

Image Pickup Element: First Configuration

[C29] The image pickup element according to any one of [A01] to [C28], in which the photoelectric conversion section includes N (N≥2) photoelectric conversion section segments, the oxide semiconductor layer, the protective layer, and the photoelectric conversion layer include N photoelectric conversion layer segments, the insulating layer includes N insulating layer segments, the charge storage electrode includes N charge storage electrode segments, an n-th (n=1, 2, 3, . . . N) photoelectric conversion section segment includes an n-th charge storage electrode segment, an n-th insulating layer segment, and an n-th photoelectric conversion layer segment, the photoelectric conversion section segment with a larger n value is located farther from the first electrode, and the insulating layer segments have a thickness varying gradually from a first photoelectric conversion section segment to an N-th photoelectric conversion section segment.

Image Pickup Element: Second Configuration

[C30] The image pickup element according to any one of [A01] to [C28], in which the photoelectric conversion section includes N (N≥2) photoelectric conversion section segments, the oxide semiconductor layer, the protective layer, and the photoelectric conversion layer include N photoelectric conversion layer segments, the insulating layer includes N insulating layer segments, the charge storage electrode includes N charge storage electrode segments, an n-th (n=1, 2, 3, . . . N) photoelectric conversion section segment includes an n-th charge storage electrode segment, an n-th insulating layer segment, and an n-th photoelectric conversion layer segment, the photoelectric conversion section segment with a larger n value is located farther from the first electrode, and the photoelectric conversion layer segments have a thickness varying gradually from a first photoelectric conversion section segment to an N-th photoelectric conversion section segment.

Image Pickup Element: Third Configuration

[C31] The image pickup element according to any one of [A01] to [C28], in which the photoelectric conversion section includes N (N≥2) photoelectric conversion section segments, the oxide semiconductor layer, the protective layer, and the photoelectric conversion layer include N photoelectric conversion layer segments, the insulating layer includes N insulating layer segments, the charge storage electrode includes N charge storage electrode segments, an n-th (n=1, 2, 3, . . . N) photoelectric conversion section segment includes an n-th charge storage electrode segment, an n-th insulating layer segment, and an n-th photoelectric conversion layer segment, the photoelectric conversion section segment with a larger n value is located farther from the first electrode, and a material included in the insulating layer segment differs between the photoelectric conversion section segments adjacent to each other.

Image Pickup Element: Fourth Configuration

[C32] The image pickup element according to any one of [A01] to [C28], in which the photoelectric conversion section includes N (N≥2) photoelectric conversion section segments, the oxide semiconductor layer, the protective layer, and the photoelectric conversion layer include N photoelectric conversion layer segments, the insulating layer includes N insulating layer segments, the charge storage electrode includes N charge storage electrode segments spaced apart from one another, an n-th (n=1, 2, 3, . . . N) photoelectric conversion section segment includes an n-th charge storage electrode segment, an n-th insulating layer segment, and an n-th photoelectric conversion layer segment, the photoelectric conversion section segment with a larger n value is located farther from the first electrode, and a material included in the charge storage electrode segment differs between the photoelectric conversion section segments adjacent to each other.

Image Pickup Element: Fifth Configuration

[C33] The image pickup element according to any one of [A01] to [C28], in which the photoelectric conversion section includes N (N≥2) photoelectric conversion section segments, the oxide semiconductor layer, the protective layer, and the photoelectric conversion layer include N photoelectric conversion layer segments, the insulating layer includes N insulating layer segments, the charge storage electrode includes N charge storage electrode segments spaced apart from one another, an n-th (n=1, 2, 3, . . . N) photoelectric conversion section segment includes an n-th charge storage electrode segment, an n-th insulating layer segment, and an n-th photoelectric conversion layer segment, the photoelectric conversion section segment with a larger n value is located farther from the first electrode, and the charge storage electrode segments have an area decreasing gradually from a first photoelectric conversion section segment to an N-th photoelectric conversion section segment.

Image Pickup Element: Sixth Configuration

[C34] The image pickup element according to any one of [A01] to [C28], in which, assuming that a stacking direction of the charge storage electrode, the insulating layer, the oxide semiconductor layer, and the photoelectric conversion layer is a Z direction and that a direction away from the first electrode is an X direction, a cross-sectional area of a stacked portion taken along a YZ virtual plane varies depending on a distance from the first electrode, the stacked portion including the charge storage electrode, the insulating layer, the oxide semiconductor layer, and the photoelectric conversion layer stacked on one another.

Stacked Image Pickup Element

[D01] A stacked image pickup element including: at least one image pickup element according to any one of [A01] to [C34].

Solid Image Pickup Apparatus: First Aspect

[E01] A solid image pickup apparatus including: a plurality of the image pickup elements according to any one of [A01] to [C34].

Solid Image Pickup Apparatus: Second Aspect

[E02] A solid image pickup apparatus including: a plurality of the stacked image pickup elements according to [D01].

Solid Image Pickup Apparatus: First Configuration

[F01] A solid image pickup apparatus including: a photoelectric conversion section including a first electrode, a photoelectric conversion layer, and a second electrode stacked on one another, in which the photoelectric conversion section includes a plurality of the image pickup elements according to any one of [A01] to [C34], the plurality of image pickup elements is included in an image pickup element block, and the first electrode is shared by the plurality of image pickup elements included in the image pickup element block.

Solid Image Pickup Apparatus: Second Configuration

[F02] A solid image pickup apparatus including: a plurality of the stacked image pickup elements according to [C01], in which the plurality of image pickup elements is included in an image pickup element block, and a first electrode is shared by the plurality of image pickup elements included in the image pickup element block.

[F03] The solid image pickup apparatus according to [F01] or [F02], in which one on-chip microlens is disposed above one image pickup element.

[F04] The solid image pickup apparatus according to [F01] or [F02], in which two image pickup elements are included in an image pickup element block, and one on-chip microlens is disposed above the image pickup element block.

[F05] The solid image pickup apparatus according to any one of [F01] to [F04], in which one floating diffusion layer is provided for the plurality of image pickup elements.

[F06] The solid image pickup apparatus according to any one of [F01] to [F05], in which the first electrode is disposed so as to be adjacent to a charge storage electrode of each image pickup element.

[F07] The solid image pickup apparatus according to any one of [F01] to [F06], in which the first electrode is disposed so as to be adjacent to charge storage electrodes of some of the plurality of image pickup elements and is not disposed so as to be adjacent to charge storage electrodes of the remaining ones of the plurality of image pickup elements.

[F08] The solid image pickup apparatus according to [F07], in which a distance between the charge storage electrode included in the image pickup element and the charge storage electrode included in the image pickup element is longer than a distance between the first electrode in the image pickup element adjacent to the first electrode and the charge storage electrode.

Driving Method for Solid Image Pickup Apparatus

[G01] A driving method for a solid image pickup apparatus including a plurality of image pickup elements each including a photoelectric conversion section including a first electrode, a photoelectric conversion layer, and a second electrode stacked on one another, the photoelectric conversion section including a charge storage electrode spaced apart from the first electrode and disposed so as to face the photoelectric conversion layer across an insulating layer, the image pickup element having a structure in which light is incident from the second electrode side but no light is incident on the first electrode, the driving method repeating the steps of: in all the image pickup elements, simultaneously emitting charge in the first electrode to outside of a system while storing charge in an oxide semiconductor layer, and then, in all the image pickup element, simultaneously transferring, to the first electrode, the charge stored in the oxide semiconductor layer, and after the transfer is complete, sequentially reading out the charge transferred to the first electrode in each of the image pickup elements.

REFERENCE SIGNS LIST 10, 10R, 10G, 10B . . . Image pickup element (stacked image pickup element, first image pickup element),
11 . . . Second image pickup element,
12 . . . Third image pickup element,
13 . . . Various image pickup element components located below interlayer insulating layer,
14 . . . On-chip microlens (OCL),
15 . . . Light shielding layer,
16R, 16G, 16B . . . Color filter layer,
21 . . . First electrode,
22 . . . Second electrode,
23 . . . Photoelectric conversion stack,
23A . . . Photoelectric conversion layer,
23B . . . Oxide film,
23C . . . Oxide semiconductor layer,
24 . . . Charge storage electrode,
25 . . . Transfer control electrode (charge transfer electrode),
26 . . . Charge emission electrode,
27 . . . Lower charge transfer control electrode (downside charge transfer control electrode),
27A . . . Connection hole,
27B . . . Pad portion,
28 . . . Upper charge transfer control electrode (upside charge transfer control electrode),
41 . . . n-type semiconductor region included in second image pickup element, 43 . . . n-type semiconductor region included in third image pickup element,
42, 44, 73 . . . p+ layer,
45, 46 . . . Gate section of transfer transistor,
51 . . . Gate section of reset transistor
TR1rst, 51A . . . Channel formation region of reset transistor TR1rst, 51B, 51C . . . Source/drain region of reset transistor TR1rst,
52 . . . Gate section of amplifying transistor TR1amp,
52A . . . Channel formation region of amplifying transistor TR1amp,
52B, 52C . . . Source/drain region of amplifying transistor TR1amp,
53 . . . Gate section of selection transistor TR1sel,
53A . . . Channel formation region of selection transistor TR1sel,
53B, 53C . . . Source/drain region of selection transistor TR1sel,
61 . . . Contact hole portion,
62 . . . Wring layer,
63, 64, 68A . . . Pad portion,
65, 68B . . . Connection hole,
66, 67, 69 . . . Connection section,
70 . . . Semiconductor substrate,
70A . . . First surface (front surface) of semiconductor substrate,
70B . . . Second surface (back surface) of semiconductor substrate,
71 . . . Element isolation region,
72, 75 . . . Insulating material film,
74 . . . HfO2 film,
76, 81 . . . Interlayer insulating layer,
82 . . . Insulating layer,
82A . . . Region between adjacent image pickup elements (region -a),
83 . . . Protective material layer,
84 . . . Opening,
85 . . . Second opening,
100 . . . Solid image pickup apparatus,
101 . . . Stacked image pickup element,
111 . . . Image pickup region,
112 . . . Vertical drive circuit,
113 . . . Column signal processing circuit,
114 . . . Horizontal drive circuit,
115 . . . Output circuit,
116 . . . Drive control circuit,
117 . . . Signal line (data output line),
118 . . . Horizontal signal line,
200 . . . Electronic equipment (camera),
201 . . . Solid image pickup apparatus,
210 . . . Optical lens,
211 . . . Shutter apparatus,
212 . . . Drive circuit,
213 . . . Signal processing circuit,
FD1, FD2, FD3, 45C, 46C . . . Floating diffusion layer,
TR1trs, TR2trs, TR3trs . . . Transfer transistor,
TR1rst, TR2rst, TR3rst . . . Reset transistor,
TR1amp, TR2amp, TR3amp . . . Amplifying transistor,
TR1sel, TR3sel, TR3sel . . . Selection transistor,
VDD . . . Power supply,
RST1, RST2, RST3 . . . Reset line,
SEL1, SEL2, SEL3 . . . Selection line,
117, VSL, VSL1, VSL2, VSL3 . . . Signal line (data output line),
TG2, TG3 . . . Transfer gate line,
VOA, VOB, VOT, VOU . . . Wiring

The invention claimed is:

1. An image pickup element, comprising:
a photoelectric conversion section, including:
a first electrode;
a second electrode;
a photoelectric conversion layer disposed between the first electrode and the second electrode;
an oxide semiconductor layer, wherein the oxide semiconductor layer is disposed between the first electrode and the photoelectric conversion layer; and
an oxide film, wherein the oxide film is disposed between the photoelectric conversion layer and the oxide semiconductor layer, and wherein the oxide film includes at least one type of material selected from SiON, SiOC, and aluminum oxide.

2. The image pickup element according to claim 1, wherein at least some of elements included in the oxide film are different from elements included in the oxide semiconductor layer.

3. The image pickup element according to claim 1, wherein, assuming that $E_2$ denotes an energy average value at a maximum energy value of a conductance band of the oxide semiconductor layer and that $E_1$ denotes an energy average value at a maximum energy value of a conductance band of the oxide film, $E_1 - E_2 \geq -0.4$ (eV) is satisfied.

4. The image pickup element according to claim 3, wherein, assuming that $E_0$ denotes an energy average value at a LUMO value for the photoelectric conversion layer, $E_0 - E_1 \geq -0.4$ (eV) is satisfied.

5. The image pickup element according to claim 4, wherein $E_0 \geq E_1 \geq E_2$ is satisfied.

6. The image pickup element according to claim 1, wherein, assuming that $E_4$ denotes an energy average value at a minimum energy value for a valence band of the oxide film and that $E_3$ denotes an energy average value at a HOMO value for the photoelectric conversion layer, $E_3 - E_4 \geq -0.4$ (eV) is satisfied.

7. The image pickup element according to claim 6, wherein, assuming that $E_5$ denotes an energy average value at a minimum energy value for a valence band of the oxide semiconductor layer, $E_4 - E_5 \geq -0.4$ (eV) is satisfied.

8. The image pickup element according to claim 7, wherein $E_3 \geq E_4 \geq E_5$ is satisfied.

9. The image pickup element according to claim 1, wherein a material included in the oxide film includes a metal oxide.

10. The image pickup element according to claim 9, wherein the metal oxide includes at least one type of element selected from a group including tantalum, titanium, vanadium, niobium, tungsten, zirconium, hafnium, scandium, yttrium, lanthanum, gallium, and magnesium.

11. The image pickup element according to claim 10, wherein the oxide film includes an addition of at least one type of element selected from a group including silicon, tantalum, vanadium, niobium, tungsten, zirconium, hafnium, scandium, yttrium, lanthanum, gallium, magnesium, aluminum, strontium, germanium, hydrogen, carbon, and nitrogen (however, the element is different from the element included in the metal oxide).

12. The image pickup element according to claim 9, wherein the oxide film has a thickness equal to or larger than one atomic layer and equal to or smaller than $1 \times 10^{-7}$ m.

13. The image pickup element according to claim 1, wherein the oxide film includes a tunnel oxide film.

14. The image pickup element according to claim 13, wherein the tunnel oxide film further includes at least one type of material selected from silicon oxide, SiON, SiOC, and aluminum oxide.

15. The image pickup element according to claim 13, wherein the tunnel oxide film has a thickness equal to or larger than one atomic layer and equal to or smaller than $5 \times 10^{-9}$ m.

16. The image pickup element according to claim 1, wherein the oxide film includes a stacked structure of a film including a metal oxide and a tunnel oxide film.

17. The image pickup element according to claim 1, wherein a value $Conc_{H-1}$ of a concentration of hydrogen atoms in a portion of the oxide semiconductor layer near an interface between the oxide film and the oxide semiconductor layer is higher than a value $Conc_{H-2}$ of a concentration of hydrogen atoms in a central portion of the oxide semiconductor layer along a thickness direction.

18. The image pickup element according to claim 1, wherein, assuming that $Conc_{H-1}$ denotes a value of a concentration of hydrogen atoms in a portion of the oxide semiconductor layer near an interface between the oxide film and the oxide semiconductor layer and that $Conc_{M-1}$ denotes a value of a concentration of atoms included in the oxide film in the portion of the oxide semiconductor layer near the interface between the oxide film and the oxide semiconductor layer, an average change rate $\Delta Conc_{H-1}$ of $Conc_{H-1}$ toward a central portion along a thickness direction of the oxide semiconductor layer is larger than an average change rate $\Delta Conc_{M-1}$ of $Conc_{M-1}$ toward the central portion along the thickness direction of the oxide semiconductor layer.

19. The image pickup element according to claim 1, wherein charge generated in the photoelectric conversion layer migrates to the first electrode via the oxide film and the oxide semiconductor layer.

20. The image pickup element according to claim 19, wherein the charge includes electrons.

21. The image pickup element according to claim 1, wherein the oxide film is in contact with the oxide semiconductor layer.

* * * * *